United States Patent
Naiini et al.

(10) Patent No.: US 7,803,510 B2
(45) Date of Patent: Sep. 28, 2010

(54) POSITIVE PHOTOSENSITIVE POLYBENZOXAZOLE PRECURSOR COMPOSITIONS

(75) Inventors: Ahmad A. Naiini, East Greenwich, RI (US); David B. Powell, Minnetonka, MN (US); Donald W. Racicot, Providence, RI (US); Il'ya Rushkin, Walpole, MA (US); William D. Weber, East Providence, RI (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 409 days.

(21) Appl. No.: 11/500,251

(22) Filed: Aug. 7, 2006

(65) Prior Publication Data

US 2007/0099111 A1 May 3, 2007

Related U.S. Application Data

(60) Provisional application No. 60/708,994, filed on Aug. 17, 2005, provisional application No. 60/810,611, filed on Jun. 2, 2006.

(51) Int. Cl.
*G03F 7/30* (2006.01)
(52) U.S. Cl. .................. 430/190; 430/191; 430/192; 430/193; 430/270.1
(58) Field of Classification Search ........... 430/190, 430/191, 192, 193, 270.1
See application file for complete search history.

(56) References Cited

U.S. PATENT DOCUMENTS

| | | | |
|---|---|---|---|
| 4,371,685 A | 2/1983 | Ahne et al. | |
| 6,143,467 A | 11/2000 | Hsu et al. | |
| 6,177,225 B1 | 1/2001 | Weber et al. | 430/190 |
| 6,410,677 B1 | 6/2002 | Enoki et al. | |
| 6,436,593 B1 * | 8/2002 | Minegishi et al. | 430/18 |
| 6,551,756 B1 * | 4/2003 | Hu et al. | 430/270.1 |
| 6,716,566 B2 * | 4/2004 | Aoshima | 430/273.1 |
| 6,790,596 B2 * | 9/2004 | Kubota et al. | 430/281.1 |
| 6,929,891 B2 | 8/2005 | Rushkin et al. | 430/18 |
| 7,129,011 B2 * | 10/2006 | Rushkin et al. | 430/18 |
| 2003/0143480 A1 * | 7/2003 | Ueda et al. | 430/192 |
| 2004/0253542 A1 | 12/2004 | Rushkin et al. | |
| 2005/0064325 A1 * | 3/2005 | Nakamura et al. | 430/270.1 |
| 2005/0084794 A1 * | 4/2005 | Meagley et al. | 430/270.1 |
| 2009/0202794 A1 | 8/2009 | Shibui | |

FOREIGN PATENT DOCUMENTS

JP   2003345019   3/2003

OTHER PUBLICATIONS

International Search Report dated Aug. 31, 2007.

* cited by examiner

*Primary Examiner*—John S Chu
(74) *Attorney, Agent, or Firm*—Fish & Richardson P.C.

(57) ABSTRACT

A heat resistant positive-working photosensitive PBO precursor composition comprising:
   (a) at least one polybenzoxazole precursor polymer;
   (a) at least one plasticizer compound;
   (b) at least one solvent;
   wherein the amount of the plasticizer present in the composition is an amount effective to reduce the sidewall angle of imaged and cured features in the coated film on the substrate to prevent stress failures in subsequent metallization of the substrate due to steep angles of the imaged features, and with the proviso that if the polybenzoxazole precursor polymer solely consists of polybenzoxazole precursor polymers that do not contain a photoactive moiety on the polymer, then
   (c) at least one photoactive compound is also present in the composition.

65 Claims, 3 Drawing Sheets

POSITIVE PHOTOSENSITIVE POLYBENZOXAZOLE PRECURSOR COMPOSITIONS

RELATED APPLICATIONS

This application claims priority from Provisional Patent Application No. 60/708,994, filed Aug. 17, 2005 and Provisional Patent Application No. 60/810,611, filed Jun. 2, 2006.

FIELD OF THE INVENTION

The present invention relates to positive photosensitive polybenzoxazole (PBO) precursor compositions suitable for use in microelectronic applications. More particularly, the present invention relates to a positive working photosensitive composition utilizing polybenzoxazole precursors and a plasticizer, and a process for preparing heat-resistant relief structures using the photosensitive composition.

BACKGROUND OF THE INVENTION

In microelectronic applications, polymers that demonstrate high temperature resistance are generally well known. Precursors of such polymers, such as polyimides and polybenzoxazoles can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazole compositions contain an alkaline-soluble PBO precursor and a diazoquinone photoactive compound as disclosed in U.S. Pat. No. 4,371,685. The diazoquinone compound inhibits the solubility of PBO precursor in an aqueous base. However, after exposure to light, the diazoquinone compound undergoes photolysis and converts to indene carboxylic acid, which promotes solubility of the PBO precursor in the aqueous base.

Chemically amplified positive-working photosensitive polybenzoxazole compositions containing a PBO precursor, in which some of the phenol groups are protected with acetal protecting groups, and a compound which produces acid upon exposure to radiation (PAG) were disclosed in U.S. Pat. No. 6,143,467 and US Publication No. 20040253542 herein incorporated by reference. After irradiation with light of appropriate wavelength, the PAG produces acid, which removes the acetal protecting group from the phenol moiety. This process promotes dissolution of the PBO precursor in aqueous base to form images which have a reasonably high wall angle.

For some applications, microelectronic manufacturers and technologists request coating compositions that provide shallower or softer side wall geometries. If the sidewalls of the features that result from the photoimaging process are too vertical and/or form too sharp of an angle with the top surface of the coating, subsequent metallization of the features can lead to metal layers with high induced stress. Cracks and delamination of the metal layer may form in the regions of high stress leading to device failure. Further, too steep a sidewall can cause issues with some wire bonding equipment. The present invention discloses new photosensitive compositions comprising PBO precursors and a plasticizer that has a low vapor pressure at the typical soft bake temperatures (100-150° C.) for the film. The presence of these plasticizers in the formulation helps to provide lower side wall angles to reduce stress cracks and improve device reliability without detrimental effects on other lithographic performance aspects of the composition.

BRIEF SUMMARY OF THE INVENTION

The present invention is directed to a heat resistant positive working photosensitive PBO precursor composition comprising:

(a) at least one polybenzoxazole precursor polymer;
(b) at least one plasticizer compound;
(c) at least one solvent;
wherein the amount of the plasticizer present in the composition is an amount effective to reduce the sidewall angle of imaged and cured features in the coated film on the substrate to prevent stress failures in subsequent metallization of the substrate due to steep angles of the imaged features, and with the proviso that if the polybenzoxazole precursor polymer solely consists of polybenzoxazole precursor polymers that do not contain a photoactive moiety on the polymer, then
(d) at least one photoactive compound is also present in the composition.

The present invention also relates to the process for preparing heat-resistant relief structures from the aforementioned positive working photosensitive PBO precursor composition and the articles of manufacture obtained by the combination of the composition and the method of use according to the invention.

The positive working photosensitive PBO precursor compositions can be used as thermal and mechanical stress buffer coatings, alpha particle barrier films, interlayer dielectrics, and patterned engineering plastic layers in the manufacturing of microelectronic devices or microelectromechanical devices (MEMs)

For some applications, microelectronic manufacturers and technologists request coating compositions that provide shallower or softer side wall geometries. If the sidewalls of the features that result from the photoimaging process are too vertical and/or form too sharp of an angle with the top surface of the coating, subsequent metallization of the features can lead to metal layers with high induced stress. Cracks and delamination of the metal layer may form in the regions of high stress. (see FIGS. 1-3) These cracks can propagate through the metal layer structure to such an extent that device functional failure results due to an open circuit. In addition, bond pads that have a coating with vertical side walls may be difficult to wire bond since the bonding head may not fit between the vertical walls. Clearly, a tapered sidewall with rounded edges is needed. The present invention discloses new photosensitive compositions containing PBO precursor polymers and a plasticizer that has a low vapor pressure at the typical soft bake temperatures (100-150° C.) of the film. The presence of these plasticizers in the formulation helps to provide shallower wall angles, or rounder corners and edges. For the purpose of this invention then, a plasticizer is defined as a compound when present in the compositions of this invention is capable of producing such shallower wall angles and/or rounder corners and edges during the curing cycle of the PBO precursor in features photoimaged from coatings cast from the compositions of this invention.

DESCRIPTION OF FIGS. 1-3

Figure 1A:
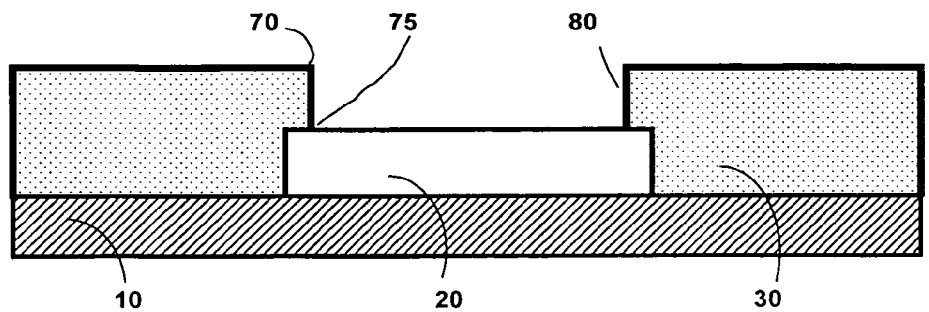
FIG. 1a is a scheme illustrating a structure having a buffer coating with vertical side walls.
Figure 1B:
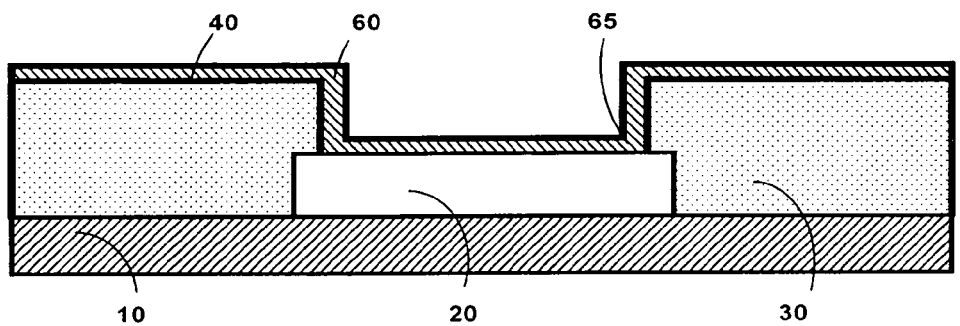
FIG. 1b is a scheme illustrating the structure shown in FIG. 1a coated with a metallization layer.
Figure 1C:
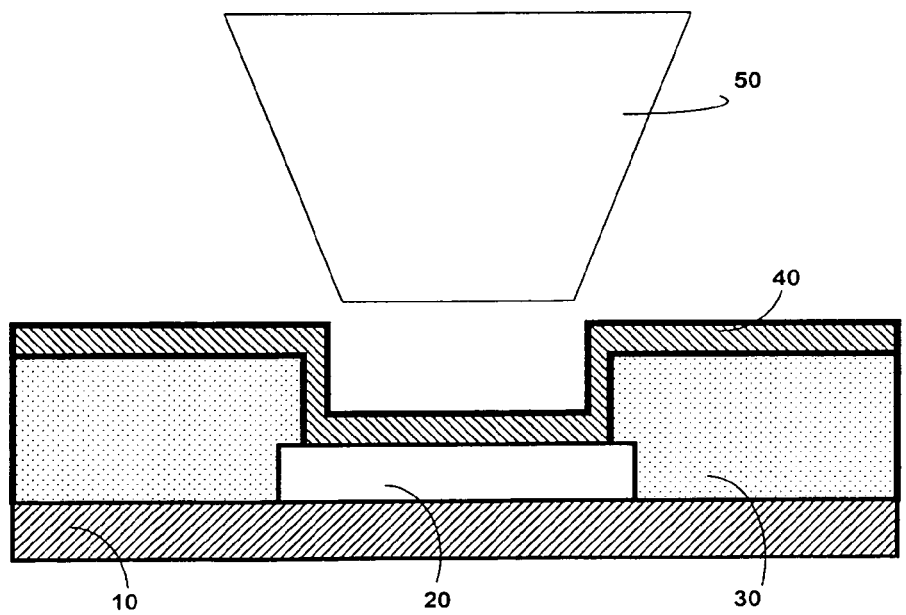
FIG. 1c is a scheme illustrating a process of using an oscillating bonding head to apply bonding force to the structure shown in FIG. 1b.

Buffer coats or stress relief coatings are essential for the reliable performance of today's large memories and microprocessors. Two problems can occur if the side walls of a buffer coating on an integrated device are vertical and contain sharp angles. The problems are idealized in FIGS. 1a-1c. FIG. 1a shows the idealized structure of the buffer coating (30) in the vicinity of a metallized bond pad (20) on a substrate (10). The buffer coating (30) has sharp corners (70, 75) and vertical side walls (80). In extreme cases, sharp corner 70 can form an edge or cusp that is elevated above the top surface plane of the buffer coating. When the bond pad and buffer coat surface are further metallized to form the idealized structure shown in FIG. 1b areas of high stress form in the metallization layer at several locations such as 60 and 65. These areas of high stress (60, 65) can cause cracking and delamination of the metallization layer (40). FIG. 1c shows an idealized problem caused by vertical side walls. In FIG. 1c an oscillating wire bonding head (50) can not apply adequate bonding force to bond pad (20) when restrictive, narrow, vertical openings are present in the buffer coat (30). The structure shown in FIG. 1c with respect to the bonding head (50) applies whether or not the metallization layer is present.

Figure 2A:
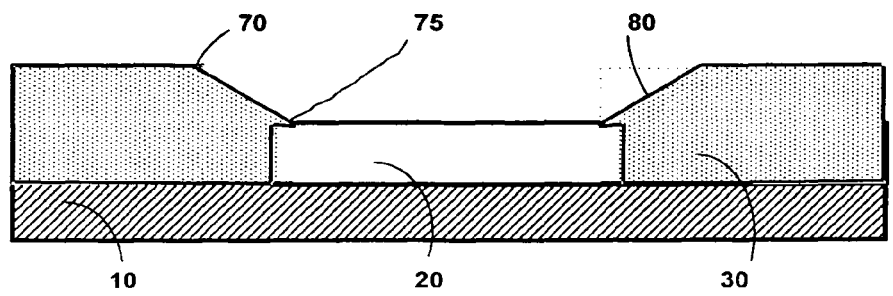
FIG. 2a is a scheme illustrating a structure having a buffer coating with reduced side wall angles.
Figure 2B:
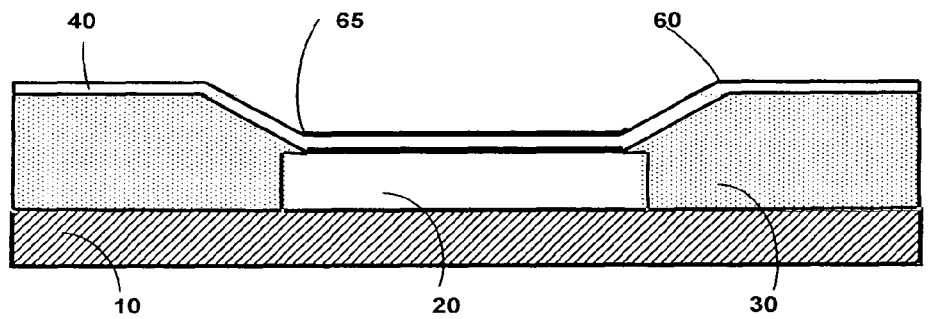
FIG. 2b is a scheme illustrating the structure shown in FIG. 2a coated with a metallization layer.
Figure 2C:
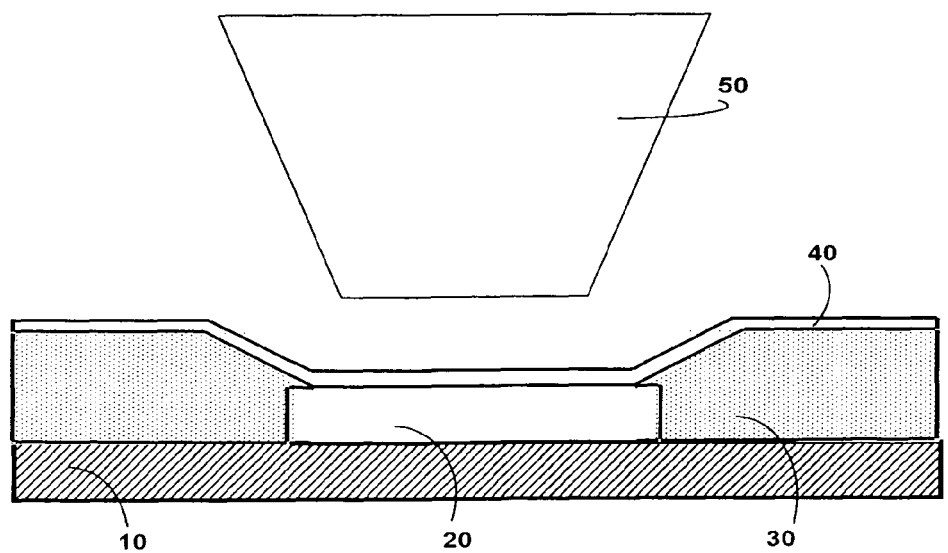
FIG. 2c is a scheme illustrating a process of using an oscillating bonding head to apply bonding force to the structure shown in FIG. 2b.
Figure 3:
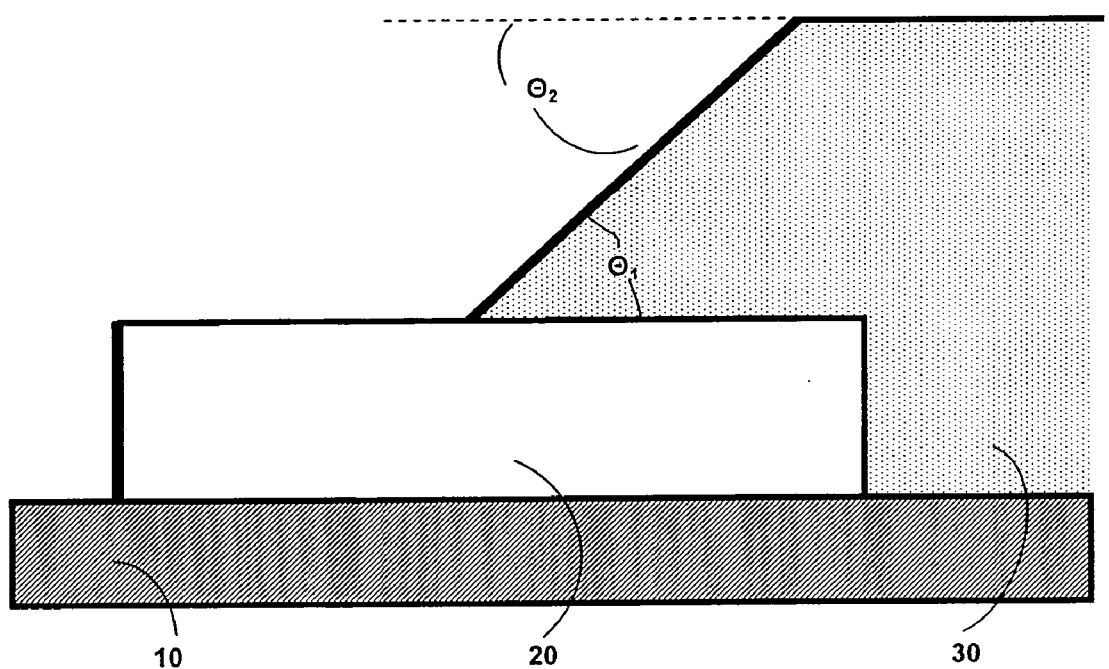
FIG. 3 is an expanded view of a portion of FIG. 2a illustrating reduced side wall angles $\theta_1$ and $\theta_2$.

One method to solve the problems of induced stress, cracking, and wire bondability is illustrated in FIGS. 2a-2c. Here the angles ($\ominus_1$ and $\ominus_2$ as represented in FIG. 3) of the corners (70, 75) and the slope of the side wall (80) of the buffer coat (30) are decreased. This decreases the induced stress at areas (60, 65) in metallization (40) and thus reduces the cracking and delamination in metallization layer (40). FIG. 2c shows that decreasing angles $\ominus 1$ and $\ominus 2$ (defined in FIG. 3) increases the opening in buffer coat (30) and provides more space for the oscillating bonding head (50). This allows bonding head (50) to apply adequate pressure to bond pad (20) to form a good bond. It is even more advantageous when corner (70) is rounded rather than sharp.

DETAILED DESCRIPTION OF THE INVENTION

The present invention is directed to a heat resistant positive working photosensitive PBO precursor composition comprising:

(a) at least one polybenzoxazole precursor polymer;

(b) at least one plasticizer compound;

(c) at least one solvent;

wherein the amount of the plasticizer present in the composition is an amount effective to reduce the sidewall angle of imaged and cured features in the coated film on the substrate to prevent stress failures in subsequent metallization of the substrate due to steep angles of the imaged features, and with the proviso that if the polybenzoxazole precursor polymer solely consists of polybenzoxazole precursor polymers that do not contain a photoactive moiety on the polymer, then (d) at least one photoactive compound.

One embodiment of the present invention is directed to a diazoquinone containing positive working photosensitive PBO precursor composition comprising:

(a) at least one polybenzoxazole precursor polymer having Structure I or II or III or III* or IV or IV*

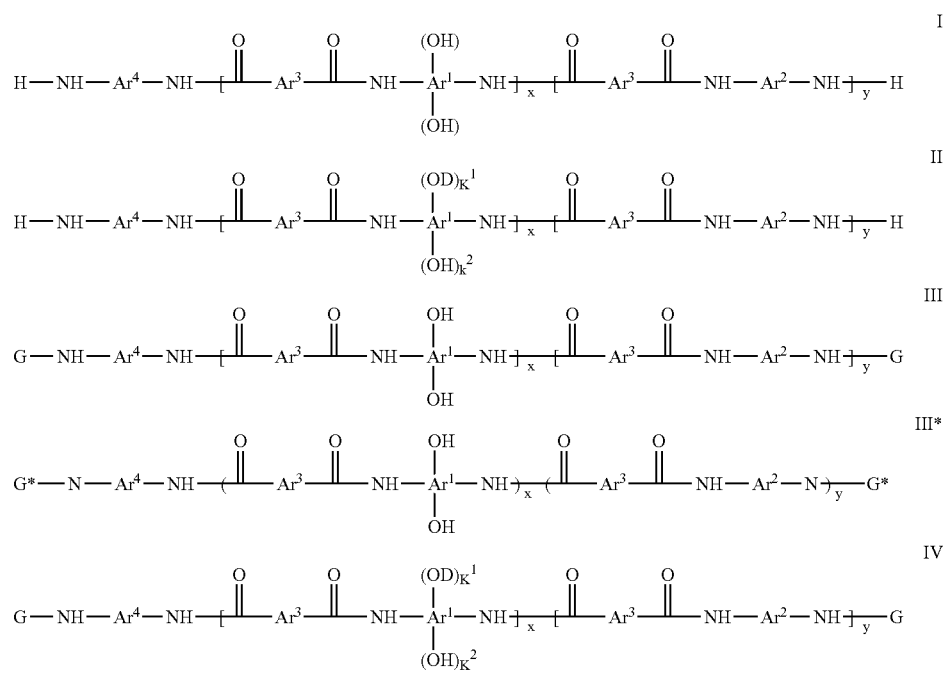

-continued

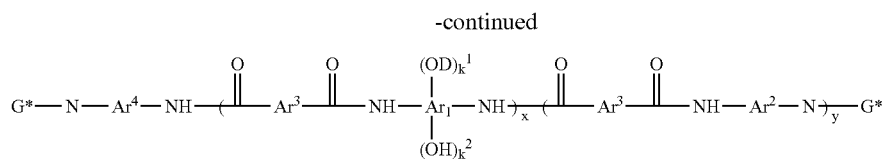

IV* wherein Ar$^1$ is a tetravalent aromatic group, a tetravalent heterocyclic group, or mixtures thereof; Ar$^2$ is a divalent aromatic, a divalent heterocyclic, a divalent alicyclic, or a divalent aliphatic group that may contain silicon or mixtures thereof; Ar$^3$ is a divalent aromatic group, a divalent aliphatic group, a divalent heterocyclic group, or mixtures thereof; Ar$^4$ is Ar$^1$ (OH)$_2$ or Ar$^2$ in Structures I, III and III*, Ar$^4$ is Ar$^1$ (OD)$_{k}^1$ (OH)$_{k}^2$ or Ar$^2$ in Structures II, IV and IV*, x is from about 10 to about 1000; y is from 0 to about 900 and (x+y)<1000; D is one of the following moieties:

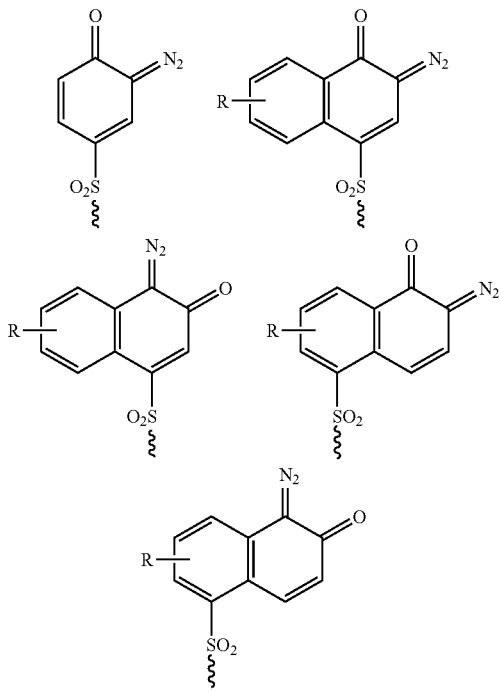

wherein, R is H, halogen, a C$_1$-C$_4$ alkyl group, a C$_1$-C$_4$ alkoxy group, cyclopentyl, or cyclohexyl; k$^1$ can be any positive value of up to about 0.5, k$^2$ can be any value from about 1.5 to about 2 with the proviso that (k$^1$+ k$^2$)=2, G is a substituted or unsubstituted monovalent organic group having a carbonyl, carbonyloxy or sulfonyl group attached directly to the terminal NH of the polymer and G* is a substituted or unsubstituted divalent organic group having at least one carbonyl or sulfonyl group attached directly to the terminal NH of the polymer;

(b) at least one plasticizer compound;
(c) at least one solvent,
with the proviso that if the polybenzoxazole precursor polymer solely consists of Structure I or III or III* or mixtures thereof, then
(d) at least one photoactive compound is added.

Optionally, the diazoquinone containing positive working photosensitive PBO precursor composition may contain other additives, which may include surfactants, adhesion promoters, leveling agents and dissolution rate modifiers.

The polymers of Structure I can be prepared from monomers having Structures X, XI and XII. Monomers having Structures X, XI and XII are reacted in the presence of a base to synthesize polybenzoxazole precursor polymers of Structure I.

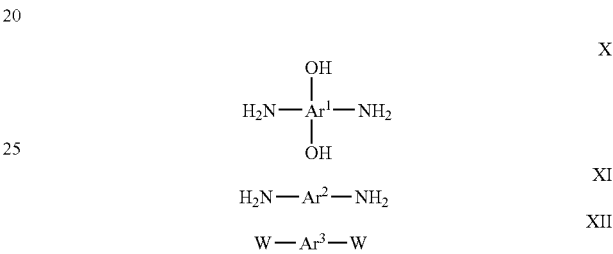

Ar$^1$, Ar$^2$, Ar$^3$ are as previously defined, and W is C(O)Cl, COOH or C(O)OR$^{20}$ wherein R$^{20}$ is a C$_1$-C$_7$ linear or branched alkyl group or a C$_5$-C$_8$ cycloalkyl group.

In Structures I, II, III, III*, IV, IV*, X and VI, VII, VII* (vide infra) Ar$^1$ is a tetravalent aromatic group or a tetravalent heterocyclic group, or mixtures thereof. Examples of Ar$^1$ include, but are not limited to:

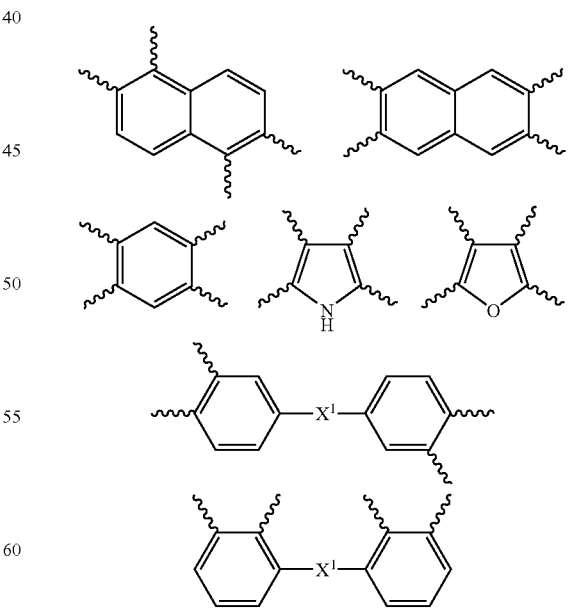

wherein X$^1$ is —O—, —S—, —C(CF$_3$)$_2$—, —CH$_2$—, —SO$_2$—, —NHCO— or —SiR$^{13}$$_2$— and each R$^{13}$ is independently a C$_1$-C$_7$ linear or branched alkyl or C$_5$-C$_8$ cycloalkyl group. Examples of $R^{13}$ include, but are not limited to, —$CH_3$, —$C_2H_5$, n-$C_3H_7$, i-$C_3H_7$, n-$C_4H_9$, t-$C_4H_9$, and cyclohexyl. A mixture of two or more $Ar^1$ groups may be employed.

Examples of monomers having the Structure X containing $Ar^1$ include, but are not limited to, 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane. The substitution pattern of the two hydroxy and two amino groups in the monomer of Structure X may be any of the possible substitution patterns with the proviso that each amino group has an ortho relationship with a hydroxyl group in order to be able to form the benzoxazole ring. Furthermore, the polybenzoxazole precursor base polymer of Structure I may be synthesized using a mixture of two or more monomers described by generic Structure X.

In Structures I, II, III, III*, IV, IV*, XI and VI, VII, VII* (vide infra) $Ar^2$ is a divalent aromatic, a divalent heterocyclic, a divalent alicyclic, or a divalent aliphatic group that may contain silicon. Examples of $Ar^2$ include, but are not limited to,

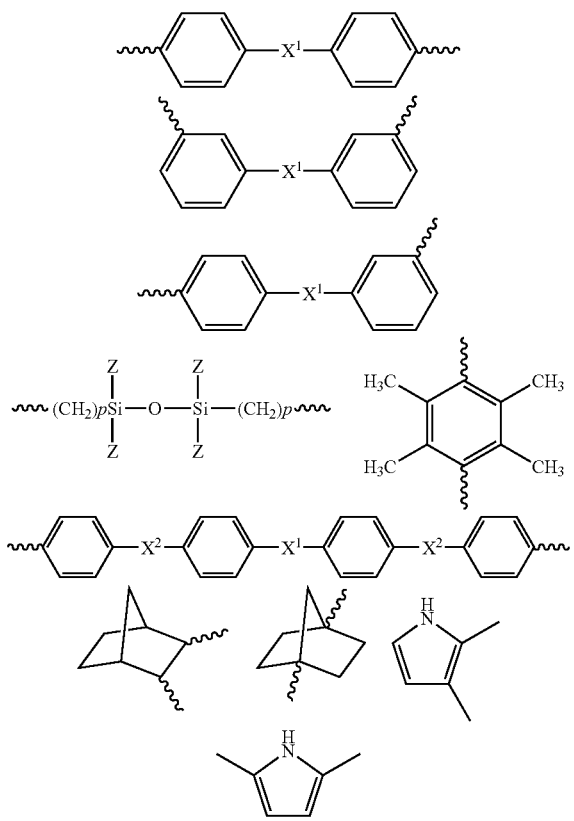

wherein $X^1$ is —O—, —S—, —C(CF$_3$)$_2$—, —C(CH$_3$)$_2$—, —CH$_2$—, —C(O)—, —SO$_2$—, —NHCO— or —SiR$^{13}_2$— and each $R^{13}$ is independently a $C_1$-$C_7$ linear or branched alkyl or $C_5$-$C_8$ cycloalkyl group, $X^2$ is —O—, —S—, —C(CF$_3$)$_2$—, —C(CH$_3$)$_2$—, —CH$_2$—, —SO$_2$—, or —NHCO—, Z is H or $C_1$-$C_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl and cyclooctyl. A mixture of two or more $Ar^2$ groups may be employed.

Examples of monomers having the Structure XI containing $Ar^2$ include, but are not limited to, 5 (6)-diamino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 3,3'-diaminodiphenyl ether, 4,4'-diaminodiphenyl ether, 2,4-toluenediamine, 3,3'-diaminodiphenyl sulfone, 3,4'-diaminodiphenyl sulfone, 4,4'-diaminodiphenyl sulfone, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-amino-phenoxy)benzene, 1,4-bis(gamma-aminopropyl)tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminododecane, 1,12-diaminooctadecane, 2,17-diaminoeicosane, 3,3'-dimethyl-4,4'-diaminodiphenylmethane, bis(4-aminocyclohexyl)methane, 3,3'-diaminodiphenylethane, 4,4'-diaminodiphenylethane, 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-chloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline) 3,3'sulfonyl-dianiline, 3,3'sulfonyl-dianiline. Furthermore, the polybenzoxazole precursor base polymer of Structure I may be synthesized using a mixture of two or more monomers described by generic Structure XI.

In Structures I, II, III, III*, IV, IV*, XII and VI, VII, VII* (vide infra) $Ar^3$ is a divalent aromatic, a divalent aliphatic, or a divalent heterocyclic group. Examples of $Ar^3$ include, but are not limited to:

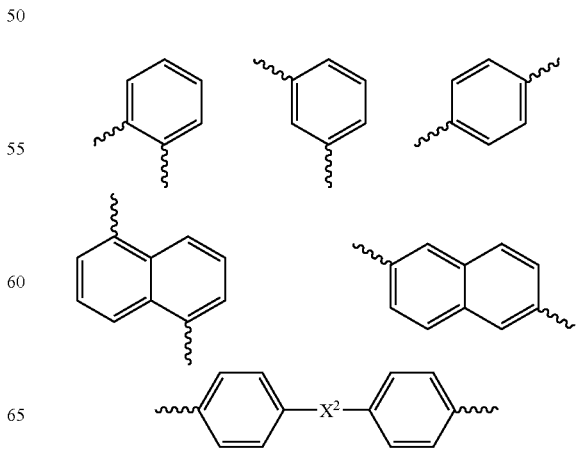

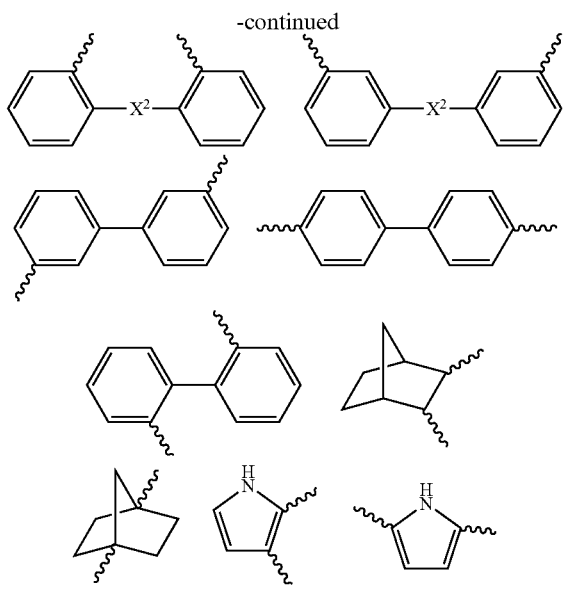

wherein $X^2$ is —O—, —S—, —C(CF$_3$)$_2$—, —C(CH$_3$)$_2$—, —CH$_2$—, —SO$_2$—, or —NHCO—. A mixture of two or more Ar$^3$ groups may be employed.

In Structure XII, W is C(O)Cl, COOH or C(O)OR$^{20}$ wherein R$^{20}$ is C$_1$-C$_7$ linear or branched alkyl group or a C$_5$-C$_8$ cycloalkyl group. Examples of R$^{20}$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl.

Monomers having the Structure XII are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=COCl) include, but are not limited to, isophthaloyl dichloride, phthaloyl dichloride, terephthaloyl dichloride, 1,4-oxydibenzoyl chloride and mixtures thereof. Examples of suitable dicarboxylic esters (W=C(O)OR$^{20}$) include, but are not limited to, dimethyl isophthalate, dimethyl phthalate, dimethyl terephthalate, diethyl isophthalate, diethyl phthalate, diethyl terephthalate and mixtures thereof.

Any conventional method for reacting a dicarboxylic acid or its dichloride or diester with at least one aromatic and/or heterocyclic dihydroxydiamine, and optionally, with at least one diamine, may be used. Generally, the reaction for diacid dichlorides (W=C(O)Cl) is carried out at about −10° C. to about 30° C. for about 6 to about 48 hours in the presence of an approximately stoichiometric amount of amine base. Examples of suitable amine bases include, but are not limited to, pyridine, triethylamine, 1,8-diazabicyclo[5.4.0]undec-7-ene (DBU), 1,5-diazabicyclo[4.3.0]non-5-ene (DBN), dimethylpyridine, and dimethylaniline. The polybenzoxazole precursor base polymer of Structure I may be isolated by precipitation into water, recovered by filtration and dried. Descriptions of suitable syntheses employing diesters or diacids may be found in U.S. Pat. No. 4,395,482, U.S. Pat. No. 4,622,285, and U.S. Pat. No. 5,096,999, herein incorporated by reference.

The preferred reaction solvents are N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having Structure X, XI, and XII are employed such that the ratio of [X+XI]/XII is generally from about 1 to about 1.2. Preferably, the ratio of [X+XI]/XII is generally from about 1 to about 1.1. The monomer having the Structure X is employed from about 10 to about 100 mole % of [X+XI] and the monomer having Structure XI is employed from about 0 to about 90 mole % of [X+XI]. Distribution of the polymeric units resulting from monomers having the Structures X and XI in the polybenzoxazole precursor base polymer of Structure I may be random or in blocks.

In Structures I, II, III, III*, IV, IV* and VI, VII, VII* (vide infra) x is an integer from about 10 to about 1000, y is an integer from about 0 to about 900 and (x+y) is less than about 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley & Sons, New York, 1983.

It should be noted that molecular weight and inherent viscosity of the polymers and therefore, x and y at a constant stoichiometry, can have a wide range depending on the reaction conditions chosen and considerations such as the purity of the solvent, the humidity, presence or absence of a blanket of nitrogen or argon gas, reaction temperature, reaction time, and other variables.

Polybenzoxazole precursor polymer of Structure II may be synthesized by reaction of the polybenzoxazole precursor polymer of Structure I with a molar amount of DCl of from about 0.5% to about 25% of the quantity of OH groups in monomers of Structure X in the presence of a base to yield the polybenzoxazole precursor of Structure II according to Reaction 1.

Reaction 1

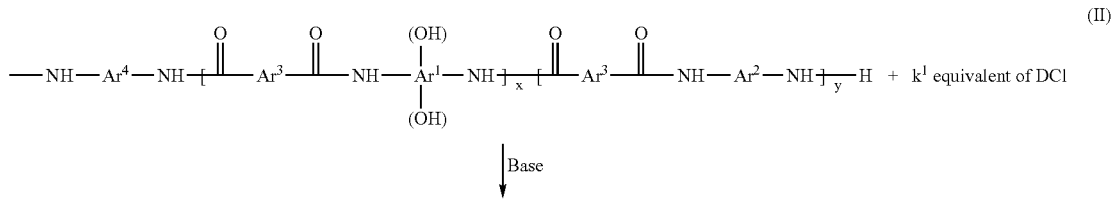

-continued

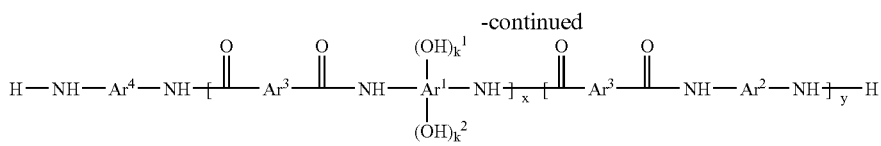

wherein $Ar^1, Ar^2, Ar^3, Ar^4, D, k^1, k^2$, x and y are as previously defined Examples of the diazoquinone compound DCl that can be reacted with the PBO precursor polymer I include, but are not limited to,

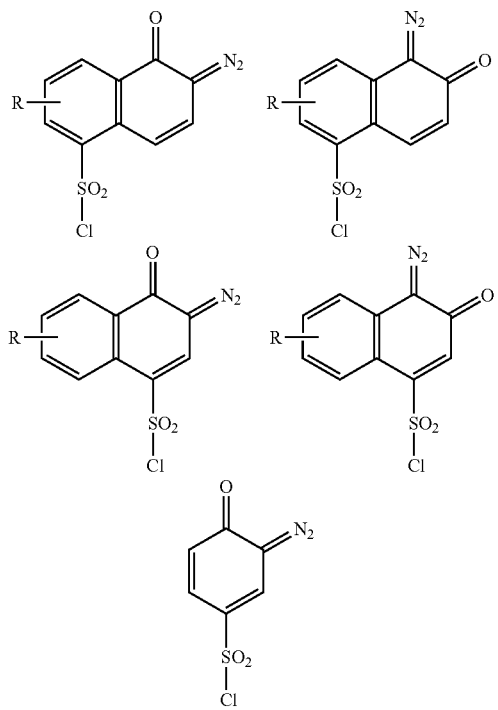

wherein, R is H, a halogen, a $C_1$-$C_4$ alkyl group, a $C_1$-$C_4$ alkoxy group, cyclopentyl or cyclohexyl. Examples of suitable R groups include, but are not limited to, methyl, ethyl, propyl, iso-propyl, n-butyl, sec-butyl, t-butyl, cyclopentyl or cyclohexyl.

Generally, the reaction is carried out at about 0° C. to about 30° C. for about 3 to about 24 hours in a solvent in the presence of a base. Generally, a slight excess of base to DCl is employed. Examples of bases include, but are not limited to, amine bases such as pyridine, trialkylamine, methylpyridine, lutidine, n-methylmorpholine, and the like. The most preferred base is triethylamine. The preferred reaction solvents are tetrahydrofuran, acetone, N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred reaction solvents are tetrahydrofuran and acetone. The reaction mixture should be protected from actinic rays.

The molar amount of DCl may range from about 0.5% to about 25% of the quantity of OH groups from monomers of Structure X to yield $k^1$ from 0.01 to about 0.5. A preferred amount of DCl is from about 0.5% to about 10% of the quantity of OH groups from monomers of Structure X to produce $k^1$ from about 0.01 to about 0.20. A more preferred amount of DCl is from about 0.5% to about 5% of the quantity of OH groups from monomers of Structure X to produce $k^1$ from about 0.01 to about 0.10. A most preferred amount of DCl is from about 0.5% to about 2.5% of the quantity of OH groups from monomers of Structure X to produce $k^1$ from about 0.01 to about 0.05.

Polybenzoxazole precursor polymers of Structure III may be synthesized by reaction of polybenzoxazole polymer of Structure I with G-M where G is a monovalent organic group having a carbonyl, carbonyloxy or sulfonyl group and M is a reactive leaving group.

Examples of G include, but are not limited to, the following structures:

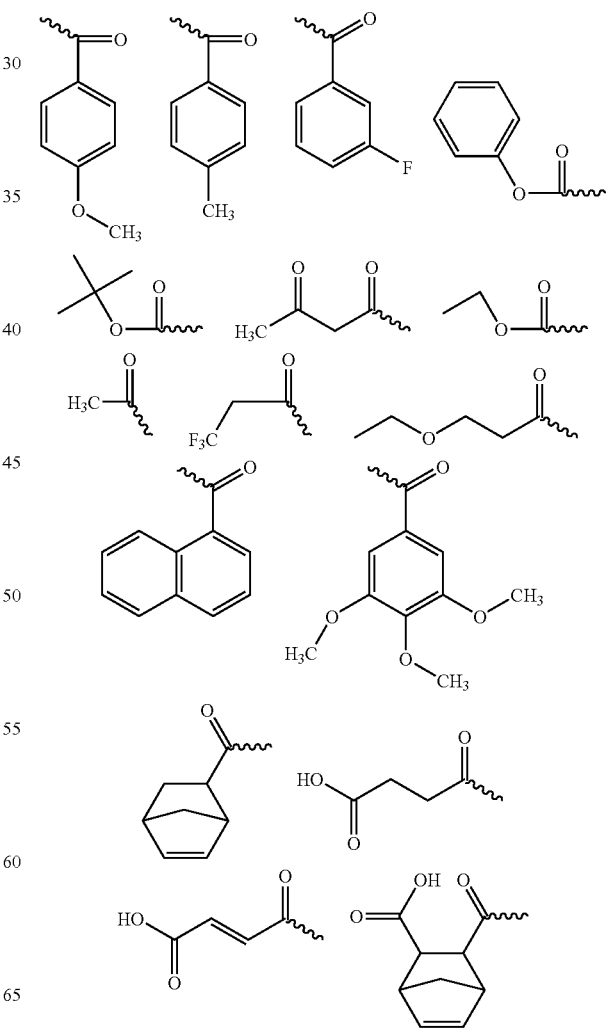

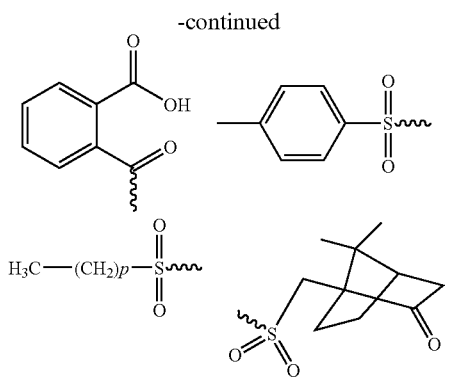

Examples of M groups include, but are not limited to, Cl, Br, mesylate, triflate, substituted carbonyloxy groups, and substituted carbonate groups.

Examples of suitable classes of G-M compounds include but are not limited to, carboxylic and sulfonic acid chlorides, carbon and sulfonic acid bromides, linear and cyclic carbon and sulfonic acid anhydrides, and alkoxy or aryloxy substituted acid chlorides. Examples of suitable G-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyldicarbonate, t-butyl chloroformate, ethyl chloroformate, n-butyl chloroformate, and methyl chloroformate. Further examples include compounds having the structures shown below.

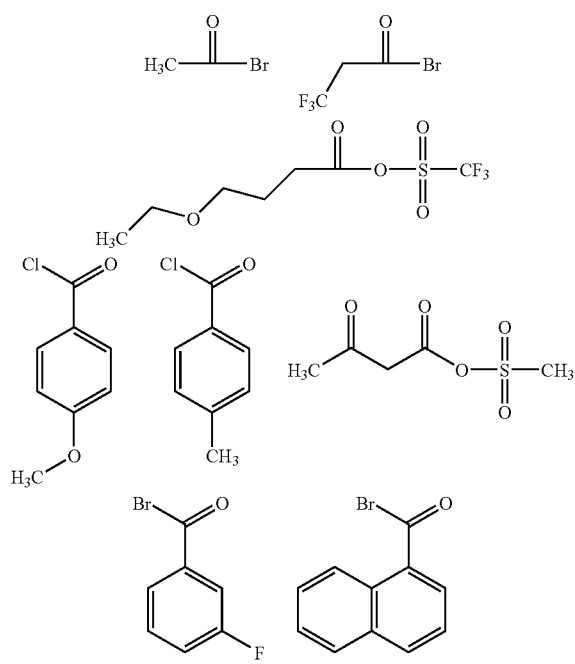

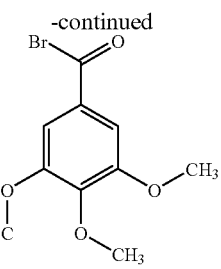

The reaction can be carried out in a suitable solvent by addition of G-M to a dry solution of the polybenzoxazole precursor base polymer of Structure I at a temperature from about −25° C. to about 50° C. The more preferred temperature is from about 0° C. to about 25° C. The most preferred temperature is from about 5° C. to about 10° C. The reaction time is from about 1 hour to about 24 hours. The molar amount of G-M employed is a slightly excess (3-6%) of the sum of the molar amounts of monomer of Structures X and XI less the molar amount of monomer of Structure XII. Addition of organic or inorganic base may also be employed. Examples of suitable organic amine bases include, but are not limited to, pyridine, triethylamine, 1,8-diazabicyclo[5.4.0]undec-7-ene (DBU), 1,5-diazabicyclo[4.3.0]non-5-ene (DBN), dimethylpyridine, and dimethylaniline. Examples of other suitable bases include sodium hydroxide, sodium carbonate, and sodium silicate.

The preferred reaction solvents are propylene glycol methyl ether acetate (PGMEA), N-methyl-2-pyrrolidone (NMP), N-ethyl-2-pyrrolidone (NEP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

In some cases, the endcapping reaction with certain endcapping reagents, such as cyclic anhydrides, may not stop after the endcapping reaction. A subsequent dehydration step may also occur to form a divalent endcap (G* in Structures III*, IV* and VII* (vide infra)). Examples of cyclic anhydrides which may undergo this additional reaction include, but are not limited to, maleic anhydride, succinic anhydride, norbornane anhydride, norbornene anhydride, and camphor anhydride.

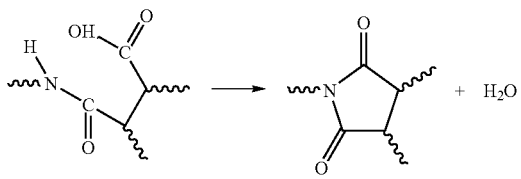

Polybenzoxazole precursor polymer of Structure IV may be synthesized by reaction of polybenzoxazole precursor polymer of Structure III with a molar amount of DCl from about 0.5% to about 25% of the quantity of OH groups in monomers of Structure X in the presence of a base to yield the polybenzoxazole precursor IV according to Reaction 2.

Reaction 2

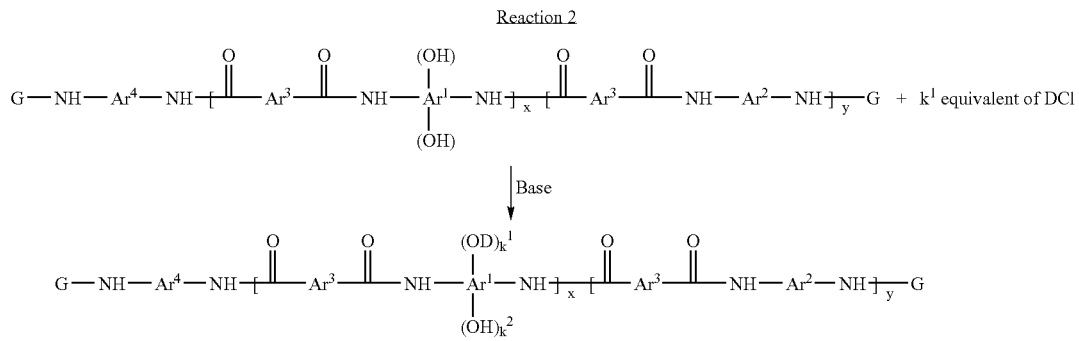

wherein $Ar^1$, $Ar^2$, $Ar^3$, $Ar^4$, D, $k^1$, $k^2$, x, y, and G are as previously defined. Similarly, the polymer having Structure IV* can be synthesized from the polymer having Structure III*.

Examples of the diazoquinone compound DCl that can be reacted with the PBO precursor polymer III (III*) include, but are not limited to, one of the following:

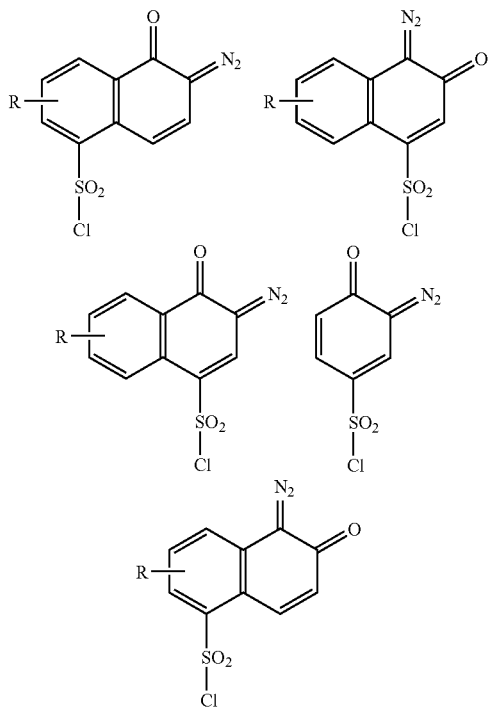

wherein, R is H, a halogen, a $C_1$-$C_4$ alkyl group, $C_1$-$C_4$ alkoxy group, cyclopentyl or cyclohexyl. Examples of suitable R groups include, but are not limited to, methyl, ethyl, propyl, isopropyl, n-butyl, sec-butyl, t-butyl, cyclopentyl or cyclohexyl.

The molar amount of DCl may range from about 0.5% to about 25% of the quantity of OH groups from monomers of Structure X to yield $k^1$ from 0.01 to about 0.5. A preferred amount of DCl is from about 0.5% to about 10% of the quantity of OH groups from monomers of Structure X to produce $k^1$ from about 0.01 to about 0.20. A more preferred amount of DCl is from about 0.5% to about 5% of the quantity of OH groups from monomers of Structure X to produce $k^1$ from about 0.01 to about 0.10. A most preferred amount of DCl is from about 0.5% to about 2.5% of the quantity of OH groups from monomers of Structure X to produce $k^1$ from about 0.01 to about 0.05.

The reaction conditions are identical to that description for the synthesis of polybenzoxazole precursor polymer of Structure II.

A polybenzoxazole precursor polymer of Structure IV can also be prepared by reaction of a polybenzoxazole precursor polymer of Structure II with G-M. Similarly Structure IV* can be prepared by reacting G*-M with Structure II. The definition of G, G* and M are as defined before and the reaction condition is the same as described for the preparation of polybenzoxazole precursor polymer of Structure III or III*.

The diazoquinone containing positive working photosensitive PBO precursor composition comprises at least one plasticizer. The plasticizer should have a lower volatility than the solvent employed at the typical bake temperatures of about 70° C. to about 150° C., so that it remains in the film after the softbake. This typically means that the plasticizer of this invention has a higher boiling point than the solvent employed, unless interaction of the functional groups of the plasticizer with other components of the diazoquinone containing positive working photosensitive PBO precursor composition decreases its volatility sufficiently. It is preferred that this boiling point differential is at least about 10° C. A more preferred boiling point differential is at least about 15° C.

In one embodiment of the present invention concerning the diazoquinone containing positive working photosensitive PBO precursor composition the plasticizer is at least one polyhydroxy compound with at least two OH groups and whose boiling point is higher than the boiling point of the diazoquinone containing positive working photosensitive PBO precursor composition solvent. Examples of polyhydroxy compounds with at least two OH groups include, but are not limited to, ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo (5.2.1.0/2,6)decane and a 2-oxepanone co-polymer with 2-ethyl-2-(hydroxymethyl)-1,3-propanediol. Preferred polyhydroxy compounds with at least two OH groups are diethylene glycol, tripropylene glycol, and a 2-oxepanone co-polymer with 2-ethyl-2-(hydroxymethyl)-1,3-propanediol. More preferred polyhydroxy compounds with at least two OH groups are tripropylene glycol and a 2-oxepanone co-polymer with 2-ethyl-2-(hydroxymethyl)-1,3-propanediol.

In another embodiment of the present invention concerning the diazoquinone containing positive working photosensitive PBO precursor composition the plasticizer is at least one saturated glycol mono ether whose boiling point is higher than the boiling point of the diazoquinone containing positive working photosensitive PBO precursor composition solvent. Examples of suitable saturated glycol mono ethers include, but are not limited to, saturated mono ethers of tripropylene glycol, tetrapropylene glycol, triethylene glycol, tetraethylene glycol and pentaethylene glycol. Preferred saturated glycol mono ethers are saturated mono ethers of tripropylene glycol, triethylene glycol and tetraethylene glycol. More preferred saturated glycol mono ethers are tri(propylene glycol) methyl ether, tri(propylene glycol)propyl ether and tri(propylene glycol)butyl ether.

In another embodiment of the present invention concerning the diazoquinone containing positive working photosensitive PBO precursor composition the plasticizer is at least one carboxylic acid ester whose boiling point is higher than the boiling point of the diazoquinone containing positive working photosensitive PBO precursor composition solvent. Examples include, but are not limited to, Ethyl cyclohexyl acetate, propyl benzoate, butyl benzoate, n-butyl cinnamate, ethyl-3,3'-diethoxypropionate, dimethyl succinate, diisopropyl succinate, dimethyl maleate, dimethyl malonate, diethyl adipate, diethyl acetamidomalonate, diethyl allylmalonate, and dimethyl cyclohexane-1,4-dicarboxylate, mixture of cis and trans isomers. Preferably the carboxylic acid ester is derived from a carboxylic acid containing at least two carboxylic acid groups. Examples include, but are not limited to, dimethyl succinate, .diisopropyl succinate, dimethyl maleate, dimethyl malonate, diethyl adipate, diethyl acetamidomalonate, diethyl allylmalonate, and dimethyl cyclohexane-1,4-dicarboxylate, mixture of cis and trans isomers.

Preferred embodiments of the present inventions are diazoquinone containing positive working photosensitive PBO precursor compositions comprising at least one plasticizer selected from the group consisting of polyhydroxy compounds with at least two OH groups and glycol ethers.

More preferred embodiments of the present inventions are diazoquinone containing positive working photosensitive PBO precursor compositions comprising at least one plasticizer selected from the group consisting of polyhydroxy compounds with at least two OH groups.

Suitable solvents of this diazoquinone containing positive working photosensitive PBO precursor composition are polar organic solvents. Suitable examples of polar organic solvents include, but are not limited to, N-methyl-2-pyrrolidone (NMP), N-ethyl-2-pyrrolidone, gamma-butyrolactone (GBL), N,N-dimethylacetamide (DMAc), dimethyl-2-piperidone, N,N-dimethylformamide (DMF), propylene glycol methyl ether acetate (PGMEA), propylene glycol methyl ether (PGME), ethyl lactate and mixtures thereof. The preferred solvents are gamma-butyrolactone, N-ethyl-2-pyrrolidone and N-methyl-2-pyrrolidone. The more preferred solvent is gamma-butyrolactone.

The photoactive compound (d) of the diazoquinone containing positive working photosensitive PBO precursor composition comprises one or more diazonaphthoquinone photoactive compounds which are the condensation products of compounds containing from about 2 to about 9 aromatic hydroxyl groups with one or more compounds of Structure D (described above). Preferably Structure D is a 5-naphthoquinone diazide sulfonyl compound and/or a 4-naphthoquinone diazide sulfonyl compound.

Examples of suitable photoactive compounds include, but are not limited to, structures XIIIa-r, wherein Q is independently a hydrogen atom or D with the proviso that at least one Q=D, wherein D is as defined before:

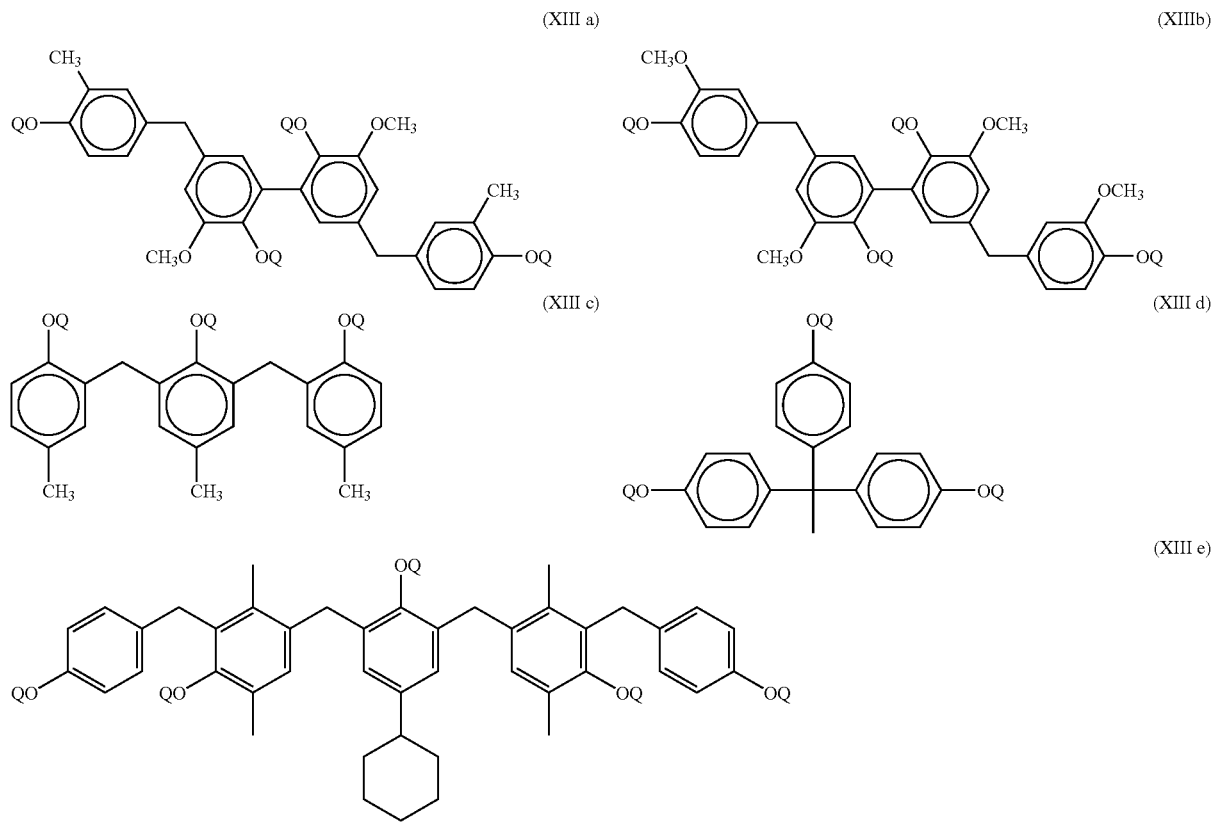

-continued
(XIII f)
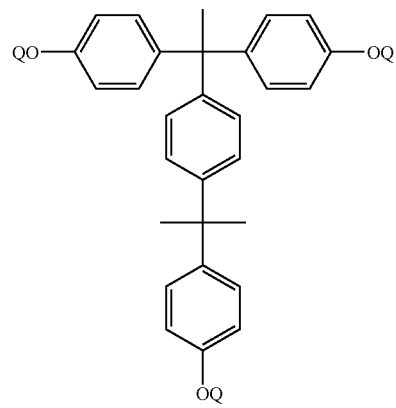
(XIII g)
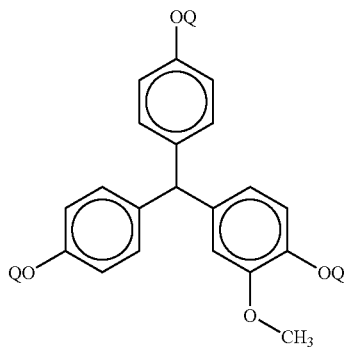
(XIII h)
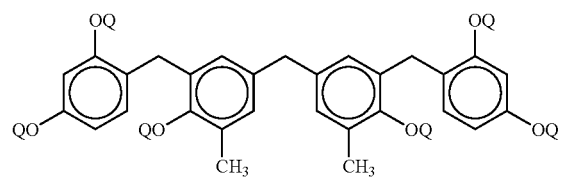
(XIII i)
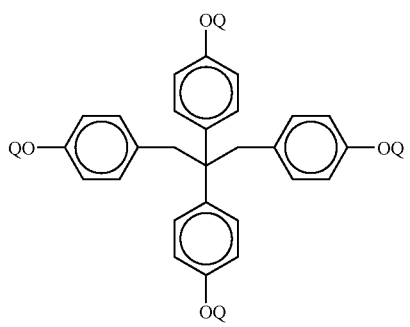
(XIII j)
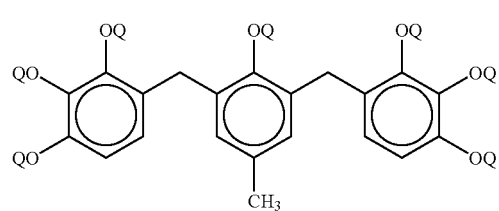
(XIII k)
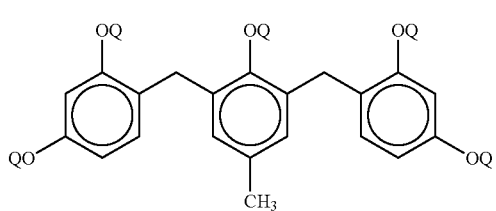
(XIII l)
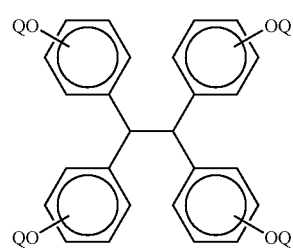
(XIII m)
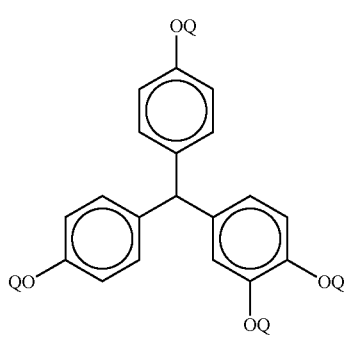

-continued

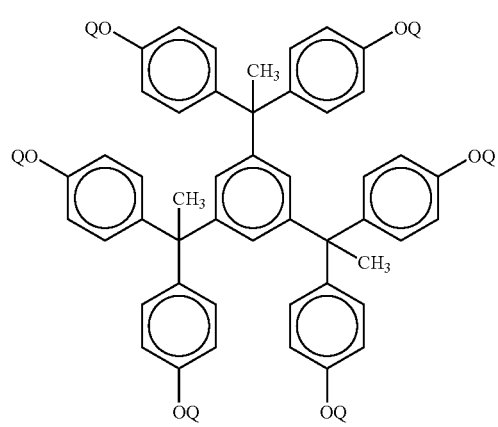
(XIII n)

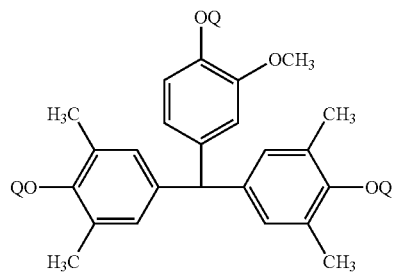
(XIII o)

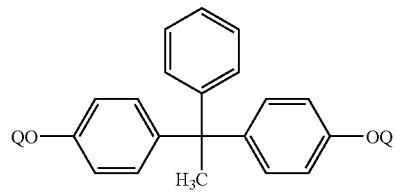
(XIII p)

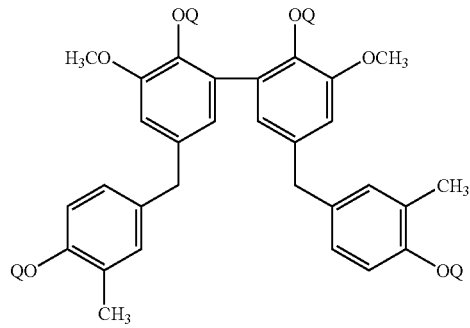
XIII r

The phenolic compounds (i.e. the backbone) typically employed in the preparation of a photoactive compound may be prepared by any suitable method. A common method of synthesis is by reaction of a suitable phenol derivative with a suitable aldehyde or ketone in the presence of a solvent such as methanol. The reaction is most often catalyzed by a strong acid (e.g. sulfuric acid or p-toluene sulfonic acid). Generally, the reaction is carried out at about 15° C. to about 80° C. for about 3 hours to about 48 hours.

The photoactive compounds XIII are synthesized by reaction of the backbone with DCl. Generally, the reaction is carried out at about 0° C. to about 30° C. for about 4 to about 36 hours in a solvent in the presence of a base. Generally, a slight excess of base to DCl is employed. Examples of bases include, but are not limited to, amine bases such as pyridine, trialkylamine, methylpyridine, lutidine, n-methylmorpholine, and the like. The most preferred base is triethylamine. The preferred reaction solvents are tetrahydrofuran (THF), gamma-butyrolactone (GBL), N,N-dimethylformamide (DMF), acetone, N,N-dimethylacetamide (DMAc), dimethyl-2-piperidone, dimethylsulfoxide (DMSO), sulfolane, and diglyme. The most preferred solvents are tetrahydrofuran (THF), acetone and gamma-butyrolactone (GBL). The reaction mixture should be protected from actinic rays.

The positive diazoquinone containing positive working photosensitive PBO precursor composition of this invention comprises at least one polybenzoxazole precursor polymer of Structure I or II or III or III* or IV or IV* at from about 5 wt. % to about 50 wt. % of the total composition. A more preferred amount of at least one polybenzoxazole precursors I or II or III or III* or IV or IV* is from about 10 wt % to about 45 wt %. A more preferred amount of at least one polybenzoxazole precursors I or II or III or III* or IV or IV* is from about 15 wt % to about 43 wt %. The most preferred amount of at least one polybenzoxazole precursors I or II or III or III* or IV or IV* is from about 20 wt % to about 40 wt %.

The polybenzoxazole precursor polymers used in the diazoquinone containing positive working photosensitive PBO precursor composition may comprise the polybenzoxazole precursor polymer described by Structure I, the polybenzoxazole precursor polymer described by Structure II, the polybenzoxazole precursor polymer described by Structure II, the polybenzoxazole precursor polymer described by Structure III*, the polybenzoxazole precursor polymer described by Structure IV, the polybenzoxazole precursor polymer described by Structure IV*, or mixtures thereof. Polymers described by Structures I and II and III and III* and IV and IV* can be blended in any ratio.

The amount of plasticizer used in the diazoquinone containing positive working photosensitive PBO precursor composition of this invention is from about 0.1 wt. % to about 20 wt. % of the total weight of the composition, preferably, from about 1 wt. % to about 10 wt. %, more preferably, from about 1.25 wt. % to about 7.5 wt. % and most preferably, from about 1.5 wt. % to about 5 wt. %. The plasticizers may be blended together in any suitable ratio.

Solvent comprises about 40 wt. % to about 80 wt. % of the diazoquinone containing positive working photosensitive PBO precursor composition. A preferred solvent range is from about 45 wt. % to about 70 wt. %. A more preferred range of solvent is from about 50 wt. % to about 65 wt. %.

The amount of photoactive compound used in the diazoquinone containing positive working photosensitive PBO precursor composition of this invention is from about 0 wt. % to about 20 wt. % of the total weight of the composition, preferably, about 2 wt. % to about 10 wt. %, and most preferably, about 3 wt. % to about 5 wt. %. The photoactive compounds may be blended together in any suitable ratio.

Optionally, an adhesion promoter may be included in the diazoquinone containing positive working photosensitive PBO precursor composition. If employed, the amount of adhesion promoter ranges from about 0.1 wt % to about 2 wt % of total weight of composition. A preferred amount of adhesion promoter is from about 0.2 wt % to about 1.5 wt %. A more preferred amount of adhesion promoter is from about 0.3 wt % to about 1 wt %. Suitable adhesion promoters include, but are not limited to, amino silanes, and mixtures or derivatives thereof. Examples of suitable adhesion promoters which may be employed in the invention may be described by Structure XIV:

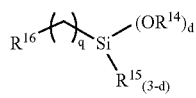

XIV wherein each $R^{14}$ is independently a $C_1$-$C_4$ alkyl group or a $C_5$-$C_7$ cycloalkyl group, each $R^{15}$ is independently a $C_1$-$C_4$ alkyl group, a $C_1$-$C_4$ alkoxy group, a $C_5$-$C_7$ cycloalkyl group or a $C_5$-$C_7$ cycloalkoxy group, d is an integer from 0 to 3 and q is an integer from 1 to about 6, $R^{16}$ is one of the following moieties:

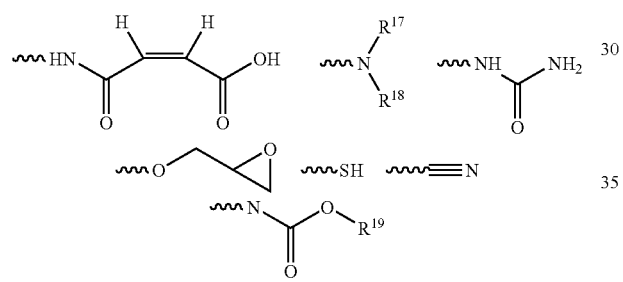

wherein each $R^{17}$ and $R^{18}$ are independently a $C_1$-$C_4$ alkyl group or a $C_5$-$C_7$ cycloalkyl group, and $R^{19}$ is a $C_1$-$C_4$ alkyl group or a $C_5$-$C_7$ cycloalkyl group. Preferred adhesion promoters are those wherein $R^{16}$ is selected from

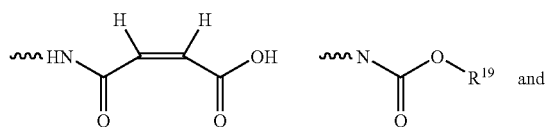

-continued

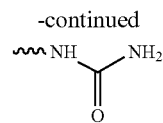

More preferred adhesion promoters are those wherein $R^{16}$ is

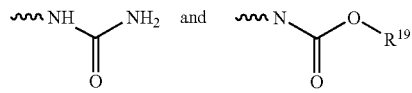

The most preferred adhesion promoters are

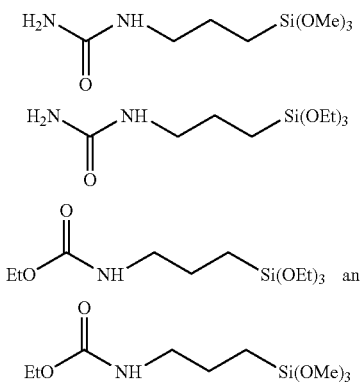

The diazoquinone containing positive working photosensitive PBO precursor compositions of the present invention may further include other additives. Suitable additives include, for example, leveling agents, dissolution inhibitors and the like. Such additives may be included in the diazoquinone containing positive working photosensitive PBO precursor compositions in about 0.03 to about 10 wt % of the total weight of composition.

Another embodiment of the present invention is directed to a heat Resistant positive working, chemically amplified photosensitive PBO precursor composition that comprises:
(a) at least one polybenzoxazole precursor polymer having Structure VI or VII or VII*

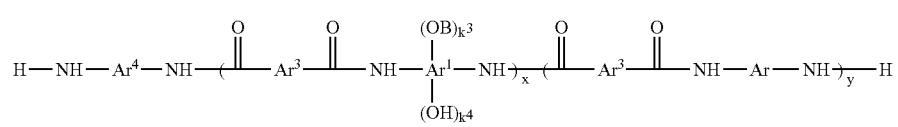

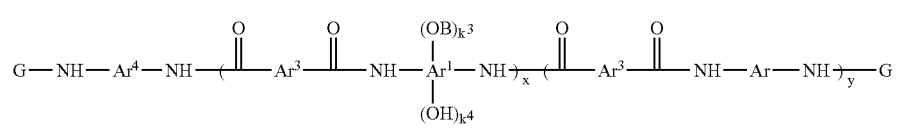

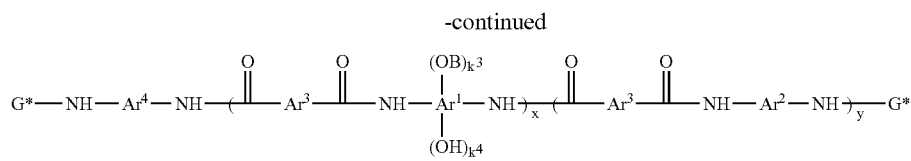

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon; $Ar^3$ is a divalent aromatic group, a divalent aliphatic group, a divalent heterocyclic group, or mixtures thereof; $Ar^4$ can be $Ar^1 (OB)_k^3 (OH)_k^4$ or $Ar^2$; x is an integer from about 10 to about 1000, y is an integer from 0 to about 900 and (x+y)<1000; B is an acid sensitive group $R^1$ or a moiety $E-O-R^2$ containing an acid sensitive group $R^2$; E is any suitable divalent aromatic, aliphatic or heterocyclic group which is not acid labile and makes an -E-OH moiety an alkali solubilizing moiety, $k^3$ can be any number between 0.1 and 2, $k^4$ can be any number between 0-1.9 provided that $(k^3+k^4)=2$; G is a substituted or unsubstituted monovalent organic group having a carbonyl, carbonyloxy or sulfonyl group attached directly to the terminal NH of the polymer and G* is a substituted or unsubstituted divalent organic group having at least one carbonyl or sulfonyl group attached directly to the terminal N of the polymer;

(b) at least one plasticizer compound;

(c) at least one photoactive compound which releases acid upon irradiation (PAG); and (d) at least one solvent.

Optionally, the chemically amplified positive working photosensitive PBO precursor composition may contain other additives, which may include photosensitizers, surfactants, bases, adhesion promoters, leveling agents and speed enhancers.

$R^1$ in combination with the O atom attached to the $Ar^1$ group forms groups such as acetal groups, ketal groups, ether groups, and silyl ether groups. Mixtures of $R^1$ groups may be employed. Suitable examples of $R^1$ groups include, but are not limited to,

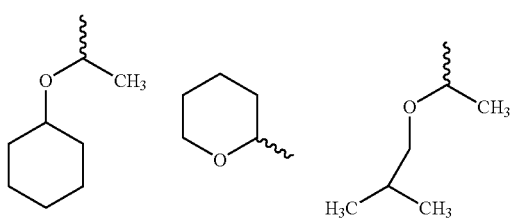

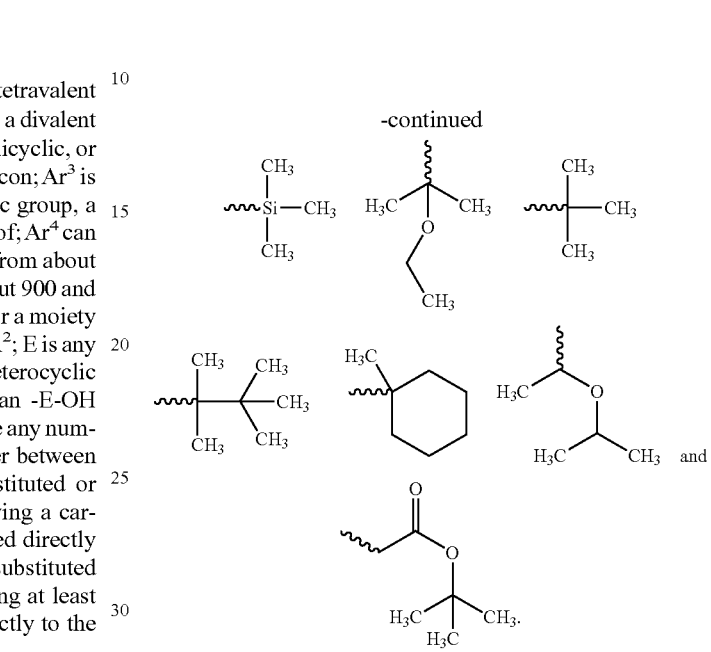

Preferred $R^1$ groups are those groups which in combination with the O atom attached to $Ar^1$ form acetal groups. More preferred $R^1$ groups include, but are not limited to:

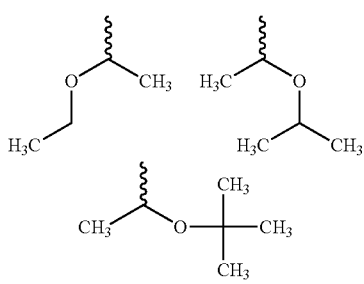

In $E-O-R^2$, E is any suitable divalent aromatic, aliphatic or heterocyclic group which is not acid labile and makes an -E-OH moiety an alkali solubilizing moiety. $R^2$ is any acid labile group. Those skilled in the art will understand that after removal of $R^2$, the resultant -E-OH moiety should be alkali solubilizing in aqueous base. The preferred -E-OH are phenols or aromatic or aliphatic carboxylic acids. Examples of the E group include, but are not limited to, the following structures

-continued

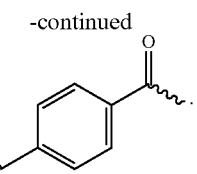

Specific examples of E-O—R² include but are not limited to, the following structures:

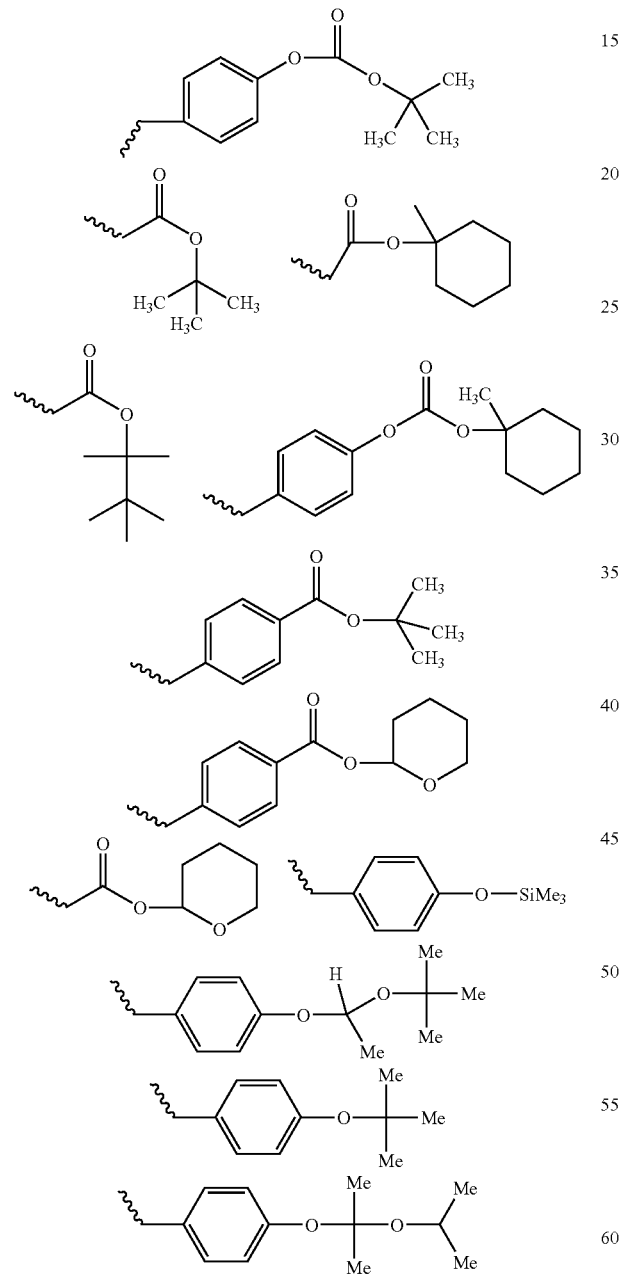

R², in combination with a portion of E, forms groups such as acetal groups, ketal groups, ether groups, silyl ethers groups, acid sensitive methylene ester groups (e.g. methylene t-butyl ester group), acid sensitive ester groups and carbonates. Mixtures of E and R² groups may be employed. When R¹ and R² are low activation energy groups (e.g. acetals), it is preferred that G not be derived from cyclic anhydrides, although G* may be so derived.

Preferred E-O—R² groups are those, containing acetals or acid sensitive esters. More preferred E-O—R² groups include, but are not limited to:

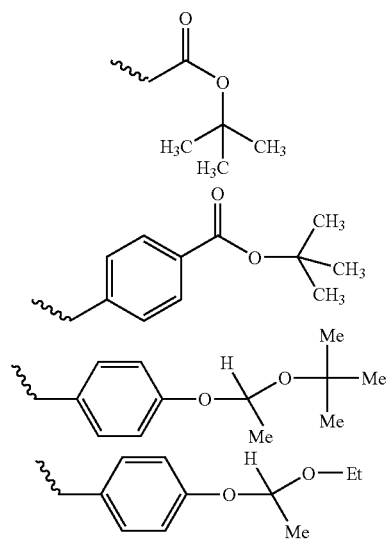

Some of the hydroxyl groups of the PBO precursor polymer of Structures I, III and III* may be reacted to yield the acid sensitive PBO precursor polymers of Structures VI, VII and VII*. This reaction of the OH groups in monomeric units in the PBO precursor polymers of Structures I, III and III* (resulting from monomers of Structure X) may be accomplished in different ways depending on which acid sensitive moiety is employed or if the spacer group E is employed. For example, the acid sensitive end capped PBO precursor of Structure VII or VII* may be prepared from the PBO precursor of Structure III or III* by an acid catalyzed addition reaction of vinyl ethers in a process similar to the one described in U.S. Pat. No. 6,143,467 and US Publication No. 20040253542. Any suitable acid catalyst may be used for the reaction, for example, hydrochloric acid, p-toluene sulfonic acid and pyridinium-p-toluene sulfonate. The acid catalyst may be added in amounts ranging from 0.001 wt % to about 3.0 wt % of the total weight of the reactants. Several vinyl ethers with a range of activation energies towards acid induced deprotection can be used in this reaction. The examples of such vinyl ethers include but are not limited to ethyl vinyl ether, t-butyl vinyl ether, vinyl cyclohexyl ether, 2-ethylhexyl vinyl ether, dihydrofuran, 2-methoxy-1-propene, and dihydropyran.

PBO precursors polymers of Structures VI, VII and VII* useful in this invention may also be prepared using a process consisting of the acid catalyzed reaction of a PBO precursor polymer of Structures I, III or III*, t-butyl vinyl ether and an alkyl-, alkylene-, cycloalkyl-, cycloalkylalkyl or arylalkyl alcohol as described for polymers derived from hydroxystyrene in U.S. Pat. No. 6,133,412, herein incorporated by reference.

A typical synthetic reaction mechanism for production of an acetal protected PBO precursor described by Structure VII is shown below:

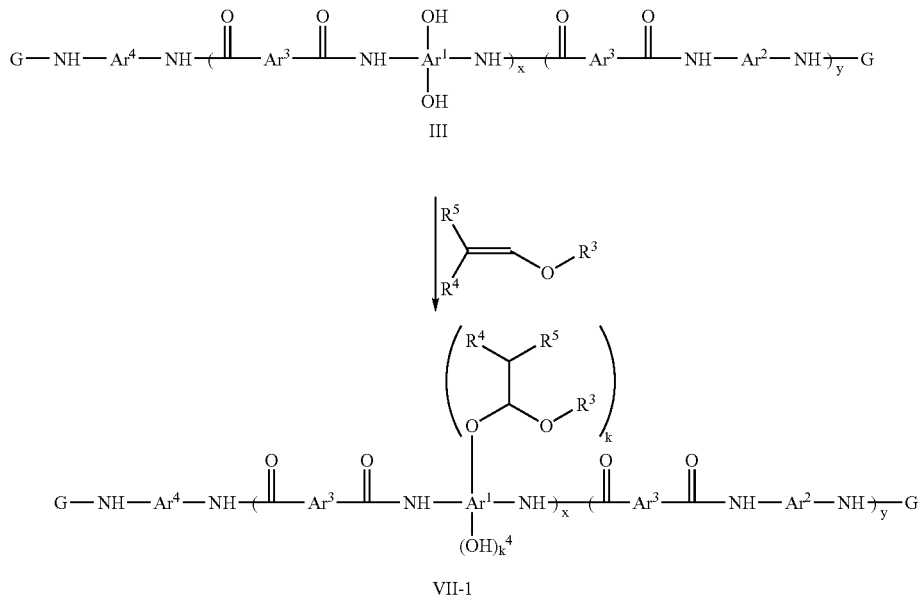

III

VII-1 wherein G, $Ar^1$, $Ar^2$, $Ar^3$, $k^3$, $k^4$, x and y are defined as before and $Ar^4$ is $Ar^1$ $(OH)_2$ or $Ar^2$ in Structure III and $Ar^1$ $(OB)_k^3$ $(OH)_k^4$ or $Ar^2$ in Structure VII-1. Examples of $R^3$ include but are not limited to substituted or unsubstituted linear, branched or cyclic alkyl groups preferably having 1 to 18 carbon atoms, substituted or unsubstituted linear, branched or cyclic halogenated alkyl groups preferably having 1 to 18 carbon atoms, or arylalkyl groups. Examples of $R^4$ and $R^5$ groups include, but are not limited to, hydrogen, linear, branched, or cyclic alkyl groups, linear or branched alkylene group bearing a cycloalkyl substituent, substituted cycloalkyl, aryl, and substituted aryl groups, preferably having 1 to 10 carbon atoms.

Another suitable method of deriving the PBO precursor polymers of Structures VI, VII and VII* bearing acid labile functional groups, is from the reaction of the PBO precursor of Structure I, III, or III* with t-butyl (or other tertiary acid sensitive group) bromoacetate in the presence of base as described for polymers containing hydroxystyrene units in U.S. Pat. No. 5,612,170. Benzyl bromides bearing acid sensitive substituents (e.g. t-butyl esters, carbonates, or alpha alkoxy esters) may be reacted in a similar fashion. Silyl group protected PBO precursor polymers of Structures VI, VII and VII* may be prepared similarly by reacting the polymer with silyl halides under basic conditions. Ether (e.g. t-butyl) protected PBO precursor polymers of Structures VI, VII and VII* may be prepared using standard synthetic procedures for the conversion of alcohol groups to ether groups.

PBO precursor polymers of this invention have a $k^3$ from about 0.1 to about 2. A preferred value for $k^3$ is from about 0.1 to about 1.5. A more preferred value for $k^3$ is from about 0.2 to about 1.2. The corresponding values for $k^4$ are $2-k^3$.

The chemically amplified positive working photosensitive PBO precursor compositions of the present invention further comprise at least one plasticizer. The plasticizer should have a lower volatility than the solvent employed at the typical bake temperatures of about 100° C. to about 150° C., so that it remains in the film after the softbake. This typically means that the plasticizer of this invention has a higher boiling point than the solvent employed, unless interaction of the functional groups of the plasticizer with other components of the chemically amplified positive working photosensitive PBO precursor composition decreases its volatility sufficiently. It is preferred that this boiling point differential is at least about 10° C. A more preferred boiling point differential is at least about 15° C.

In one embodiment of the present invention concerning the chemically amplified positive working photosensitive PBO precursor composition the plasticizer is at least one polyhydroxy compound with at least two OH groups and whose boiling point is higher than the boiling point of the chemically amplified positive working photosensitive PBO precursor composition solvent. Examples of polyhydroxy compounds with at least two OH groups are, but are not limited to, ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2.1.0/2,6)decane and a 2-oxepanone co-polymer with 2-ethyl-2-(hydroxymethyl)-1, 3-propanediol. Preferred polyhydroxy compound with at least two OH groups are diethylene glycol, tripropylene glycol, and a 2-oxepanone co-polymer with 2-ethyl-2-(hydroxymethyl)-1,3-propanediol. More preferred polyhydroxy compound with at least two OH groups are tripropylene glycol and a 2-oxepanone co-polymer with 2-ethyl-2-(hydroxymethyl)-1,3-propanediol.

In another embodiment of the present invention concerning the chemically amplified positive working photosensitive PBO precursor composition the plasticizer is at least one saturated glycol mono ether whose boiling point is higher than the boiling point of the chemically amplified positive working photosensitive PBO precursor composition solvent. Examples of suitable saturated glycol mono ethers include, but are not limited to, saturated mono ethers of tripropylene glycol, tetrapropylene glycol, triethylene glycol, tetraethylene glycol and pentaethylene glycol. Preferred saturated glycol mono ethers are saturated mono ethers of tripropylene glycol, triethylene glycol and tetraethylene glycol. More preferred saturated glycol mono ethers are tri(propylene glycol) methyl ether, tri(propylene glycol)propyl ether and tri(propylene glycol)butyl ether.

In another embodiment of the present invention concerning the chemically amplified positive working photosensitive PBO precursor composition the plasticizer is at least one carboxylic acid ester whose boiling point is higher than the boiling point of the chemically amplified positive working photosensitive PBO precursor composition solvent. Examples include, but are not limited to, Ethyl cyclohexyl acetate, propyl benzoate, butyl benzoate, n-butyl cinnamate, ethyl-3,3'-diethoxypropionate, dimethyl succinate, diisopropyl succinate, dimethyl maleate, dimethyl malonate, diethyl adipate, diethyl acetamidomalonate, diethyl allylmalonate, and dimethyl cyclohexane-1,4-dicarboxylate, mixture of cis and trans isomers. Preferably the carboxylic acid ester is derived from a carboxylic acid containing at least two carboxylic acid groups. Examples include, but are not limited to, dimethyl succinate, diisopropyl succinate, dimethyl maleate, dimethyl malonate, diethyl adipate, diethyl acetamidomalonate, diethyl allylmalonate, and dimethyl cyclohexane-1,4-dicarboxylate, mixture of cis and trans isomers.

Preferred embodiments of the present inventions are chemically amplified positive working photosensitive PBO precursor compositions comprising at least one plasticizer selected from the group consisting of polyhydroxy compounds with at least two OH groups and glycol ethers.

More preferred embodiments of the present inventions are chemically amplified positive working photosensitive PBO precursor compositions comprising at least one plasticizer selected from the group consisting of polyhydroxy compounds with at least two OH groups.

The chemically amplified positive working photosensitive PBO precursor compositions of the present invention further comprise photoactive compounds which release acid upon irradiation. Such materials are commonly called PhotoAcid Generators (PAGs). PAGs used in the present invention are preferably active to the radiation between about 300 nm to about 460 nm. They should form a homogeneous solution in the chemically amplified positive working photosensitive PBO precursor composition and produce a strong acid upon irradiation. Examples of such acids include hydrogen halides or a sulfonic acid. The classes of such PAGs include, but are not limited to, oxime sulfonates, triazines, diazoquinone sulfonates, or sulfonium or iodonium salts of sulfonic acids. Examples of suitable PAGs include but are not limited to:

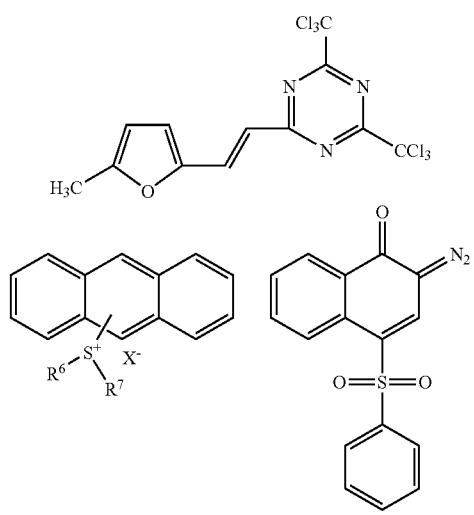

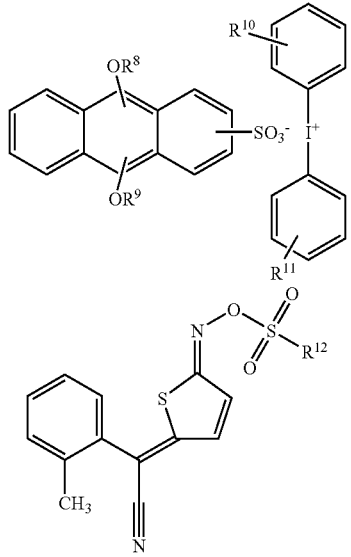

where $R^6$ and $R^7$ are each independently linear, branched or cyclic alkyl or aryl group containing 1 to 20 carbon atoms and $X^-$ is $R^{21}SO_3^-$ wherein $R^{21}$ is a substituted or unsubstituted, linear, branched or cyclic $C_1$-$C_{25}$ alkyl or a single or multinuclear aryl group having a total of from 6 to 25 carbons; $R^8$, $R^9$, $R^{10}$ and $R^{11}$ are independently linear, branched or cyclic alkyl groups and $R^{12}$ is a linear or branched $C_1$-$C_8$ alkyl, $C_5$-$C_8$ cycloalkyl, camphoryl or tolyl group.

Alternatively, acid could be generated by a combination of PAG/sensitizer. In such systems energy of radiation is absorbed by the sensitizer and transmitted in some manner to the PAG. The transmitted energy causes PAG decomposition and the generation of an photoacid. Any suitable photoacid generator compound may be used. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589 which are incorporated herein by reference. Other suitable photoacid generators are perfluoroalkyl sulfonyl methides and perfluoroalkyl sulfonyl imides as disclosed in U.S. Pat. No. 5,554,664.

Still other suitable examples of photoacid generators are triphenylsulfonium trifluoromethanesulfonate, diphenylethylsulfonium trifluoromethanesulfonate, phenacyldimethylsulfonium trifluoromethanesulfonate, phenacyltetrahydrothiophenium trifluoromethanesulfonate, 4-nitrophenacyltetrahydrothiopheniumn trifluoromethanesulfonate, and 4-hydroxy-2-methylphenylhexahydrothiopyrylium trifluoromethanesulfonate.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenylsulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzenesulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1 cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzene-sulfonate.

Examples of sensitizers include but are not limited to: 9-methylanthracene, anthracenemethanol, acenaphthalene, thioxanthone, methyl-2-naphthyl ketone, 4-acetylbiphenyl, 1,2-benzofluorene.

Suitable solvents of this chemically amplified positive working photosensitive PBO precursor composition are polar organic solvents. The solvent should not interfere with the photoacid generation from PAG or with the acid-catalyzed crosslinking reaction, should dissolve all components and should cast a good film. Suitable examples of polar organic solvents include, but are not limited to, gamma-butyrolactone (GBL), propylene glycol methyl ether acetate (PGMEA), propylene glycol methyl ether (PGME), ethyl lactate and mixtures thereof. The preferred solvents are gamma-butyrolactone and propylene glycol methyl ether acetate. The most preferred solvent is propylene glycol methyl ether acetate.

The amount of polybenzoxazole precursor polymer(s) of Structures VI, VII or VII* in the chemically amplified positive working photosensitive PBO precursor composition is from about 5 wt % to about 50 wt %. The more preferred amount of polybenzoxazole precursor polymer(s) of Structures VI, VII or VII* is from about 20 wt % to about 45 wt % and the most preferred amount of polybenzoxazole precursor polymer(s) of Structures VI, VII or VII* is from about 30 wt % to about 40 wt %. Polybenzoxazole precursor polymers of Structures VI, VII or VII* can be used singly or be combined in any ratio.

The amount of plasticizer used in the chemically amplified positive working photosensitive PBO precursor composition of this invention is from about 0.1 wt % to about 20 wt % of the total weight of the composition, preferably, from about 1 wt % to about 10 wt %, more preferably, from about 1.25 wt % to about 7.5 wt % and most preferably, from about 1.5 wt % to about 5 wt %. The plasticizers may be blended together in any suitable ratio.

The amount of PAG ranges from about 0.13 wt % to about 7 wt % of the chemically amplified positive working photosensitive PBO precursor composition. A preferred amount of PAG is from about 0.7 wt % to about 5 wt % of the chemically amplified positive working photosensitive PBO precursor composition. A more preferred amount of PAG is from about 0.7 wt % to about 3.5 wt % of the chemically amplified positive working photosensitive PBO precursor composition. The amount of optional sensitizer can be from about 0.03 wt % to about 1.7 wt % of the chemically amplified positive working photosensitive PBO precursor composition.

The solvent component (c) comprises from about 45 wt % to about 87 wt % of the chemically amplified positive working photosensitive PBO precursor composition. A preferred solvent range is from about 50 wt % to a bout 65 wt %. A more preferred range of solvent is from about 50 wt % to about 65 wt %. Solvents may be blended together in any suitable ratio.

Optionally, an adhesion promoter may be included in the chemically amplified positive working photosensitive PBO precursor composition. If employed, the amount of adhesion promoter ranges from about 0.1 wt % to about 2 wt % of total weight of chemically amplified positive working photosensitive PBO precursor composition. A preferred amount of adhesion promoter is from about 0.2 wt % to about 1.5 wt %. A more preferred amount of adhesion promoter is from about 0.3 wt % to about 1 wt %. Suitable adhesion promoters were described above.

The chemically amplified positive working photosensitive PBO precursor compositions of the present invention may further include other additives, such as, but not limited to, surfactants, dyes, time delay additives, dissolution inhibitors, etc. Such additives may be included in the chemically amplified positive working photosensitive PBO precursor compositions in about 0.03 to about 10 wt % of the total weight of composition.

Another embodiment of the present invention concerns a process for forming a relief pattern The process comprises the steps of:
(a) coating on a suitable substrate,
  1. a diazoquinone containing positive working photosensitive PBO precursor composition comprising one or more polybenzoxazole precursor polymers having Structures I or II or III or III* or IV or IV* or mixtures thereof, at least one plasticizer and at least one solvent, with the proviso that if the polybenzoxazole precursor polymer solely consists of Structure I or III or III* or mixtures thereof, then at least one photoactive compound is added; or
  2. a chemically amplified positive working photosensitive PBO precursor composition comprising one or more polybenzoxazole precursor polymers having Structures VI or VII or VII* or mixtures thereof, at least one plasticizer, at least one photoactive compound which releases acid upon irradiation (PAG), and at least one solvent,
thereby forming a coated substrate;
(b) prebaking the coated substrate;
(c) exposing the prebaked coated substrate to actinic radiation;

(d) optionally post exposure baking the coated, exposed substrate;

(e) developing the coated, exposed substrate with an aqueous developer, thereby forming an uncured relief image on the developed coated substrate; and (f) baking the developed coated substrate at an elevated temperature, thereby curing the relief image.

with the proviso that if the chemically amplified positive working photosensitive PBO precursor composition (composition 2) is used in step (a) then the post exposure step (d) is required.

The process may optionally include the step of pre-wetting a substrate with a solvent. Any suitable method of treatment of the substrate with the solvent known to those skilled in the art may be employed. Examples include treatment of the substrate with solvent by spraying, streaming or immersing the substrate into the solvent. The time and temperature of treatment will depend on the particular substrate, and method, which may employ elevated temperatures. Any suitable solvent or solvent blend may be employed. Preferred are solvents used in the positive working photosensitive PBO precursor composition.

The process may optionally include the step of pre-coating a substrate with a solvent containing an adhesion promoter. Any suitable method of treatment of the substrate with adhesion promoter known to those skilled in the art may be employed. Examples include treatment of the substrate with adhesion promoter vapors, solutions or at 100% concentration. The time and temperature of treatment will depend on the particular substrate, adhesion promoter, and method, which may employ elevated temperatures. Any suitable external adhesion promoter may be employed. Classes of suitable external adhesion promoters include, but are not limited to, vinylalkoxysilanes, methacryloxyalkoxysilanes, mercaptoalkoxysilanes, aminoalkoxysilanes, epoxyalkoxysilanes and glycidoxyalkoxysilanes. Aminosilanes and glycidoxysilanes are preferred. Primary aminoalkoxysilanes are more preferred. Examples of suitable external adhesion promoters include, but are not limited to, gamma-aminopropyltrimethoxysilane, gamma-glycidoxypropylmethyldimethoxysilane, gamma-glycidoxypropyl-methyldiethoxysilane, gamma-mercaptopropylmethyldimethoxysilane, 3-methacryloxypropyldimethoxymethylsilane, and 3-methacryloxypropyltrimethoxysilane. gamma-aminopropyltrimethoxysilane is more preferred. Additional suitable adhesion promoters are described in "Silane Coupling Agent" Edwin P. Plueddemann, 1982 Plenum Press, New York.

The positive working photosensitive PBO precursor composition of this invention is coated on a suitable substrate. The substrate may be, for example, semiconductor materials such as a silicon wafer, compound semiconductor (Groups III-V) or (Groups II-VI) wafer, a ceramic, glass or quartz substrate. The substrates may also contain films or structures used for electronic circuit fabrication such as organic or inorganic dielectrics, copper or other wiring metals.

Coating methods include, but are not limited to, spray coating, spin coating, offset printing, roller coating, screen printing, extrusion coating, meniscus coating, curtain coating, and immersion coating.

The resulting film is prebaked at an elevated temperature. Wafers coated with the diazoquinone containing positive working photosensitive PBO precursor composition may be baked at one or more temperatures within the temperature range of about 70° C. to about 130° C. Preferably the temperature range is about 80° C. to about 130° C., more preferably the temperature range is about 80° C. to about 120° C. and most preferably the coatings are baked from about 90° C. to about 100° C.

Similarly, wafers coated with the chemically amplified positive working photosensitive PBO precursor composition may be baked at one or more temperatures within the temperature range of about 70° C. to about 150° C. Preferably the temperature range is about 80° C. to about 130° C., more preferably the temperature range is about 90° C. to about 120° C. and most preferably the coatings are baked from about 100° C. to about 120° C.

The duration of the bake is for several minutes to half an hour, depending on the method to evaporate the remaining solvent. Any suitable baking means may be employed. Examples of suitable baking means include, but are not limited to, hot plates and convection ovens. The resulting dry film has a thickness of from about 3 to about 50 microns or more preferably from about 4 to about 20 microns or most preferably from about 5 to about 15 microns.

After the bake step, the resulting dry film is exposed to actinic rays in a preferred pattern through a mask. X-rays, electron beam, ultraviolet rays, visible light, and the like can be used as actinic rays. The most preferred rays are those with wavelength of 436 nm (g-line) and 365 nm (i-line).

Following exposure to actinic radiation, it may be advantageous to heat the exposed and chemically amplified positive working photosensitive PBO precursor composition coated substrate to a temperature between about 70° C. to about 150. Preferably the temperature range is about 80° C. to about 140° C. More preferably the temperature range is about 90° C. to about 130° C. Most preferably the temperature range is about 100° C. to about 130° C.

For the exposed and diazoquinone containing positive working photosensitive PBO precursor composition coated substrate this additional heat step after actinic radiation is optional. If used the substrate should not be heated over 130° C.

The exposed and coated substrate is heated in this temperature range for a short period of time, typically several seconds to several minutes and may be carried out using any suitable heating means. Preferred means include baking on a hot plate or in a convection oven. This process step is commonly referred to in the art as post-exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddle, or other similar developing methods at temperatures from about 10° C. to about 40° C. for about 30 seconds to about 5 minutes. After development, the relief pattern may be optionally rinsed using deionized water and dried by spinning, baking on a hot plate, in an oven, or other suitable means.

Following development, in an optional step it may be advantageous to heat the exposed, coated and developed substrate to a temperature between about 70° C. to about 150° C. Preferably the temperature range is about 80° C. to about 140° C. More preferably the temperature range is about 80° C. to about 130° C. The most preferred temperature range is about 90° C. to about 130° C. The exposed, coated and developed substrate is heated in this temperature range for a short period of time, typically several seconds to several minutes and may be carried out using any suitable heating means. Preferred means include baking on a hot plate or in a convection oven. This process step is commonly referred to in the art as post-develop baking.

The benzoxazole ring is then formed by curing of the uncured relief pattern to obtain the final high heat resistant pattern. Curing is performed by baking the developed, uncured relief pattern at or above the glass transition temperature $T_g$ of the positive working photosensitive PBO precursor composition to obtain the benzoxazole ring that provides high heat resistance. Typically, temperatures above about 200° C. are used.

Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate, a convection oven, tube furnace, vertical tube furnace, or rapid thermal processor. Alternatively, curing may be effected by the action of microwave or infrared radiation.

The invention is illustrated by, but not limited to, the following examples in which the parts and percentages are by weight (wt %) unless otherwise specified.

SYNTHESIS EXAMPLE 1

Synthesis of Polybenzoxazole Precursor Polymer of Structure Type I

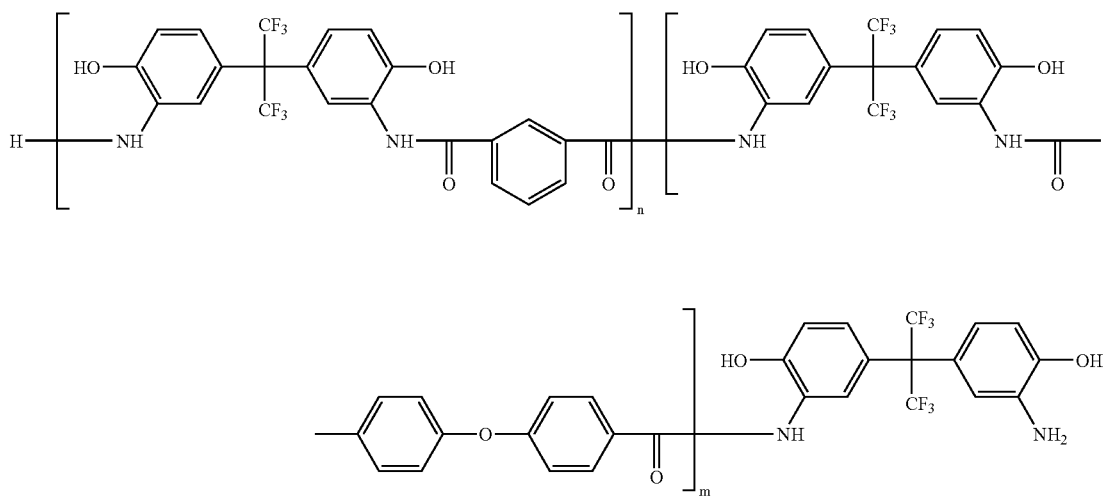

Formation of polybenzoxazole ring

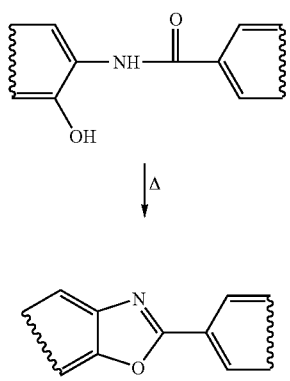

To a 2 liter, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane (BisAPAF), 64.3 g (794.9 mmol) of pyridine, and 637.5 g of N-methylpyrrolidone (NMP) were added. The solution was stirred at room temperature until all solids dissolved, then cooled in an ice water bath at 0-5° C. To this solution, 39.3 g (194 mmol) of isophthaloyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred deionized water. The polymer was collected by filtration and washed with deionized water and a water/methanol (50/50) mixture. The polymer was dried under vacuum conditions at 105° C. for 24 hours.

The yield was almost quantitative and the inherent viscosity of the polymer was 0.20 dl/g measured in NMP at a concentration of 0.5 g/dl at 25° C.

SYNTHESIS EXAMPLE 2

Preparation of a PBO Precursor Polymer of Structure Type III with a p-Toluene Sulfonyl Endcap. (IIIa-2)

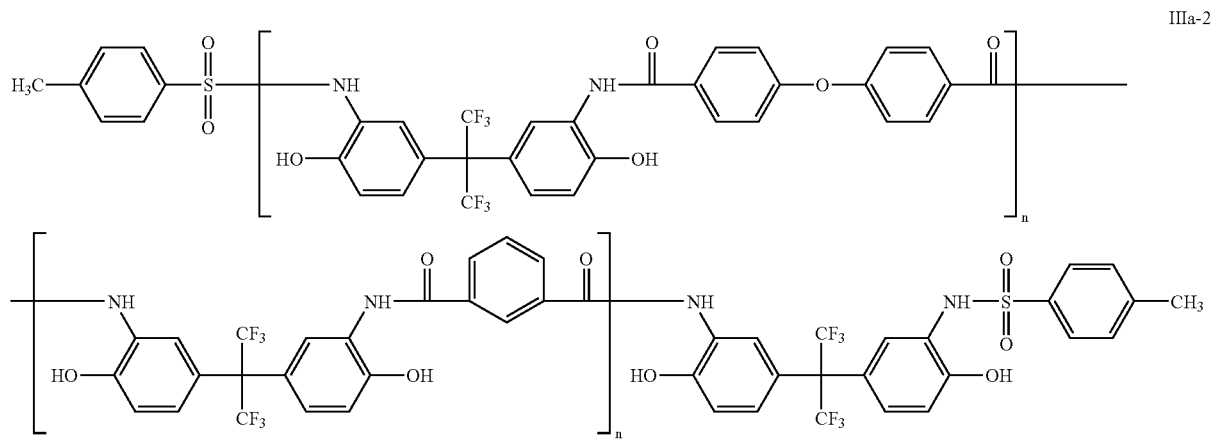

IIIa-2

The PBO precursor polymer obtained in Synthesis Example 1 (100 g) was dissolved in a mixture of 500 g of diglyme and 300 g of propylene glycol methyl ether acetate (PGMEA). Residual water was removed as an azeotrope with PGMEA and diglyme using vacuum distillation at 65° C. (10-12 torr). About 400 g of solvents was removed during the azeotropic distillation. The reaction solution was placed under a $N_2$ blanket. The reaction mixture was cooled on an ice bath down to 5° C. and 3.2 g of pyridine was added at once followed by 8.5 g of p-toluene sulfonic acid chloride. The reaction mixture was allowed to warmed up to room temperature and stirred overnight.

The reaction mixture was precipitated into 6 liters of deionized water while stirring. The precipitated polymer was collected by filtration and air dried overnight. Then the polymer was dissolved in 500-600 g of acetone and precipitated into 6 liters of a water/methanol (70/30) mixture. The polymer was again collected by filtration and air-dried for several hours. The still damp polymer cake was dissolved in a mixture of 700 g of THF and 70 ml of deionized water. An ion exchange resin UP604 (40 g), available from Rohm and Haas, was added and the solution was rolled for 1 hour. The final product was precipitated in 7 liters of deionized water, filtered, air-dried overnight followed by 24 hour drying in vacuum oven at 90° C.

$^1$H NMR analysis showed the absence of any amine peaks at ~4.5 ppm as well as the absence of aromatic peaks due to the uncapped BisAPAF unit at 6.4-6.7 ppm. This indicates that end capping was complete. The yield was 77 g.

SYNTHESIS EXAMPLE 3

Synthesis of a Polymer of Structure Type III with Acetyl Endcap (IIIa-1)

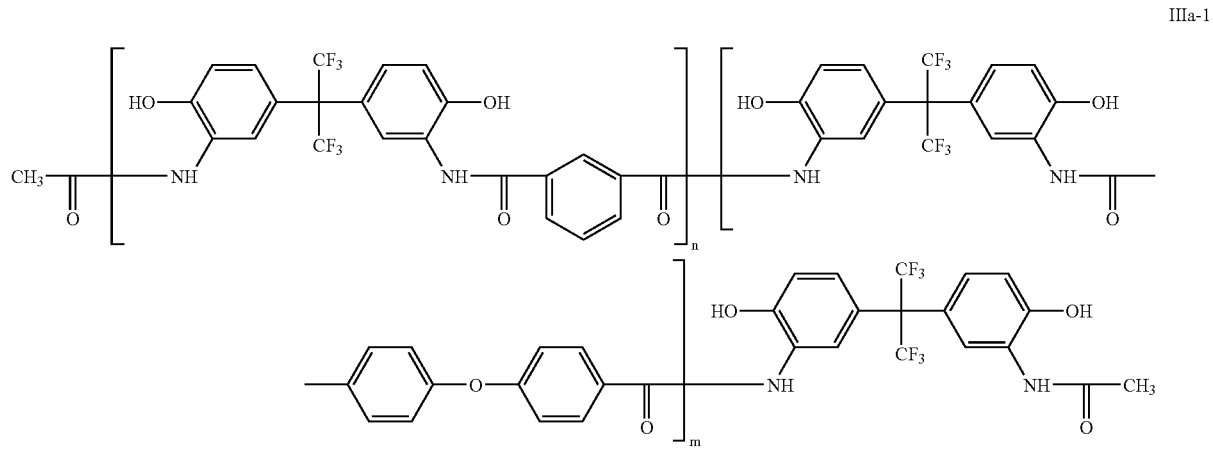

IIIa-1

3 small batches of polybenzoxazole precursor polymers synthesized according to Synthesis Example 1 were mixed to obtain 100 g (184.5 mmole) of a polybenzoxazole precursor polymer mixture with inherent viscosity of 0.205 dl/g. The mixture was dissolved in 1000 g of diglyme. Residual water was removed as an azeotrope with diglyme using a rotary evaporator at 65° C. (10-12 torr). About 500 g of solvent was removed during the azeotropic distillation.

The reaction solution was transferred to a 1 liter, three neck, round bottom flask equipped with $N_2$ inlet and magnetic stirrer. The reaction mixture was cooled with an ice bath down to about 5° C. 3.3 ml of acetyl chloride (3.6 g) was added via syringe over a 5 minute period while stirring the reaction mixture. The reaction mixture was kept on the ice bath for about 10 more minutes following the completion of the addition of the acetyl chloride. Then the ice bath was removed and the reaction was allowed to warm up over the period of 1 hour. The reaction mixture was again cooled to 5° C. on the ice bath and 3.7 ml of pyridine (3.6 g) was added via syringe over the next hour. The reaction mixture was kept on the ice bath for an additional 10 minutes and then was allowed to warm up over the period of 1 hour.

The reaction mixture was precipitated into 6 liters of deionized water. The polymer was collected by filtration and air dried overnight. Then the polymer was dissolved in 500-600 g of acetone and precipitated into 6 liters of a 70/30 water/methanol mixture. The polymer was again collected by filtration and air-dried for several hours. The wet polymer cake was dissolved in 700 g of THF and was precipitated in 7 liters of deionized water, filtered, air-dried overnight followed by 24 hours drying in vacuum oven at 90° C.

$^1$H NMR analysis of the PBO precursor polymer IIIa did not show a peak for terminal $NH_2$ groups (@ 4.5 ppm) indicating that all $NH_2$ groups were reacted.

SYNTHESIS EXAMPLE 4

Synthesis of a Polymer of Structure Type IV (IVa-1)

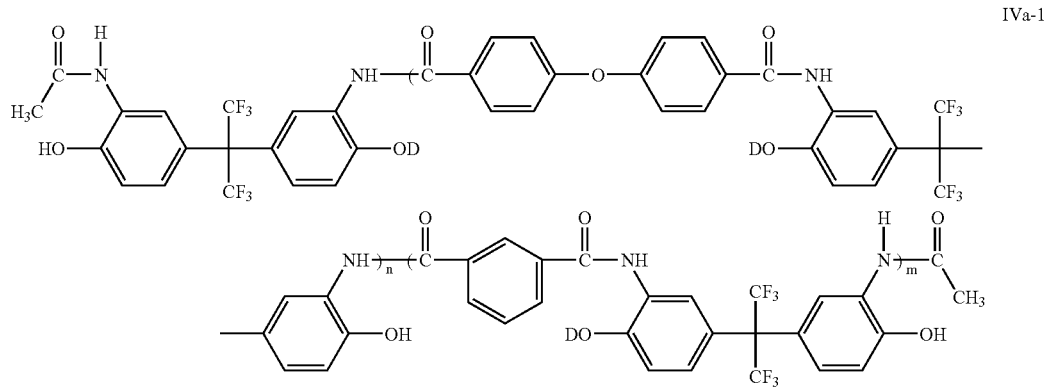

IVa-1

To a 1 liter three-necked round bottom flask equipped with a mechanical stirrer, 67.5 g (approximately 120 mmole) of a blend of two batches of polymer synthesized according to Synthesis Example 3 and 650 g of THF were added. The mixture was stirred for ten minutes and the solid was fully dissolved. 1.01 g (3.8 mmole) of 2,1-naphthoquinonediazide-5-sulfonyl chloride was then added and the mixture was stirred for another 10 minutes. 0.39 g (3.9 mmole) of triethylamine mixed with 50 ml THF was added gradually over a period of 30 minutes and then the reaction mixture was stirred overnight.

The reaction mixture was then gradually added to 3 liters of vigorously stirring deionized water. The precipitated product was separated by filtration and re-slurried twice, each time with 3 liters of deionized water. After filtration the product was washed with 2 liters of deionized water. The isolated product was dried at 40° C. overnight. The yield of product was 84%.

SYNTHESIS EXAMPLE 5

Preparation of a PBO Precursor Polymer of Structure Type III with 2,6-Dimethoxybenzoyl Endcap (IIIa-4)

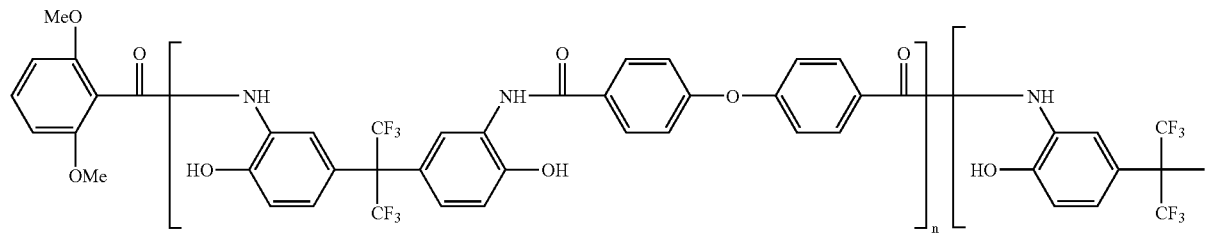

IIIa-4

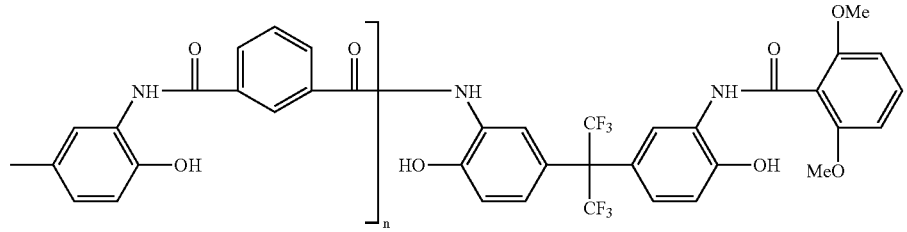

A PBO precursor polymer obtained in Synthesis Example 1 (100 g) was dissolved in a mixture of 500 g of diglyme and 300 g of propylene glycol methyl ether acetate (PGMEA). Residual water was removed as an azeotrope with PGMEA and diglyme using vacuum distillation at 65° C. (10-12 torr). About 400 g of solvents was removed during the azeotropic distillation. The reaction solution was placed under a $N_2$ blanket. The reaction mixture was cooled on an ice bath down to 5° C. and 3.2 g of pyridine was added at once followed by addition of 10 g of 2,6-dimethoxybenzoyl chloride over a period of 20 min. The reaction mixture was allowed to warmed up to room temperature and stirred overnight.

The reaction mixture was precipitated into 6 liters of deionized water while stirring. The precipitated polymer was collected by filtration and air dried overnight. Then the polymer was dissolved in 500-600 g of acetone and precipitated into 6 liters of a water/methanol (70/30) mixture. The polymer was again collected by filtration and air-dried for several hours. The still damp polymer cake was dissolved in a mixture of 700 g of THF and 70 ml of water. An ion exchange resin UP604 (40 g), available from Rohm and Haas, was added and the solution was rolled for 1 hour. The final product was precipitated in 7 liters of deionized water, filtered, air-dried overnight followed by 24 hours drying in vacuum oven at 90° C.

$^1$H NMR analysis showed the absence of any amine peaks at ~4.5 ppm as well as the absence of aromatic peaks due to the uncapped BisAPAF unit at 6.4-6.7 ppm. This indicates that end capping was complete. The yield was 89 g.

SYNTHESIS EXAMPLE 6

Synthesis of a Polymer of Structure Type II (IIa)

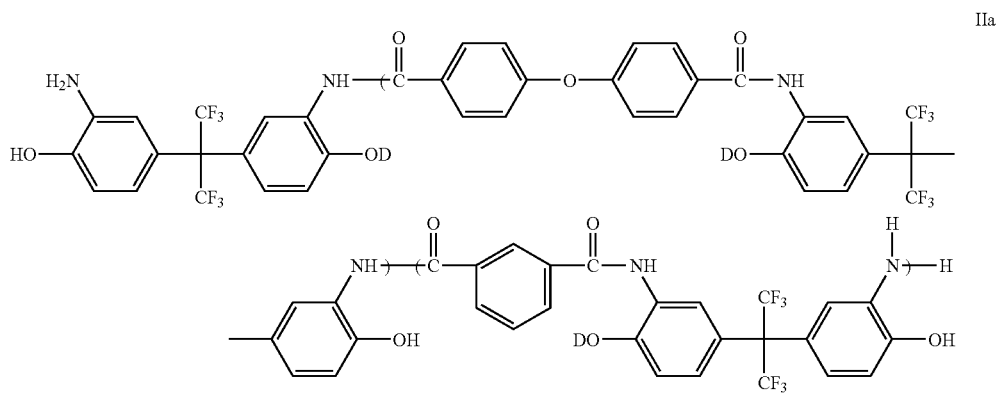

To a 100 ml three-necked round bottom flask equipped with a mechanical stirrer, 5.42 g (10.0 mmole) of the polymer obtained in Synthesis Example 1 and 50 ml of tetrahydrofuran (THF) were added. The mixture was stirred for ten minutes and the solid was fully dissolved. 0.53 g (2 mmole) of 2,1-naphthoquinonediazide-5-sulfonyl chloride was then added and the mixture was stirred for another 10 minutes. 0.2 g triethylamine (2 mmole) was gradually added over a period of 15 minutes and then the reaction mixture was stirred for 5 hours.

The reaction mixture was then added gradually to 500 ml of vigorously stirring deionized water. The precipitated product was separated by filtration and washed with 200 ml of deionized water. The filter cake was re-slurried in another 600 ml deionized water and vigorously stirred for 30 minutes. After filtration the product was washed with 100 ml deionized water. The isolated product was dried at 40° C. overnight. The inherent viscosity of the polymer was 0.20 dl/g measured in NMP at the concentration of 0.5 g/dl at 25° C.

SYNTHESIS EXAMPLE 7

Synthesis of a Polymer of Structure Type IV and Phthalic Acid Endcap (IVa-3)

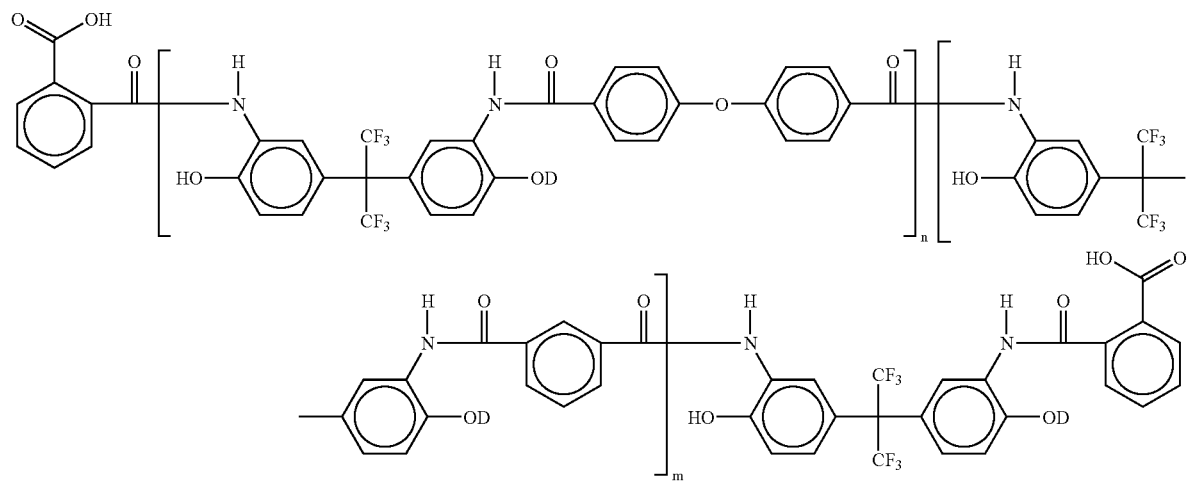

IVa-3

To a 1 liter three-necked round bottom flask equipped with a mechanical stirrer and nitrogen inlet 100 g (165.9 mmole) of a polymer prepared by the procedure described Synthesis Example 6 and 290 g of diglyme were added. The mixture was stirred for about 25 minutes and the solid was fully dissolved. 6.5 g (43.9 mmole) of phthalic anhydride was then added portion-wise within an hour at room temperature and the mixture was stirred for 16 hours.

The reaction mixture was then gradually added to 5200 ml of vigorously stirring deionized water over a 60 minute period. The precipitated product was separated by filtration and washed with 0.2000 ml of deionized water. The filter cake was re-slurried in another 4000 ml deionized water and vigorously stirred for 30 minutes. After filtration the product was washed with 2000 ml deionized water. The isolated product was dried at 40° C. overnight. The yield of product was 90%.

SYNTHESIS EXAMPLE 8

Synthesis of a Photoactive Compound PAC A system were added 225 ml of THF and 30 g of (4,4'-(1-phenylethylidene)bisphenol) (Bisphenol AP). The mixture was stirred until Bisphenol AP was fully dissolved. To this was added 27.75 g of 4-naphthoquinone diazide sulfonyl chloride (S214-Cl) and 25 ml of THF. The reaction mixture was stirred until the solid was fully dissolved. 10.48 g of triethylamine dissolved in 50 ml THF was added to the reaction mixture gradually while the pH was kept below 8 during this process. The temperature during this exothermic reaction was kept below 30° C. Upon completion of addition, the reaction mixture was stirred for 48 hours. To this was added 27.75 g of 5-naphthoquinone diazide sulfonyl chloride (S215-Cl) and 25 ml of THF and the reaction mixture was stirred for 30 minutes. 10.48 g triethylamine dissolved in 50 ml THF was added to the reaction mixture gradually while the pH was kept below 8 during this process. Again during this exothermic reaction the temperature was kept below 30° C. Upon completion of the addition, the reaction mixture was stirred for 20 hours. The reaction mixture was then added

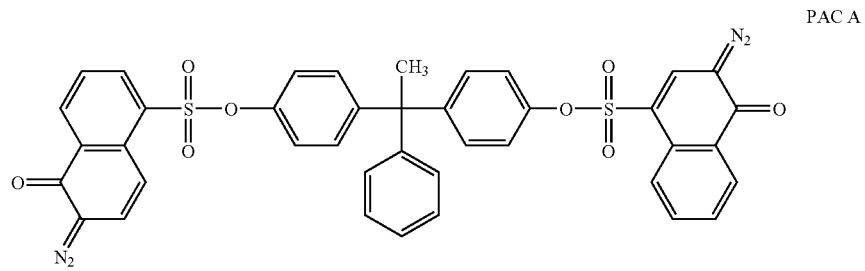

PAC A

To a 500 ml, 3-neck flask equipped with mechanical stirrer, dropping funnel, pH probe, thermometer and nitrogen purge gradually to a mixture of 6 liters of deionized water and 10 g of HCl. The product was filtered and washed with 2 liters of deionized water. The product was then reslurried by using 3 liters of deionized water, filtered and washed with 1 liter of deionized water. The product was then dried inside a vacuum oven at 40° C. until the amount of water dropped below 2%. HPLC analysis revealed that the product was a mixture of several esters as shown in Table 1.

TABLE 1

| Structure | DNQ moiety | Example 3 |
| --- | --- | --- |
| | S214 | 0.61% |
| | S215 | 0.53% |
| | S214 monoester | 1.72% |
| | S216 monoester | 1.4% |
| | S215 diester | 18.9% |
| | Mixed Ester PAC | 46.7% |

TABLE 1-continued

| Structure | DNQ moiety | Example 3 |
|---|---|---|
| 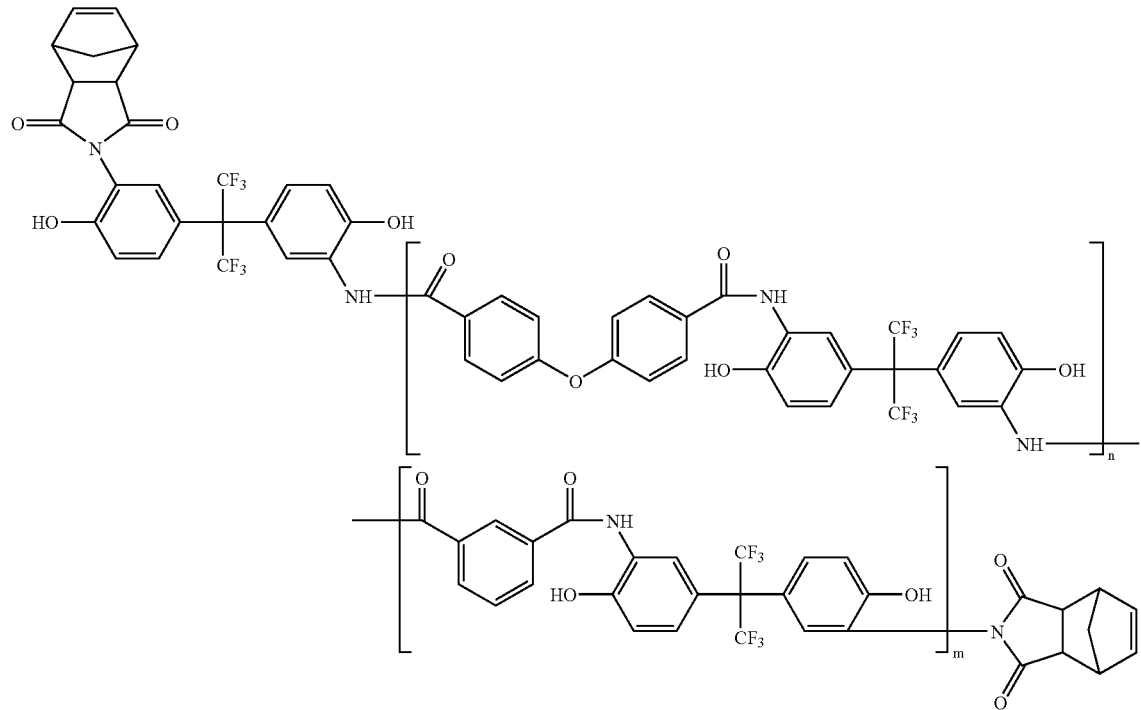 | S214 diester | 29% |

SYNTHESIS EXAMPLE 9

Preparation of a PBO Precursor Polymer of Structure Type III* with an Imide Endcap (III*a)

(III*a)

A PBO precursor polymer prepared in the same way as in Synthesis Example 1 (200 g) was dissolved in a mixture of 600 g of diglyme and 300 g of propylene glycol methyl ether acetate (PGMEA). Residual water was removed as an azeotrope with PGMEA and diglyme using a rotary evaporator at 65° C. (10-12 torr). About 550 g of solvent was removed during the azeotropic distillation. The reaction solution was placed under a $N_2$ blanket and the reaction flask was equipped with a magnetic stirrer. Nadic anhydride (7 g) was added followed by 10 g of pyridine. The reaction was stirred overnight at 50° C. Then the reaction mixture was diluted with 500 g of tetrahydrofuran (THF) and precipitated into 8 liters of a 50/50 methanol/water mixture. The polymer was collected by filtration and vacuum dried at 80° C.

The yield was almost quantitative and the inherent viscosity of the polymer was 0.20 dl/g measured in NMP at a concentration of 0.5 g/dl at 25° C.

SYNTHESIS EXAMPLE 10

Preparation of PBO Precursor of Structure Type VII*
Blocked with Ethyl Vinyl Ether (VII*a)

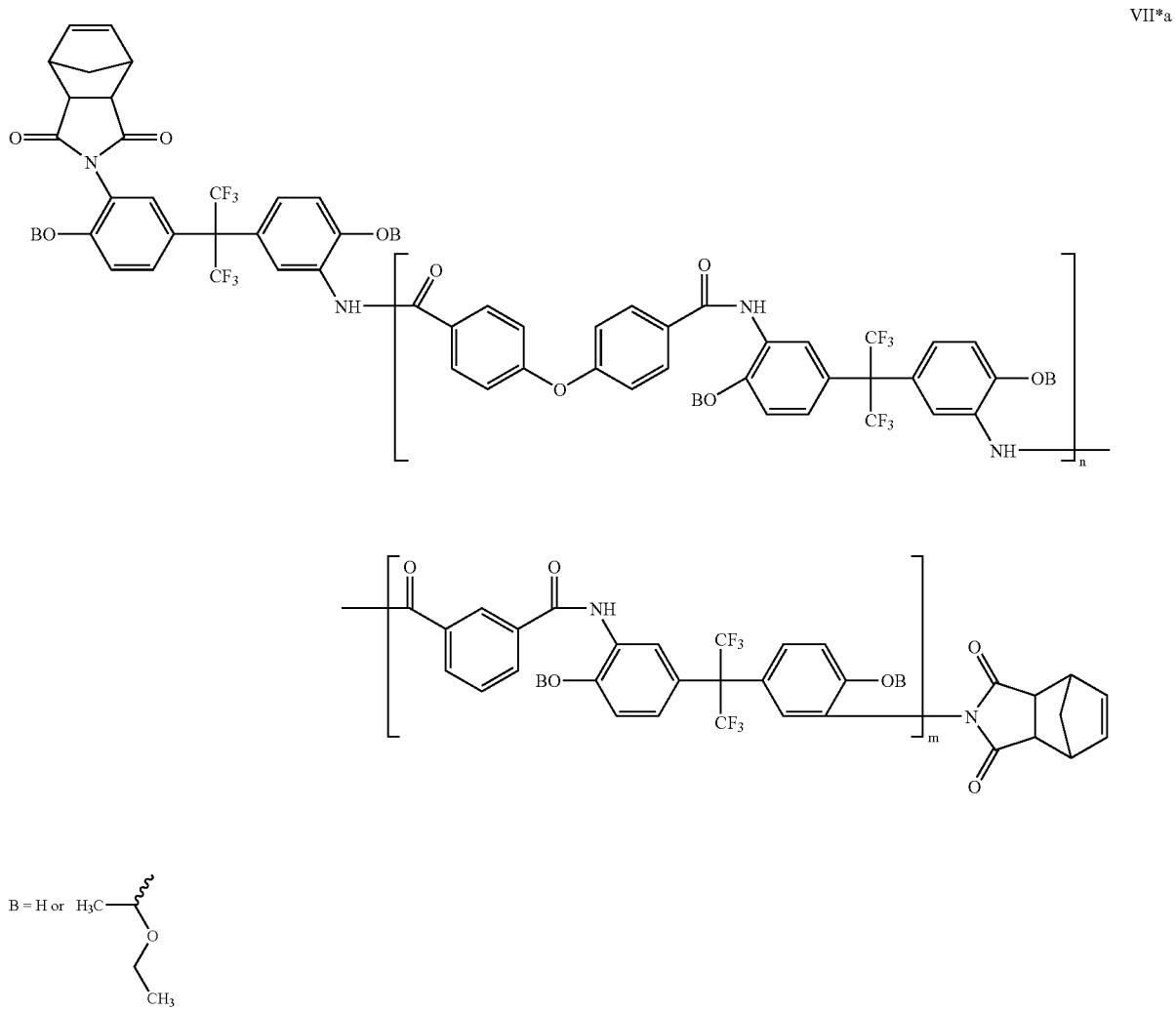

VII*a

A polymer prepared in the same way as in Synthesis Example 9 (100 g) was dissolved in 1000 g of diglyme. Residual water was removed as an azeotrope with diglyme using a rotary evaporator at 65° C. (10-12 torr). About 500 g of solvent was removed during the azeotrope distillation. The reaction solution was placed under a $N_2$ blanket and the reaction flask was equipped with a magnetic stirrer. Ethyl vinyl ether (9 ml) was added via syringe, followed by 6.5 ml of 1.5 wt % solution of p-toluene sulfonic acid in PGMEA. The reaction mixture was stirred for 4 hrs at 25° C. and triethylamine (1.5 ml) was added followed by ethyl acetate (500 ml). 250 ml of deionized water was added and the mixture was stirred for about 30 min. Then the stirring was stopped and organic and water layers were allowed to separate. The water layer was discarded. The procedure was repeated 3 more times. Then, GBL (500 ml) was added and lower boiling point solvents were removed using a rotary evaporator at 60° C. (10-12 torr). The polymer was precipitated in 5 liters of deionized water. The product was collected by filtration and was dried in a vacuum oven at 45° C. overnight.

Yield: 90 g. $^1$H NMR showed that ~17 mole % of the OH groups in the PBO precursor were blocked with ethyl vinyl ether.

SYNTHESIS EXAMPLE 11

Synthesis of Polybenzoxazole Precursor Polymer of Structure Type I with Alternate Monomer Ratio (Ic)

Polymer Ic was synthesized following the procedure in Synthesis Example 1 except that the ratio of 1,4-oxydibenzoyl chloride to isophthaloyl chloride was to changed from 1/1 to 4/1.

The yield was quantitative and the inherent viscosity of the polymer was 0.185 dl/g measured in NMP at a concentration of 0.5 g/dl at 25° C.

SYNTHESIS EXAMPLE 12
Synthesis of Polybenzoxazole Precursor Polymer of Structure Type II (IIc)
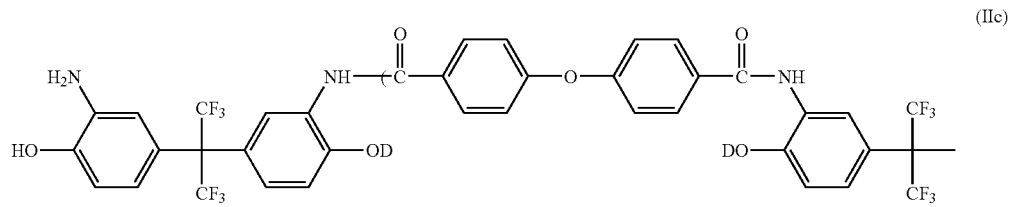
(IIc)
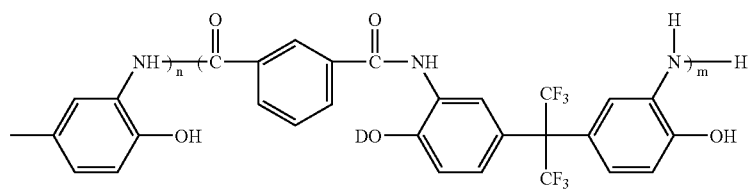
Polymer IIc was synthesized according to the procedure in Synthesis Example 6 except that polymer Ic from Synthesis Example 11 was employed and the mole ratio of 5-naphthoquinone diazide sulfonyl chloride to OH group was changed from 1.5% to 1%.
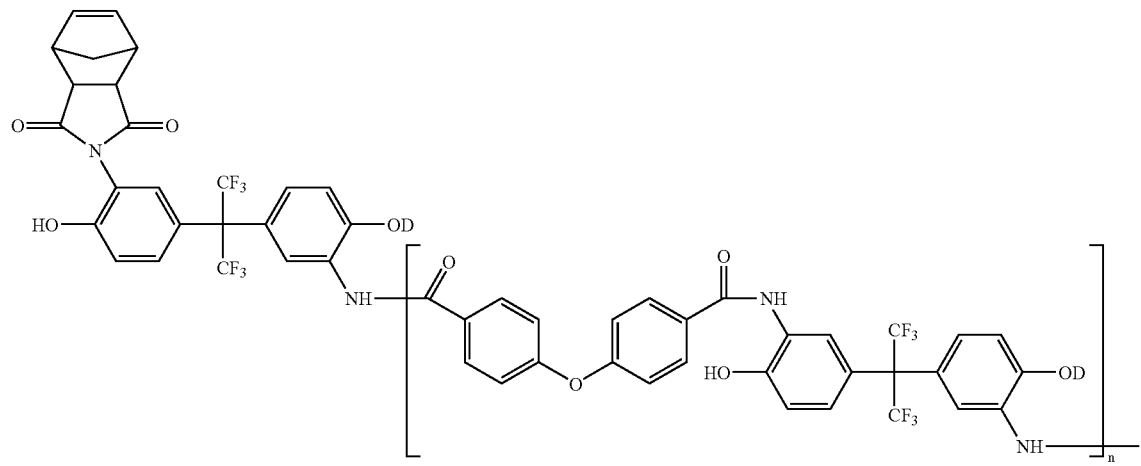
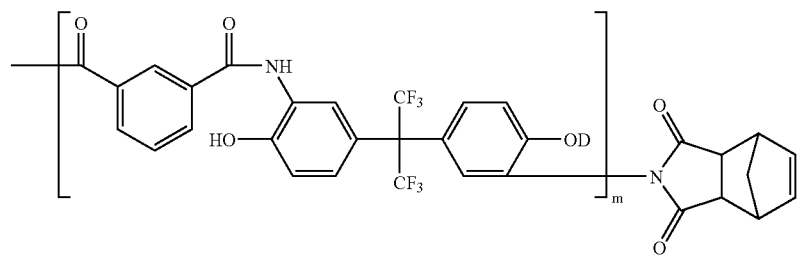

The yield was quantitative and the inherent viscosity (iv) of the polymer was 0.180 dl/g measured in NMP at a concentration of 0.5 g/dl at 25° C.

SYNTHESIS EXAMPLE 13

Synthesis of Polybenzoxazole Precursor Polymer of Structure Type IV* (IV*c) with Imide Endcap (IV*c)

A PBO precursor polymer prepared according to the procedure in Synthesis Example 12 (200 g) was dissolved in a mixture of 600 g of diglyme and 300 g of propylene glycol methyl ether acetate (PGMEA). Residual water was removed as an azeotrope with PGMEA and diglyme using a rotary evaporator at 65° C. (10-12 torr). About 550 g of solvents was removed during the azeotropic distillation. The reaction solution was placed under a $N_2$ blanket and the reaction flask was equipped with a magnetic stirrer. 7 g of nadic anhydride was added followed by 10 g of pyridine. The reaction was stirred overnight at 50° C. Then the reaction mixture was diluted with 500 g of tetrahydrofuran (THF) and precipitated into 8 liters of a 50/50 methanol/water mixture. The polymer was collected by filtration and vacuum dried at 40° C.

The yield was almost quantitative and the inherent viscosity (iv) of the polymer was 0.181 dl/g measured in NMP at a concentration of 0.5 g/dl at 25° C.

SYNTHESIS EXAMPLE 14

Preparation of PBO Precursor Polymer of Structure Type VII Endcapped with p-Toluene Sulfonyl and Blocked with Ethyl Vinyl Ether (VIIa-2)

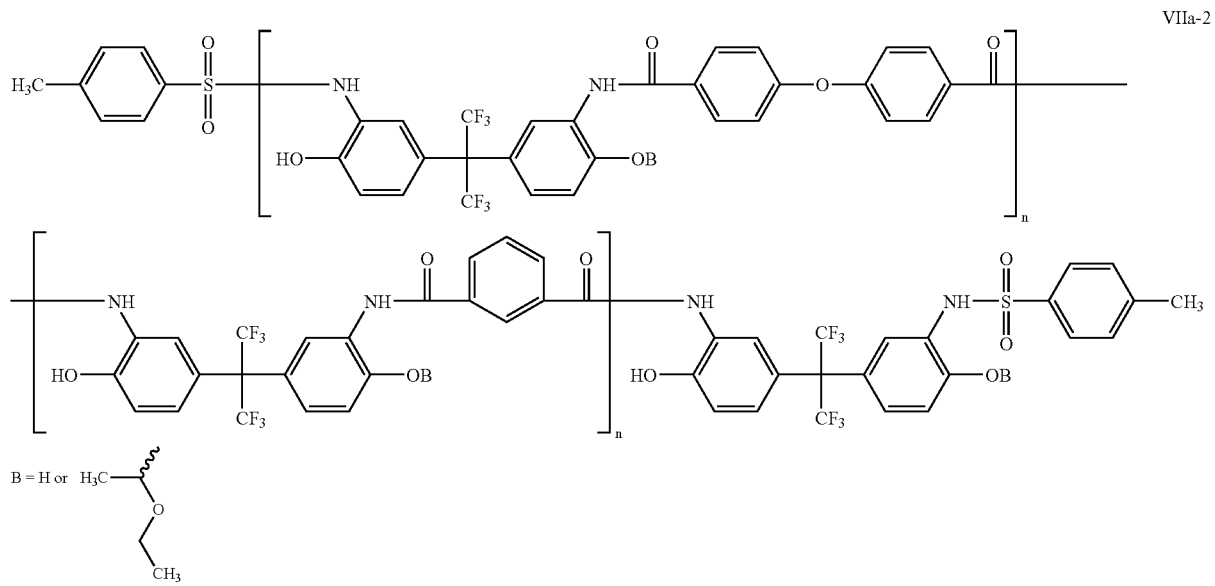

A polymer prepared with the procedure from Synthesis Example 2 (30 g) was dissolved in 150 g of diglyme. Residual water was removed as an azeotrope with diglyme using vacuum distillation at 65° C. (10-12 torr). About 50 g of solvents was removed during the azeotrope distillation. Water content in reaction mixture ranged from 60-150 ppm. The reaction solution was placed under a $N_2$ blanket and the reaction flask was equipped with a magnetic stirrer and cooled down to 25° C. Ethyl vinyl ether (15 ml) was added via syringe, followed by 1 ml of a 4 wt % solution of p-toluene sulfonic acid in PGMEA. The reaction mixture was stirred for 2 hours at 25° C. and triethyl amine (1 ml) was added.

The reaction mixture was precipitated into 2 liters of a water/methanol mixture (50/50) mixture. The polymer was separated by filtration, air dried for 2 hours and dissolved in 200 ml of THF. The polymer was precipitated two more times into 2 liters of a water/methanol mixture (50/50), filtered and air-dried. Then the polymer was vacuum-dried at 45° C. overnight.

$^1$H NMR showed that about 93-97 mole % of OH groups in the PBO precursor polymer was blocked with ethyl vinyl ether. This was concluded based on the integration of the acetal peak at 5.6 ppm and the phenol peak at 10.4 ppm.

SYNTHESIS EXAMPLE 15

Preparation of PBO Precursor of Structure Type VII with Dimethoxybenzoyl Endcap, Blocked with Ethyl Vinyl Ether (VIIa-3)

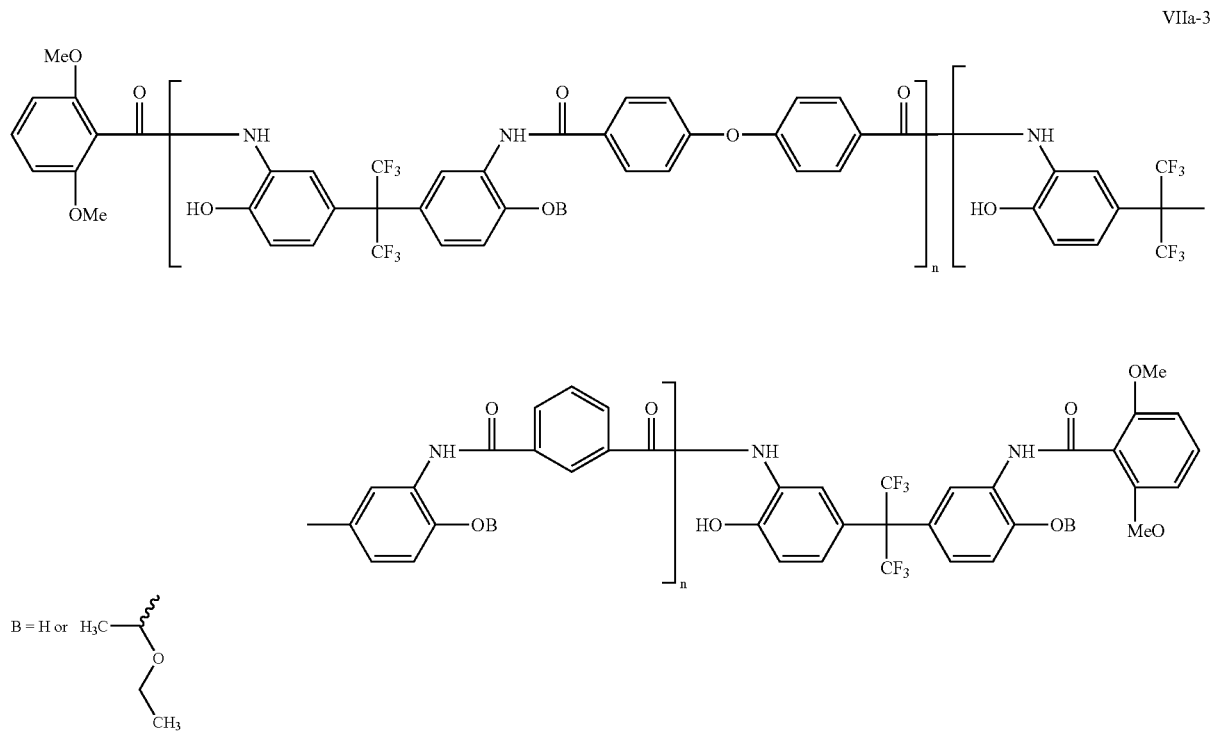

Synthesis of this polymer was similar to the polymer in Synthesis Example 14, except a polymer prepared by the method of Synthesis Example 5 was used as starting material.

SYNTHESIS EXAMPLE 16

Preparation of PBO Precursor of Structure Type VII with Acetyl Endcap, Blocked with Ethyl Vinyl Ether (VIIa-1)

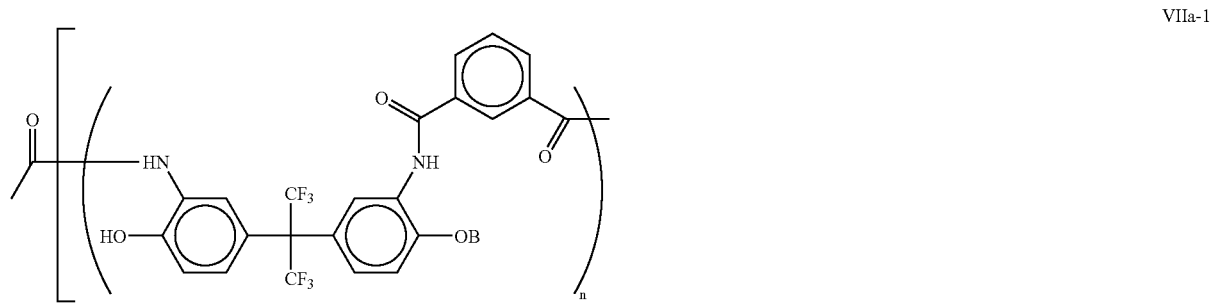

-continued

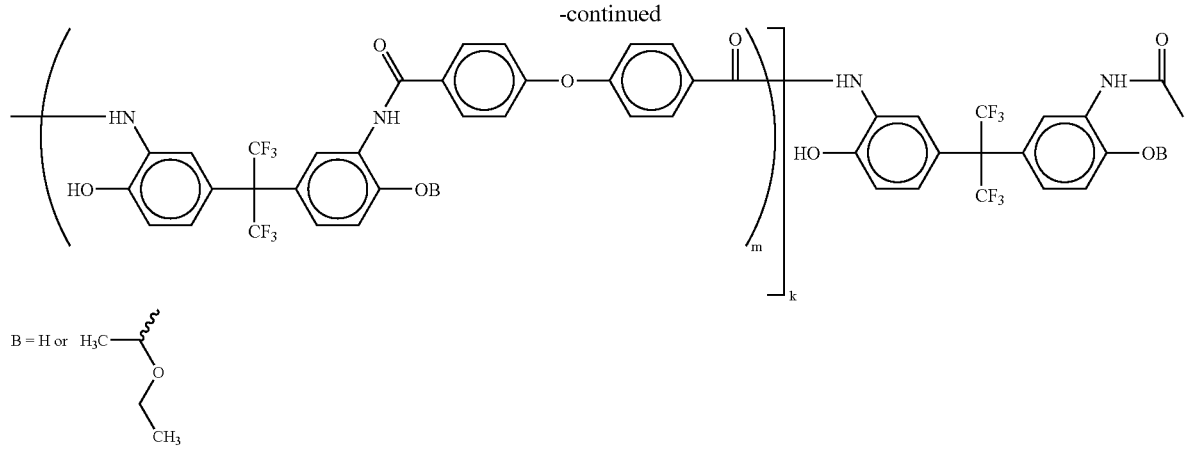

Synthesis of this polymer is similar to polymer in Synthesis Example 10, except a polymer prepared by the method of Synthesis Example 3 is used as starting material.

SYNTHESIS EXAMPLE 17

Preparation of PBO Precursor Structure Type VII Blocked with t-Butyl Vinyl Ether (VIIa-1-BVE)

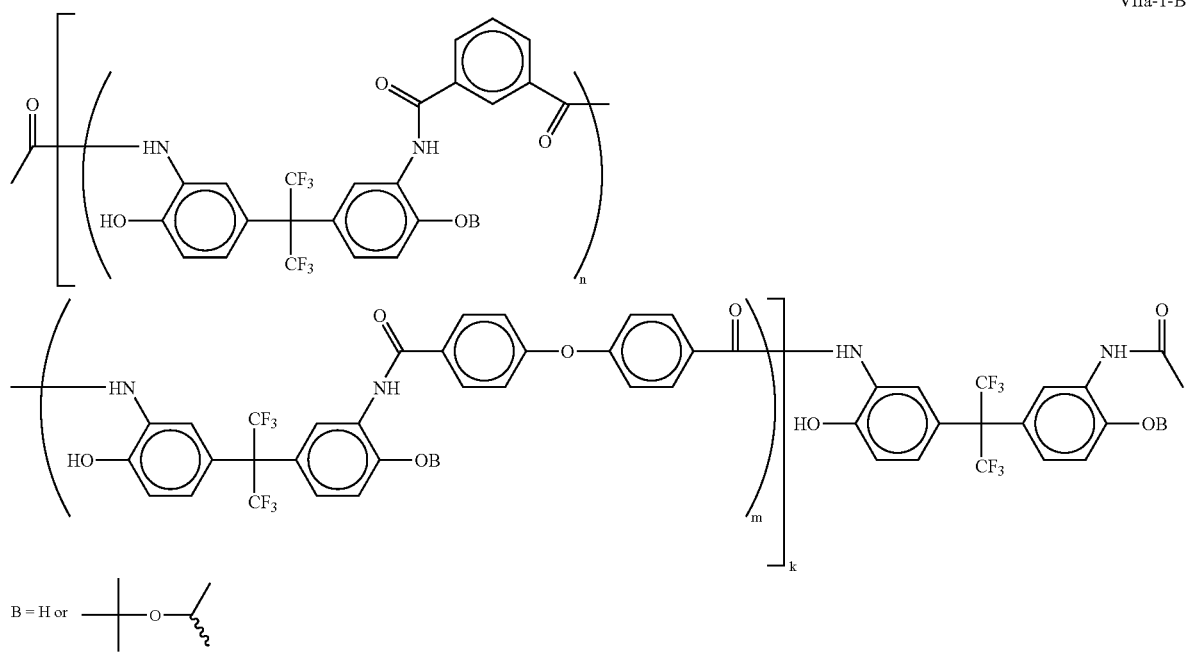

The polymer (8.6 g) prepared by the procedure described in Synthesis Example 3 was dissolved in 108 g of diglyme. Residual water was removed as an azeotrope with diglyme using rotary evaporator at 65° C. (10-12 torr). About 40 g of solvent was removed during the azeotrope distillation. The reaction solution was placed under a $N_2$ blanket and the reaction flask was equipped with a magnetic stirrer. tert-Butyl vinyl ether (2.5 g) was added via syringe, followed by 1 ml of 1 wt % solution of p-toluene sulfonic acid in PGMEA. The reaction mixture was stirred for 4 hours at 25° C. and triethylamine (1.5 ml) was added. The reaction mixture was precipitated into a mixture of 2 liters of deionized water with 5 ml of triethylamine. The precipitate was collected, redissolved in 200 g of THF, and again precipitated into a mixture of 2 liters of deionized water with 5 ml of triethylamine. The product was collected by filtration and was dried in a vacuum oven at 45° C. overnight. The yield was 5.7 g.

$^1$H NMR showed that about 50 mole % of OH groups in PBO precursor were blocked with tert-Butyl vinyl ether.

SYNTHESIS EXAMPLE 18

Preparation of PBO Precursor of Structure Type VII* Blocked with t-Butoxy Carbonyl Methyl (VII*a BCM)

VII*a BCM

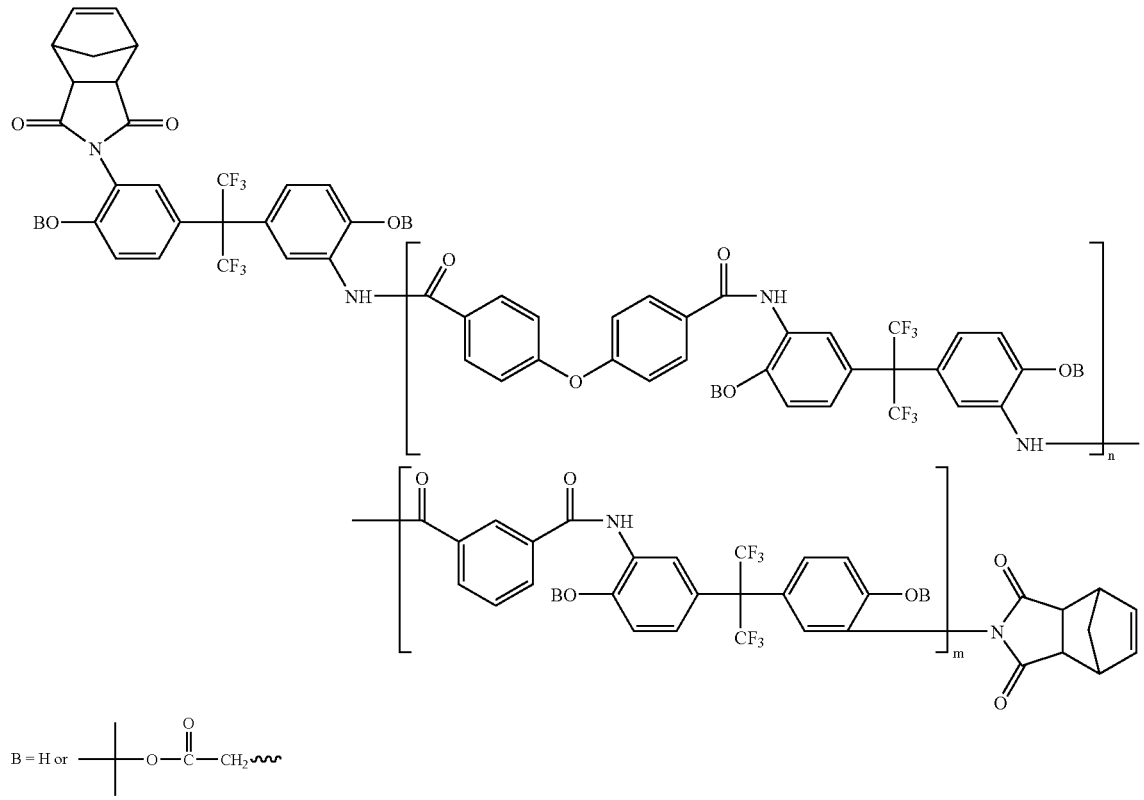

A polymer prepared in the same way as in Synthesis Example 9 (100 g) is dissolved in 1000 g of diglyme. Residual water is removed as an azeotrope with diglyme using a rotary evaporator at 65° C. (10-12 torr). About 500 g of solvent is removed during the azeotrope distillation. The reaction solution is placed under a $N_2$ blanket and the reaction flask was equipped with a magnetic stirrer. t-butyl bromoacetate, (21.2 g, 107 mmol) is added, followed by 9.3 g, 117.6 mmol of pyridine. The reaction mixture is stirred for 5 hrs at 40° C. The resulting mixture is added dropwise to 10 liters of deionized water, yielding a white precipitate. The precipitate is washed 5 times with deionized water, filtered, and dried in vacuum below 40° C. to give 101 g of t-butoxycarbonylmethyloxy-bearing polymer. The product is analyzed by proton-NMR. From a peak of phenyl at 6 to 7 ppm and peaks of t-butyl and methylene at 1 to 2 ppm, the t-butoxycarbonylmethyloxy introduction rate is calculated to be 30 mole % of available OH groups.

EXAMPLE 1

100 parts polymer obtained from Synthesis Example 6, 13.5 parts of Bisphenol AP (PAC A) obtained from Synthesis Example 8, 2.5 parts of diphenylsilane diol, 3 parts of gamma-ureidopropyltrimethoxysilane and 5 parts of tripropylene glycol were dissolved in 158 parts GBL and filtered.

The formulation was spin coated on a silicon wafer at 700 rpm for 10 seconds followed by 1200 rpm for 20 seconds. The wafer was then baked on a hotplate for 2 minutes at 90° C., followed by 8 minutes at 120° C. resulting in a film thickness of 29.95 µm. The film was then exposed utilizing a broad band lamp using a Karl Suss MA-56 with a lamp intensity of 10.2 mW/cm² at 400 nm. The exposure energy was 3000 mJ/cm². The coated and exposed film was then developed with two 25 second puddles with a 0.262N aqueous solution of tetramethylammonium hydroxide. The developed film is rinsed with deionized water and dried to provide a relief pattern. The unexposed film thickness decreased 14.06 microns to 15.89 microns (46.90% Film thickness loss).

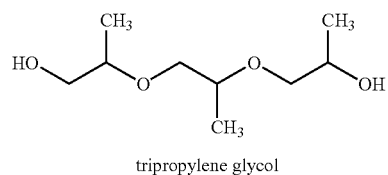

tripropylene glycol

EXAMPLE 2

100 parts polymer obtained from Synthesis Example 6, 13.5 parts of Bisphenol AP (PAC A) obtained from Synthesis Example 8, 2.5 parts of diphenylsilane diol, 3 parts of gamma-ureidopropyltrimethoxysilane and 10 parts of tripropylene glycol were dissolved in 158 parts GBL and filtered.

The formulation was spin coated on a silicon wafer at 700 rpm for 10 seconds followed by 1200 rpm for 20 seconds. The wafer was then baked on a hotplate for 2 minutes at 90° C., followed by 8 minutes at 120° C. resulting in a film thickness of 29.95 μm. The film was then exposed utilizing a broad band using a Karl Suss MA-56 with a lamp intensity of 10.2 mW/cm² at 400 nm. The exposure energy was 3000 mJ/cm². The coated and exposed film was then developed with two 25 second puddles with a 0.262N aqueous solution of tetramethylammonium hydroxide. The developed film is rinsed with deionized water and dried to provide a relief pattern. The unexposed film thickness decreased 8.31 microns to 21.64 microns (27.7% Film thickness loss).

The film was cured at 350° C. under $N_2$ for one hour in an oven. Examination by optical and scanning electron microscopy of a contact pad showed the wall slope of about 26° ($\Theta_1$). The wall profile was very rounded without any well defined angles at the top of the wall.

COMPARATIVE EXAMPLE 1

100 parts polymer obtained in Synthesis Example 6, 13.5 parts of Bisphenol AP (PAC A) obtained from Synthesis Example 8, 2.5 parts of diphenylsilane diol and 3 parts of gamma-ureidopropyltrimethoxysilane were dissolved in 158 parts GBL and filtered.

The formulation was spin coated on a silicon wafer at 700 rpm for 10 seconds followed by 1200 rpm for 20 seconds. The wafer was then baked on a hotplate for 2 minutes at 90° C., followed by 8 minutes at 120° C. resulting in a film thickness of 31.87 μm. The film was then exposed utilizing a broad band lamp using a Karl Suss MA-56 with a lamp intensity of 10.2 mW/cm² at 400 nm. The exposure energy was 3000 mJ/cm². The coated and exposed film was then developed with two 25 second puddles with a 0.262N aqueous solution of tetramethylammonium hydroxide. The developed film is rinsed with deionized water and dried to provide a relief pattern. The unexposed film thickness decreased 9.48 microns to 22.78 microns (31.5% Film thickness loss).

The film was cured at 350° C. under $N_2$ for one hour in an oven. Examination by optical and scanning electron microscopy of a contact pad showed the wall slope of about 40° ($\Theta_1$). The wall profile showed a well defined sharp corner at the top of the wall. This sharp corner in the profile causes a stress point and may result in cracking of material subsequently deposited and patterned on top of the PBO film.

Comparison of Example 2 and Comparative Example 1 showed that the formulation containing plasticizer produced features with more sloped and rounded wall profiles than the similar formulations without plasticizers.

EXAMPLE 3

100 parts polymer obtained in Synthesis Example 6, 13.5 parts of Bisphenol AP (PAC A) obtained from Synthesis Example 8, 2.5 parts of diphenylsilane diol, 3 parts of gamma-ureidopropyltrimethoxysilane and 5 parts of 2-Oxepanone, polymer with 2-ethyl-2-(hydroxymethyl)-1,3-propanediol were dissolved in 158 parts GBL and filtered.

The formulation was spin coated on a silicon wafer at 700 rpm for 10 seconds followed by 1200 rpm for 20 seconds. The wafer was then baked on a hotplate for 2 minutes at 90° C., followed by 8 minutes at 120° C. resulting in a film thickness of 32.26 μm. The film was then exposed utilizing a broad band lamp using a Karl Suss MA-56 with a lamp intensity of 10.2 mW/cm² at 400 nm. The exposure energy was 3000 mJ/cm². The coated and exposed film was then developed with two 25 second puddles with a 0.262N aqueous solution of tetramethylammonium hydroxide. The developed film is rinsed with deionized water and dried to provide a relief pattern. The unexposed film thickness decreased 9.48 microns to 22.78 microns (29.4% Film thickness loss).

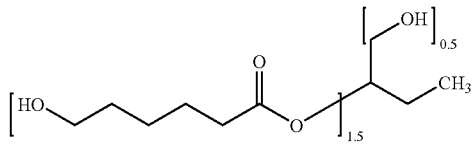

Oxepanone, polymer with 2-ethyl-2-(hydroxymethyl)-1,3-propanediol

EXAMPLE 4

100 parts polymer obtained in Synthesis Example 6, 13.5 parts of Bisphenol AP (PAC A) obtained from Synthesis Example 8, 2.5 parts of diphenylsilane diol, 3 parts of gamma-ureidopropyltrimethoxysilane and 10 parts of 2-Oxepanone, polymer with 2-ethyl-2-(hydroxymethyl)-1,3-propanediol were dissolved in 158 parts GBL and filtered.

The formulation was spin coated on a silicon wafer at 700 rpm for 10 seconds followed by 1200 rpm for 20 seconds. The wafer then baked on a hotplate for 2 minutes at 90° C., followed by 8 minutes at 120° C. resulting in a film thickness of 34.55 μm. The film was then exposed utilizing a broad band lamp using a Karl Suss MA-56 with a lamp intensity of 10.2 mW/cm² at 400 nm. The exposure energy was 3000 mJ/cm². The coated and exposed film was then developed with two 25 second puddles with a 0.262N aqueous solution of tetramethylammonium hydroxide. The developed film is rinsed with deionized water and dried to provide a relief pattern. The developed film is rinsed with deionized water and dried to provide a relief pattern. The unexposed film thickness decreased 10.87 microns to 23.68 microns (31.5% Film thickness loss).

EXAMPLE 5

A chemically amplified positive working photosensitive PBO precursor composition was prepared by mixing 100 parts of a polymer prepared by the method described in Synthesis Example 10, 3 parts of triethoxysilylpropyl ethoxycarbamate, 5 parts of (5-propylsulfonyloxyimino-5H-thiophen-2-ylidene)-2-methylphenyl-acetonitrile, 5 parts tripropylene glycol, 130 parts of PGMEA, and 20 parts GBL and filtered through a 0.2 μm Teflon filter.

A silicon wafer was then coated with the formulation and hotplate baked for 3 minutes at 120° C., resulting in a film thickness of 10 μm. The film was exposed utilizing an i-line stepper with a patterned exposure array. Segments of the film on the wafer were exposed at various levels of exposure energy using a Cannon 4000 IE i-line stepper. The wafer was post exposure baked at 130° C. for 90 seconds. The coated and exposed film was developed using a 60 second puddle with a 2.38% aqueous TMAH solution. The developed film was rinsed with deionized water and dried to provide a relief pattern. No dark or unexposed film thickness loss was observed. 3 μm features were resolved at an exposure energy of 200 mJ/cm².

The patterned film on the wafer was cured in a vacuum oven under a nitrogen purge. The initial temperature was 100° C. and was ramped to 350° C. at a rate of 5° C./minute. Upon reaching 350° C., the temperature was held at 350° C. for one hour. The cured image had a smooth transition from the imaged wall to the surface of the bulk material. The resulting wall profile was sloped with a round top.

COMPARATIVE EXAMPLE 2

A chemically amplified positive working photosensitive PBO precursor composition was prepared by mixing 100 parts of a polymer prepared by the method described in Synthesis Example 10, 16 parts of GBL, 130 parts of PGMEA, 3 parts of triethoxysilylpropyl ethoxycarbamate, and 5 parts of (5-propylsulfonyloxyimino-5H-thiophen-2-ylidene)-2-methylphenyl-acetonitrile and filtered through a 0.2 μm Teflon filter.

The filtered formulation was spin coated on a silicon wafer and baked on a hotplate for 3 minutes at 110° C. to obtain a film of about 10 μm in thickness. Segments of the film on the wafer were then exposed at various levels of exposure energy using a Cannon 4000 IE i-line stepper. The coated and exposed film was post-exposure baked at 120° C. for 180 seconds and then developed with two 60 second puddles using a 0.262N aqueous TMAH solution. The developed film was rinsed with deionized water and dried to provide a relief pattern. Dark or unexposed film thickness retention was about 100%. The exposure energy required to clear all the material from an exposed area ($E_0$) was 300 mJ/cm$^2$.

The patterned film on the wafer was cured according to the procedure described in Example 5. The resulting wall profile was relatively steep with a well defined sharp corner at the top of the wall. This sharp corner in the profile causes a stress point and may result in cracking of material subsequently deposited and patterned on top of the PBO film.

EXAMPLE 6

A chemically amplified positive working photosensitive PBO precursor composition was prepared by mixing 100 parts of a polymer prepared by the method described in Synthesis Example 10, 16 parts of GBL, 130 parts of PGMEA, 10 parts of tripropylene glycol, 3 parts of triethoxysilylpropyl ethoxycarbamate, and 5 parts of (5-propylsulfonyloxyimino-5H-thiophen-2-ylidene)-2-methylphenyl-acetonitrile and filtered though a 0.2 μm Teflon filter.

The filtered formulation was spin coated onto the silicon wafer and baked on a hotplate for 3 minutes at 110° C. to obtain a film of about 11.5 μm in thickness. Segments of the film on the wafer were then exposed at various levels of exposure energy using a Cannon 4000 IE i-line stepper. The exposed film was baked at 120° C. for 180 seconds and then developed with two 60 second puddles using a 0.262N aqueous TMAH solution. The developed film was rinsed with deionized water and dried to provide a relief pattern. Dark or unexposed film thickness retention was about 95%. The exposure energy required to clear all the material from an exposed area ($E_0$) was 325 mJ/cm$^2$.

The patterned film on the wafer was cured according to the procedure described in Example 5. The cured image had a smooth transition from the imaged wall to the surface of the bulk material. The resulting wall profile was sloped with a round top.

EXAMPLE 7

A chemically amplified positive working photosensitive PBO precursor composition was prepared by mixing 100 parts of a polymer prepared by the method described in Synthesis Example 10, 3 parts of triethoxysilylpropyl ethoxycarbamate, 5 parts of (5-propylsulfonyloxyimino-5H-thiophen-2-ylidene)-2-methylphenyl-acetonitrile, 7.5 parts of speed enhancer SE2, 10 parts tripropylene glycol, 130 parts of PGMEA, and 20 parts GBL and filtered through a 0.2 μm Teflon filter.

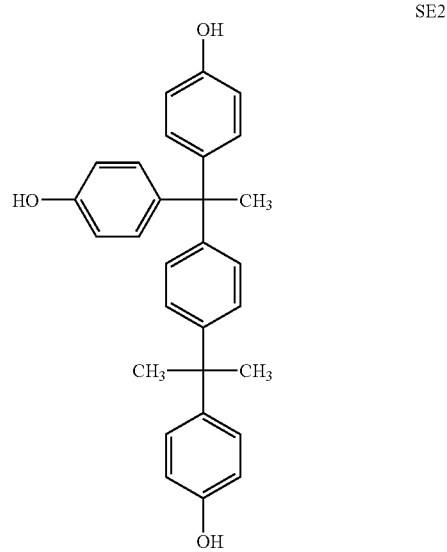

SE2

A silicon wafer was then coated with the formulation from above and hotplate baked for 3 minutes at 125° C., resulting in a film thickness of 8.95 μm. The film was exposed utilizing an i-line stepper with a patterned exposure array. Segments of the film on the wafer were exposed at various levels of exposure energy using a Cannon 4000 IE i-line stepper. The wafer was post exposure baked at 130° C. for 90 seconds. The coated and exposed film was developed using a 60 second puddle with a 2.38% aqueous TMAH solution. The developed film was rinsed with deionized water and dried to provide a relief pattern. No dark or unexposed film thickness loss was observed. The exposure energy required to clear all the material from an exposed area ($E_0$) was 75 mJ/cm$^2$.

The patterned film on the wafer was cured according to the procedure described in Example 5. The cured image had a smooth transition from the imaged wall to the surface of the bulk material. The resulting wall profile was sloped with a round top.

COMPARATIVE EXAMPLE 3

A chemically amplified positive working photosensitive PBO precursor composition was prepared by mixing 100 parts of a polymer prepared by the method described in Synthesis Example 10, 3 parts of triethoxysilylpropyl ethoxycarbamate, 5 parts of (5-propylsulfonyloxyimino-5H-thiophen-2-ylidene)-2-methylphenyl-acetonitrile, 7.5 parts of speed enhancer SE2, 130 parts of PGMEA, and 20 parts GBL and filtered through a 0.2 μm Teflon filter.

The filtered formulation was spin coated on a silicon wafer and baked on a hotplate for 3 minutes at 125° C. to obtain a film of about 8.97 μm in thickness. Segments of the film on the wafer were then exposed at various levels of exposure energy using a Cannon 4000 IE i-line stepper. The coated and exposed film was post-exposure baked at 130° C. for 90 seconds and then developed with a 60 second puddle using a 0.262N aqueous TMAH solution. The developed film was rinsed with deionized water and dried to provide a relief pattern. Dark or unexposed film thickness retention was about 100%. The exposure energy required to clear all the material from an exposed area ($E_0$) was 100 mJ/cm$^2$.

The patterned film on the wafer was cured according to the procedure described in Example 5. The resulting wall profile was relatively steep with a well defined sharp corner at the top of the wall. This sharp corner in the profile causes a stress point and may result in cracking of material subsequently deposited and patterned on top of the PBO film.

EXAMPLE 8

A chemically amplified positive working photosensitive PBO precursor composition was prepared by mixing 100 parts of a polymer prepared by the method described in Synthesis Example 10, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 8 parts Oxepanone, polymer with 2-ethyl-2-(hydroxymethyl)-1,3-propanediol, 130 parts of PGMEA, and 20 parts GBL and filtered through a 0.2 μm Teflon filter.

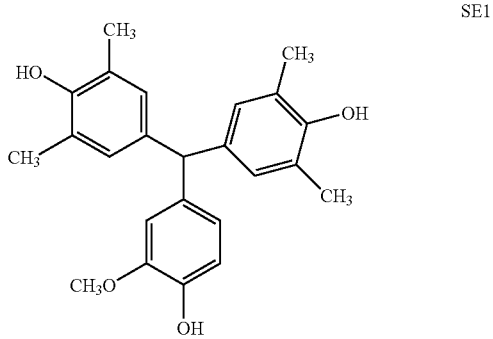

SE1

A silicon wafer was then coated with the formulation from above and hotplate baked for 3 minutes at 125° C., resulting in a film thickness of 9.03 μm. The film was exposed utilizing an i-line stepper with a patterned exposure array. Segments of the film on the wafer were exposed at various levels of exposure energy using a Cannon 4000 IE i-line stepper. The wafer was post exposure baked at 130° C. for 90 seconds. The coated and exposed film was developed using a 60 second puddle with a 2.38% aqueous TMAH solution. The developed film was rinsed with deionized water and dried to provide a relief pattern. No dark or unexposed film thickness loss was observed. The exposure energy required to clear all the material from an exposed area ($E_0$) was 125 mJ/cm$^2$.

The patterned film on the wafer was cured according to the procedure described in Example 5. The cured image had a smooth transition from the imaged wall to the surface of the bulk material. The resulting wall profile was sloped with a round top.

EXAMPLE 9

A chemically amplified positive working photosensitive PBO precursor composition was prepared by mixing 100 parts of a polymer prepared by the method described in Synthesis Example 10, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 10 parts of dibutyl maleate, 130 parts of PGMEA, and 20 parts GBL and filtered through a 0.2 μm Teflon filter.

A silicon wafer was then coated with the formulation from above and hotplate baked for 3 minutes at 125° C., resulting in a film thickness of 8.57 μm. The film was exposed utilizing an i-line stepper with a patterned exposure array. Segments of the film on the wafer were exposed at various levels of exposure energy using a Cannon 4000 IE i-line stepper. The wafer was post exposure baked at 130° C. for 90 seconds. The coated and exposed film was developed using a 60 second puddle with a 2.38% aqueous TMAH solution. The developed film was rinsed with deionized water and dried to provide a relief pattern. No dark or unexposed film thickness loss was observed. The exposure energy required to clear all the material from an exposed area ($E_0$) was 150 mJ/cm$^2$.

The patterned film on the wafer was cured according to the procedure described in Example 5. The cured image had a smooth transition from the imaged wall to the surface of the bulk material. The resulting wall profile was sloped with a round top.

EXAMPLE 10

A chemically amplified positive working photosensitive PBO precursor composition was prepared by mixing 100 parts of a polymer prepared by the method described in Synthesis Example 10, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 15 parts of di(propylene)glycol, 130 parts of PGMEA, and 20 parts GBL and filtered through a 0.2 μm Teflon filter.

A silicon wafer was then coated with the formulation from above and hotplate baked for 3 minutes at 125° C., resulting in a film thickness of 8.52 μm. The film was exposed utilizing an i-line stepper with a patterned exposure array. Segments of the film on the wafer were exposed at various levels of exposure energy using a Cannon 4000 IE i-line stepper. The wafer was post exposure baked at 130° C. for 90 seconds. The coated and exposed film was developed using a 60 second puddle with a 2.38% aqueous TMAH solution. The developed film was rinsed with deionized water and dried to provide a relief pattern. No dark or unexposed film thickness loss was observed. The exposure energy required to clear all the material from an exposed area ($E_0$) was 75 mJ/cm$^2$.

The patterned film on the wafer was cured according to the procedure described in Example 5. The cured image had a smooth transition from the imaged wall to the surface of the bulk material. The resulting wall profile was sloped with a round top.

COMPARATIVE EXAMPLE 4

A chemically amplified positive working photosensitive PBO precursor composition was prepared by mixing 100 parts of a polymer prepared by the method described in Synthesis Example 10, 2 parts of triethoxysilylpropyl ethoxycarbamate, 4 parts of (5-propylsulfonyloxyimino-5H-thiophen- 2-ylidene)-2-methylphenyl-acetonitrile, 3.75 parts of Speed Enhancer SE1, 130 parts of PGMEA, and 20 parts GBL and filtered through a 0.2 μm Teflon filter.

The filtered formulation was spin coated on a silicon wafer and baked on a hotplate for 3 minutes at 125° C. to obtain a film of about 8.51 μm in thickness. Segments of the film on the wafer were then exposed at various levels of exposure energy using a Cannon 4000 IE i-line stepper. The coated and exposed film was post-exposure baked at 130° C. for 90 seconds and then developed using a 60 second puddle with a 0.262N aqueous TMAH solution. The developed film was rinsed with deionized water and dried to provide a relief pattern. Dark or unexposed film thickness retention was about 100%. The exposure energy required to clear all the material from an exposed area ($E_0$) was 100 mJ/cm$^2$.

The patterned film on the wafer was cured according to the procedure described in Example 5. The resulting wall profile was relatively steep with a well defined sharp corner at the top of the wall. This sharp corner in the profile causes a stress point and may result in cracking of material subsequently deposited and patterned on top of the PBO film.

COMPARATIVE EXAMPLE 5

A chemically amplified positive working photosensitive PBO precursor composition was prepared by mixing 100 parts of a polymer prepared by the method described in Synthesis Example 10, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 12 parts of propylene carbonate, 130 parts of PGMEA, and 20 parts GBL and filtered through a 0.2 μm Teflon filter.

The filtered formulation was spin coated on a silicon wafer and baked on a hotplate for 3 minutes at 125° C. to obtain a film of about 9.05 μm in thickness. Segments of the film on the wafer were then exposed at various levels of exposure energy using a Cannon 4000 IE i-line stepper. The coated and exposed film was post-exposure baked at 130° C. for 90 seconds and then developed using a 60 second puddle with a 0.262N aqueous TMAH solution. The developed film was rinsed with deionized water and dried to provide a relief pattern. Dark or unexposed film thickness retention was about 100%. The exposure energy required to clear all the material from an exposed area ($E_0$) was 125 mJ/cm$^2$.

The patterned film on the wafer was cured according to the procedure described in Example 5. The resulting wall profile was relatively steep with a well defined sharp corner at the top of the wall. This sharp corner in the profile causes a stress point and may result in cracking of material subsequently deposited and patterned on top of the PBO film. Although propylene carbonate is a high boiling solvent, it failed to properly plasticize the PBO polymer.

EXAMPLE 11

A diazoquinone containing positive working photosensitive PBO precursor composition is prepared by mixing 100 parts of a polymer prepared by the method described in Synthesis Example 13, 3 parts of gamma-mercaptopropyltrimethoxy silane, 15 parts of PAC B (see below), 10 parts of tripropylene glycol and 173 parts GBL and filtered through a 0.2 μm Teflon filter.

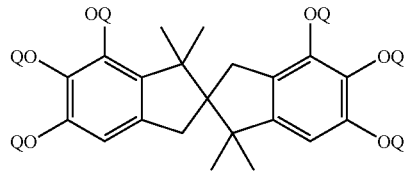

PAC-B

Q = H, or D; D = 2,1-naphthoquinonediazide-5-sulfonyl; Ratio of H:D = 1:5

The filtered formulation is spin coated on a silicon wafer and baked on a hotplate for 5 minutes at 120° C. to obtain a film of about 11.6 μm in thickness. Segments of the film on the wafer are then exposed at various levels of exposure energy using a Cannon 4000 IE i-line stepper. The coated and exposed film is developed with two 30 second puddles using a 0.262N aqueous TMAH solution. The developed film is rinsed with deionized water and dried to provide a relief pattern. Dark or unexposed film thickness retention was about 55%. The exposure energy required to clear all the material from an exposed area ($E_0$) was 440 mJ/cm$^2$.

The patterned film on the wafer is cured according to the procedure described in Example 5. The cured image has a smooth transition from the imaged wall to the surface of the bulk material. The resulting wall profile is sloped with a round top.

COMPARATIVE EXAMPLE 6

A diazoquinone containing positive working photosensitive PBO precursor composition was prepared by mixing 100 parts of a polymer prepared by the method described in Synthesis Example 13, 3 parts of gamma-mercaptopropyltrimethoxy silane, 15 parts of PAC B (see Example 11) and 173 parts GBL and filtered through a 0.2 μm Teflon filter.

The filtered formulation was spin coated on a silicon wafer and baked on a hotplate for 5 minutes at 120° C. to obtain a film of about 11.04 μm in thickness. Segments of the film on the wafer were then exposed at various levels of exposure energy using a Cannon 4000 IE i-line stepper. The coated and exposed film was developed with two 30 second puddles using a 0.262N aqueous TMAH solution. The developed film was rinsed with deionized water and dried to provide a relief pattern. Dark or unexposed film thickness retention was about 55%. The exposure energy required to clear all the material from an exposed area ($E_0$) was 425 mJ/cm$^2$.

The patterned film on the wafer was cured according to the procedure described in Example 5. The resulting wall profile was relatively steep with a well defined sharp corner at the top of the wall. This sharp corner in the profile causes a stress point and may result in cracking of material subsequently deposited and patterned on top of the PBO film.

COMPARATIVE EXAMPLE 7

A diazoquinone containing positive working photosensitive PBO precursor composition was prepared by mixing 100 parts of a polymer prepared by the method described in Synthesis Example 13, 3 parts of gamma-mercaptopropyltrimethoxy silane, 15 parts of PAC B (see Example 11), 10 parts of tri(ethylene glycol)methyl vinyl ether and 173 parts GBL and filtered through a 0.2 μm Teflon filter.

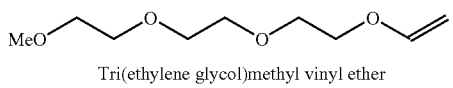

Tri(ethylene glycol)methyl vinyl ether

The filtered formulation was spin coated on a silicon wafer and baked on a hotplate for 5 minutes at 120° C. to obtain a film of about 11.63 μm in thickness. Segments of the film on the wafer were then exposed at various levels of exposure energy using a Cannon 4000 IE i-line stepper. The coated and exposed film was developed with two 30 second puddles using a 0.262N aqueous TMAH solution. The developed film was rinsed with deionized water and dried to provide a relief pattern. Dark or unexposed film thickness retention was about 82%. The exposure energy required to clear all the material from an exposed area ($E_0$) was larger than 800 mJ/cm$^2$.

The patterned film on the wafer was cured according to the procedure described in Example 5. Even though the images in this example were underexposed, these partial images did not round when cured. Instead of plasticizing the PBO polymer, tri(ethylene glycol)methyl vinyl ether acted more like a dissolution inhibitor.

EXAMPLE 12

A diazoquinone containing positive working photosensitive PBO precursor composition is prepared by mixing 100 parts of a polymer prepared by the method described in Synthesis Example 3, 2.5 parts of N-phenyl-gamma-aminopropyltrimethoxysilane, 22 parts of PAC F (see below), 8 parts of tripropylene glycol mono methyl ether, 135 parts GBL, 25 parts PGMEA and 15 parts ethyl lactate and filtered through a 0.2 μm Teflon filter.

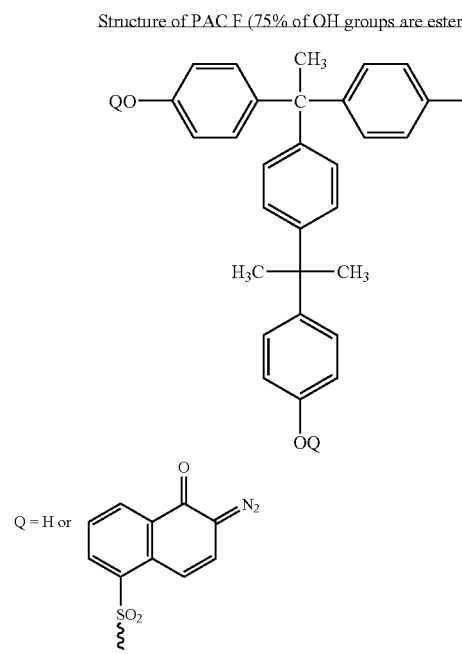

Structure of PAC F (75% of OH groups are esterified)

The filtered formulation is spin coated on a silicon wafer and baked on a hotplate for 15 minutes at 100° C. to obtain a film of about 12 μm in thickness. Segments of the film on the wafer are then exposed at various levels of exposure energy using a Cannon 4000 IE i-line stepper. The coated, exposed film is then baked at 110° C. for 2 minutes, developed for 80 seconds under continuous spray of a 2.38% aqueous TMAH solution. The developed film is rinsed with deionized water and dried to provide a relief pattern.

The patterned film on the wafer is cured according to the procedure described in Example 5. The cured image has a smooth transition from the imaged wall to the surface of the bulk material. The resulting wall profile is sloped with a round top.

COMPARATIVE EXAMPLE 8

A diazoquinone containing positive working photosensitive PBO precursor composition is prepared by mixing 100 parts of a polymer prepared by the method described in Synthesis Example 3, 2.5 parts of N-phenyl-gamma-aminopropyltrimethoxysilane, 22 parts of PAC F, 135 parts GBL, 25 parts PGMEA and 15 parts ethyl lactate and filtered through a 0.2 μm Teflon filter.

The filtered formulation is spin coated on a silicon wafer and baked on a hotplate for 15 minutes at 100° C. to obtain a film of about 12 μm in thickness. Segments of the film on the wafer are then exposed at various levels of exposure energy using a Cannon 4000 IE i-line stepper. The coated, exposed film is then baked at 110° C. for 2 minutes, developed for 80 seconds under continuous spray of a 2.38% aqueous TMAH solution. The developed film is rinsed with deionized water and dried to provide a relief pattern.

The patterned film on the wafer is cured according to the procedure described in Example 5. The resulting wall profile is relatively steep with a well defined sharp corner at the top of the wall. This sharp corner in the profile causes a stress point and may result in cracking of material subsequently deposited and patterned on top of the PBO film.

EXAMPLE 13

A diazoquinone containing positive working photosensitive PBO precursor composition is prepared by mixing 100 parts of a polymer prepared by the method described in Synthesis Example 4, 2 parts of N-(3-triethoxysilylpropyl)maleic monoamide, 12 parts of PAC J (see below), 12 parts of dimethyl succinate, 165 parts GBL and 10 parts ethyl lactate and filtered through a 0.2 μm Teflon filter.

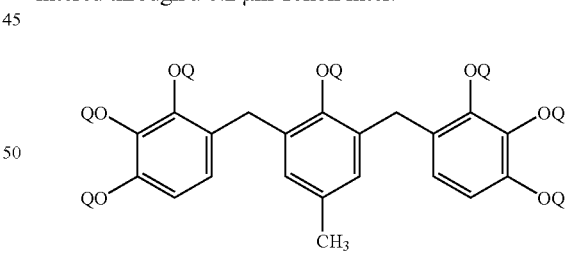

PAC J (50% of OH groups are esterified)

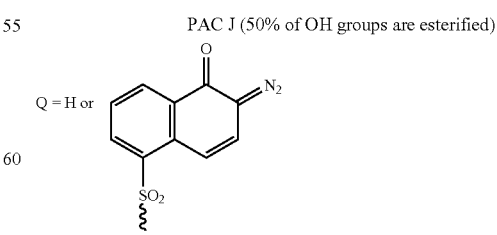

The filtered formulation is spin coated on a silicon wafer and baked on a hotplate for 5 minutes at 120° C. to obtain a film of about 11.5 μm in thickness. Segments of the film on the wafer are then exposed at various levels of exposure energy using a Cannon 4000 IE i-line stepper. The coated and exposed film is developed with two 40 second puddles using a 0.262N aqueous TMAH solution. The developed film is rinsed with deionized water and dried to provide a relief pattern.

The patterned film on the wafer is cured in a vacuum oven under a nitrogen purge. The initial temperature is 100° C. and is ramped to 300° C. at a rate of 5° C./minute. Upon reaching 300° C., the temperature is held at 300° C. for 90 minutes. The cured image has a smooth transition from the imaged wall to the surface of the bulk material. The resulting wall profile is sloped with a round top.

COMPARATIVE EXAMPLE 9

A diazoquinone containing positive working photosensitive PBO precursor composition is prepared by mixing 100 parts of a polymer prepared by the method described in Synthesis Example 4, 2 parts of N-(3-triethoxysilylpropyl)maleic monoamide, 12 parts of PAC J, 165 parts GBL and 10 parts ethyl lactate and filtered through a 0.2 µm Teflon filter.

The filtered formulation is spin coated on a silicon wafer and baked on a hotplate for 5 minutes at 120° C. to obtain a film of about 11.5 µm in thickness. Segments of the film on the wafer are then exposed at various levels of exposure energy using a Cannon 4000 IE i-line stepper. The coated and exposed film is developed with two 40 second puddles using a 0.262N aqueous TMAH solution. The developed film is rinsed with deionized water and dried to provide a relief pattern.

The patterned film on the wafer is cured in a vacuum oven under a nitrogen purge. The initial temperature is 100° C. and is ramped to 300° C. at a rate of 5° C./minute. Upon reaching 300° C., the temperature is held at 300° C. for 90 minutes. The resulting wall profile is relatively steep with a well defined sharp corner at the top of the wall. This sharp corner in the profile causes a stress point and may result in cracking of material subsequently deposited and patterned on top of the PBO film.

EXAMPLE 14

A diazoquinone containing positive working photosensitive PBO precursor composition is prepared by mixing 100 parts of a polymer prepared by the method described in Synthesis Example 7, 4 parts of gamma-glycidoxypropyltrimethoxysilane, 16 parts of Bisphenol AP (PAC A) obtained from Synthesis Example 8, 12 parts of tetraethylene glycol and 170 parts NMP and filtered through a 0.2 µm Teflon filter.

The filtered formulation is spin coated on a silicon wafer and baked on a hotplate for 5 minutes at 120° C. to obtain a film of about 11 µm in thickness. Segments of the film on the wafer are then exposed at various levels of exposure energy using a Cannon 4000 IE i-line stepper. The coated and exposed film is then developed by placing the wafer into a wafer boat and immersing it into a 0.262N aqueous TMAH solution for 60 seconds. The wafer boat is then removed from the TMAH solution and immersed in deionized wafer for an additional 20 second. The boat is then placed in a spin rinse drier and again rinsed with deionized water and dried.

The patterned film on the wafer is cured according to the procedure described in Example 5. The cured image has a smooth transition from the imaged wall to the surface of the bulk material. The resulting wall profile is sloped with a round top.

COMPARATIVE EXAMPLE 10

A diazoquinone containing positive working photosensitive PBO precursor composition is prepared by mixing 100 parts of a polymer prepared by the method described in Synthesis Example 7, 4 parts of gamma-glycidoxypropyltrimethoxysilane, 16 parts of Bisphenol AP (PAC A) obtained from Synthesis Example 8, and 170 parts NMP and filtered through a 0.2 µm Teflon filter.

The filtered formulation is spin coated on a silicon wafer and baked on a hotplate for 5 minutes at 120° C. to obtain a film of about 11 µm in thickness. Segments of the film on the wafer are then exposed at various levels of exposure energy using a Cannon 4000 IE i-line stepper. The coated and exposed film is then developed by placing the wafer into a wafer boat and immersing it into a 0.262N aqueous TMAH solution for 60 seconds. The wafer boat is then removed from the TMAH solution and immersed in deionized wafer for an additional 20 second. The boat is then placed in a spin rinse drier and again rinsed with deionized water and dried.

The patterned film on the wafer is cured according to the procedure described in Example 5. The resulting wall profile is relatively steep with a well defined sharp corner at the top of the wall. This sharp corner in the profile causes a stress point and may result in cracking of material subsequently deposited and patterned on top of the PBO film.

EXAMPLE 15

A diazoquinone containing positive working photosensitive PBO precursor composition is prepared by mixing 100 parts of a polymer prepared by the method described in Synthesis Example 9, 2.5 parts of triethoxysilylpropyl ethoxycarbamate, 24 parts of Bisphenol AP (PAC A) obtained from Synthesis Example 8, 8 parts of dibutyl maleate, 80 parts NMP and 95 parts GBL and filtered through a 0.2 µm Teflon filter.

The filtered formulation is spin coated on a silicon wafer and baked on a hotplate for 4 minutes at 125° C. to obtain a film of about 10 µm in thickness. Segments of the film on the wafer are then exposed at various levels of exposure energy using a Cannon 4000 IE i-line stepper. The coated and exposed film is developed with two 25 second puddles using a 0.262N aqueous TMAH solution. The developed film is rinsed with deionized water and dried to provide a relief pattern.

The patterned film on the wafer is cured in a vacuum oven under a nitrogen purge. The initial temperature is 100° C. and is ramped to 380° C. at a rate of 5° C./minute. Upon reaching 380° C., the temperature is held at 380° C. for 50 minutes. The cured image has a smooth transition from the imaged wall to the surface of the bulk material. The resulting wall profile is sloped with a round top.

COMPARATIVE EXAMPLE 11

A diazoquinone containing positive working photosensitive PBO precursor composition is prepared by mixing 100 parts of a polymer prepared by the method described in Synthesis Example 9, 2.5 parts of triethoxysilylpropyl ethoxycarbamate, 24 parts of Bisphenol AP (PAC A) obtained from Synthesis Example 8, 80 parts NMP and 95 parts GBL and filtered through a 0.2 µm Teflon filter.

The filtered formulation is spin coated on a silicon wafer and baked on a hotplate for 4 minutes at 125° C. to obtain a film of about 10 µm in thickness. Segments of the film on the wafer are then exposed at various levels of exposure energy using a Cannon 4000 IE i-line stepper. The coated and exposed film is developed with two 25 second puddles using a 0.262N aqueous TMAH solution. The developed film is rinsed with deionized water and dried to provide a relief pattern.

The patterned film on the wafer was cured in a vacuum oven under a nitrogen purge. The initial temperature was 100° C. and was ramped to 380° C. at a rate of 5° C./minute. Upon reaching 380° C., the temperature was held at 380° C. for 50 minutes. The resulting wall profile is relatively steep with a well defined sharp corner at the top of the wall. This sharp corner in the profile causes a stress point and may result in cracking of material subsequently deposited and patterned on top of the PBO film.

EXAMPLE 16

A diazoquinone containing positive working photosensitive PBO precursor composition is prepared by mixing 100 parts of a polymer prepared by the method described in Synthesis Example 12, 3 parts of gamma-mercaptopropyltrimethoxy silane, 16 parts of PAC B, 9 parts of 2-Oxepanone, polymer with 2-ethyl-2-(hydroxymethyl)-1,3-propanediol, 150 parts GBL, 20 parts PGMEA and 5 parts ethyl lactate and filtered through a 0.2 μm Teflon filter.

The filtered formulation is spin coated on a silicon wafer and baked on a hotplate for 10 minutes at 110° C. to obtain a film of about 11.5 μm in thickness. Segments of the film on the wafer are then exposed at various levels of exposure energy using a Cannon 4000 IE i-line stepper. The coated and exposed film is developed with a 60 second puddle using a 0.262N aqueous TMAH solution. The developed film is rinsed with deionized water and dried to provide a relief pattern.

The patterned film on the wafer is cured according to the procedure described in Example 5. The cured image has a smooth transition from the imaged wall to the surface of the bulk material. The resulting wall profile is sloped with a round top.

COMPARATIVE EXAMPLE 12

A diazoquinone containing positive working photosensitive PBO precursor composition is prepared by mixing 100 parts of a polymer prepared by the method described in Synthesis Example 12, 3 parts of gamma-mercaptopropyltrimethoxy silane, 16 parts of PAC B, 150 parts GBL, 20 parts PGMEA and 5 parts ethyl lactate and filtered through a 0.2 μm Teflon filter.

The filtered formulation is spin coated on a silicon wafer and baked on a hotplate for 10 minutes at 110° C. to obtain a film of about 11.5 μm in thickness. Segments of the film on the wafer are then exposed at various levels of exposure energy using a Cannon 4000 IE i-line stepper. The coated and exposed film is developed with a 60 second puddle using a 0.262N aqueous TMAH solution. The developed film is rinsed with deionized water and dried to provide a relief pattern.

The patterned film on the wafer is cured according to the procedure described in Example 5. The resulting wall profile is relatively steep with a well defined sharp corner at the top of the wall. This sharp corner in the profile causes a stress point and may result in cracking of material subsequently deposited and patterned on top of the PBO film.

EXAMPLE 17

A diazoquinone containing positive working photosensitive PBO precursor composition is prepared by mixing 100 parts of a polymer prepared by the method described in Synthesis Example 13, 15 parts of PAC B, 10 parts of tripropylene glycol and 173 parts GBL and filtered through a 0.2 μm Teflon filter.

A silicon wafer is first pretreated with an adhesion promoter solution containing 0.5 wt % 3-methacryloxypropyltrimethoxysilane. The silicon wafer is treated for about 80 seconds with 20 ml of the solution applied in a stream while spinning at 700 rpm on a chuck in a lithographic coating tool bowl. The silicon wafer is then dried by accelerating the spin speed to 2800 rpm for 40 seconds.

The filtered formulation is spin coated on the pretreated silicon wafer and baked on a hotplate for 5 minutes at 120° C. to obtain a film of about 11.7 μm in thickness. Segments of the film on the wafer are then exposed at various levels of exposure energy using a Cannon 4000 IE i-line stepper. The coated and exposed film is developed with two 25 second puddles using a 0.262N aqueous TMAH solution. The developed film is rinsed with deionized water and dried to provide a relief pattern. Dark or unexposed film thickness retention is about 55%. The exposure energy required to clear all the material from an exposed area ($E_0$) is 440 mJ/cm$^2$.

The patterned film on the wafer is cured according to the procedure described in Example 5. The cured image has a smooth transition from the imaged wall to the surface of the bulk material. The resulting wall profile is sloped with a round top.

EXAMPLE 18

A chemically amplified positive working photosensitive PBO precursor composition is prepared by mixing 100 parts of a polymer prepared by the method described in Synthesis Example 14, 2 parts of triethoxysilylpropyl ethoxycarbamate, 5 parts PAG 2 (see below), 3.75 parts of Speed Enhancer SE1, 7 parts tripropylene glycol mono methyl ether, 130 parts of PGME, and 20 parts GBL and filtered through a 0.2 μm Teflon filter.

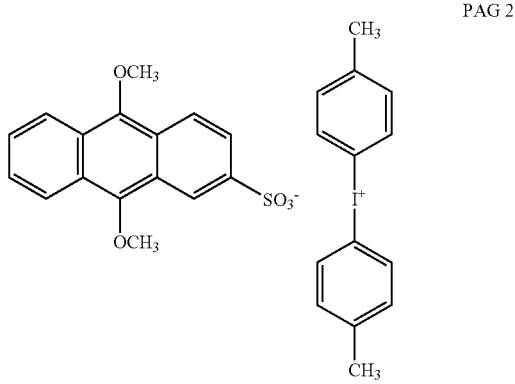

PAG 2

A silicon wafer is then coated with the formulation from above and hotplate baked for 2 minutes at 130° C., resulting in a film thickness of 8.5 μm. The film is exposed utilizing an i-line stepper with a patterned exposure array. Segments of the film on the wafer are exposed at various levels of exposure energy using a Cannon 4000 IE i-line stepper. The coated, exposed film is then baked at 140° C. for 60 seconds, developed for 90 seconds under continuous spray of a 2.38% aqueous TMAH solution. The developed film is rinsed with deionized water and dried to provide a relief pattern. No dark or unexposed film thickness loss is observed.

The patterned film on the wafer is cured according to the procedure described in Example 5. The cured image has a smooth transition from the imaged wall to the surface of the bulk material. The resulting wall profile is sloped with a round top.

COMPARATIVE EXAMPLE 13

A chemically amplified positive working photosensitive PBO precursor composition is prepared by mixing 100 parts of a polymer prepared by the method described in Synthesis Example 14, 2 parts of triethoxysilylpropyl ethoxycarbamate, 5 parts PAG 2 (see below), 3.75 parts of Speed Enhancer SE1, 130 parts of PGME, and 20 parts GBL and filtered through a 0.2 μm Teflon filter.

A silicon wafer is then coated with the formulation from above and hotplate baked for 2 minutes at 130° C., resulting in a film thickness of 8.5 μm. The film is exposed utilizing an i-line stepper with a patterned exposure array. Segments of the film on the wafer are exposed at various levels of exposure energy using a Cannon 4000 IE i-line stepper. The coated, exposed film is then baked at 140° C. for 60 seconds, developed for 90 seconds under continuous spray of a 2.38% aqueous TMAH solution. The developed film is rinsed with deionized water and dried to provide a relief pattern. No dark or unexposed film thickness loss is observed.

The patterned film on the wafer is cured according to the procedure described in Example 5. The resulting wall profile is relatively steep with a well defined sharp corner at the top of the wall. This sharp corner in the profile causes a stress point and may result in cracking of material subsequently deposited and patterned on top of the PBO film.

EXAMPLE 19

A chemically amplified positive working photosensitive PBO precursor composition is prepared by mixing 100 parts of a polymer prepared by the method described in Synthesis Example 10, 4 parts of (5-propylsulfonyloxyimino-5H-thiophen-2-ylidene)-2-methylphenyl-acetonitrile, 3.75 parts of Speed Enhancer SE1, 15 parts of di(propylene)glycol, 130 parts of PGMEA, and 20 parts GBL and filtered through a 0.2 μm Teflon filter.

A silicon wafer is first pretreated with an adhesion promoter solution containing 1.5 wt % beta-(3,4-epoxycyclohexyl)ethyltrimethoxysilane, 70 wt % PGMEA and 28.5 wt % PGME. The silicon wafer is treated for about 30 seconds with 7 ml of the solution applied in a stream while spinning at 200 rpm on a chuck in a lithographic coating tool bowl. The silicon wafer is then dried by accelerating the spin speed to 2000 rpm for 50 seconds.

A silicon wafer is then coated with the formulation from above and hotplate baked for 3 minutes at 125° C., resulting in a film thickness of 8.52 μm. The film is exposed utilizing an i-line stepper with a patterned exposure array. Segments of the film on the wafer are exposed at various levels of exposure energy using a Cannon 4000 IE i-line stepper. The wafer is post exposure baked at 130° C. for 90 seconds. The coated and exposed film is developed using a 60 second puddle with a 2.38% aqueous TMAH solution. The developed film is rinsed with deionized water and dried to provide a relief pattern. No dark or unexposed film thickness loss is observed. The exposure energy required to clear all the material from an exposed area ($E_0$) is 75 mJ/cm$^2$.

The patterned film on the wafer is cured according to the procedure described in Example 5. The cured image has a smooth transition from the imaged wall to the surface of the bulk material. The resulting wall profile is sloped with a round top.

EXAMPLE 20

A chemically amplified positive working photosensitive PBO precursor composition is prepared by mixing 100 parts of a polymer prepared by the method described in Synthesis Example 15, 2 parts of triethoxysilylpropyl ethoxycarbamate, 10 parts of a sulfonyloxyimino type PAG CGI-725 available from Ciba Specialty Chemicals, 12 parts dimethyl succinate, 130 parts of PGME, and 20 parts ethyl lactate and filtered through a 0.2 μm Teflon filter.

A silicon wafer is then coated with the formulation from above and hotplate baked for 4 minutes at 110° C., resulting in a film thickness of 10.5 μm. The film is exposed utilizing an i-line stepper with a patterned exposure array. Segments of the film on the wafer are exposed at various levels of exposure energy using a Cannon 4000 IE i-line stepper. The wafer is post exposure baked at 120° C. for 2 minutes. The coated and exposed film is developed using two 40 second puddles with a 2.38% aqueous TMAH solution. The developed film is rinsed with deionized water and dried to provide a relief pattern. No dark or unexposed film thickness loss is observed.

The patterned film on the wafer is cured in a vacuum oven under a nitrogen purge. The initial temperature is 100° C. and is ramped to 280° C. at a rate of 3° C./minute. Upon reaching 280° C., the temperature is held at 280° C. for 2 hours. The cured image has a smooth transition from the imaged wall to the surface of the bulk material. The resulting wall profile is sloped with a round top.

COMPARATIVE EXAMPLE 14

A chemically amplified positive working photosensitive PBO precursor composition is prepared by mixing 100 parts of a polymer prepared by the method described in Synthesis Example 15, 2 parts of triethoxysilylpropyl ethoxycarbamate, 10 parts of a sulfonyloxyimino type PAG CGI-725 available from Ciba Specialty Chemicals, 130 parts of PGME, and 20 parts ethyl lactate and filtered through a 0.2 μm Teflon filter.

A silicon wafer is then coated with the formulation from above and hotplate baked for 4 minutes at 110° C., resulting in a film thickness of 10.5 μm. The film is exposed utilizing an i-line stepper with a patterned exposure array. Segments of the film on the wafer are exposed at various levels of exposure energy using a Cannon 4000 IE i-line stepper. The wafer is post exposure baked at 120° C. for 2 minutes. The coated and exposed film is developed using two 40 second puddles with a 2.38% aqueous TMAH solution. The developed film is rinsed with deionized water and dried to provide a relief pattern. No dark or unexposed film thickness loss is observed.

The patterned film on the wafer is cured in a vacuum oven under a nitrogen purge. The initial temperature is 100° C. and is ramped to 280° C. at a rate of 3° C./minute. Upon reaching 280° C., the temperature is held at 280° C. for 2 hours. The resulting wall profile is relatively steep with a well defined sharp corner at the top of the wall. This sharp corner in the profile causes a stress point and may result in cracking of material subsequently deposited and patterned on top of the PBO film.

EXAMPLE 21

A chemically amplified positive working photosensitive PBO precursor composition is prepared by mixing 100 parts of a polymer prepared by the method described in Synthesis Example 16, 2 parts of triethoxysilylpropyl ethoxycarbamate, 3 parts PAG 2, 5 parts of Speed Enhancer SE1, 5 parts dipropylene glycol mono methyl ether, 120 parts of PGMEA, 20 parts GBL and 10 parts ethyl lactate and filtered through a 0.2 µm Teflon filter.

A silicon wafer is then coated with the formulation from above and hotplate baked for 3 minutes at 125° C., resulting in a film thickness of 8.7 µm. The film is exposed utilizing an i-line stepper with a patterned exposure array. Segments of the film on the wafer are exposed at various levels of exposure energy using a Cannon 4000 IE i-line stepper. The wafer is post exposure baked at 125° C. for 2 minutes. The coated and exposed film is developed using a 80 second puddle with a 2.38% aqueous TMAH solution. The developed film is rinsed with deionized water and dried to provide a relief pattern. The wafer is again baked at 125° C. for 2 minutes. No dark or unexposed film thickness loss is observed.

The patterned film on the wafer is cured in a vacuum oven under a nitrogen purge. The initial temperature is 100° C. and is ramped to 400° C. at a rate of 8° C./minute. Upon reaching 400° C., the temperature is held at 400° C. for 30 minutes. The cured image has a smooth transition from the imaged wall to the surface of the bulk material. The resulting wall profile is sloped with a round top.

COMPARATIVE EXAMPLE 15

A chemically amplified positive working photosensitive PBO precursor composition is prepared by mixing 100 parts of a polymer prepared by the method described in Synthesis Example 16, 2 parts of triethoxysilylpropyl ethoxycarbamate, 3 parts PAG 2, 5 parts of Speed Enhancer SE1, 120 parts of PGMEA, 20 parts GBL and 10 parts ethyl lactate and filtered through a 0.2 µm Teflon filter.

A silicon wafer is then coated with the formulation from above and hotplate baked for 3 minutes at 125° C., resulting in a film thickness of 8.7 µm. The film is exposed utilizing an i-line stepper with a patterned exposure array. Segments of the film on the wafer are exposed at various levels of exposure energy using a Cannon 4000 IE i-line stepper. The wafer is post exposure baked at 125° C. for 2 minutes. The coated and exposed film is developed using a 80 second puddle with a 2.38% aqueous TMAH solution. The developed film is rinsed with deionized water and dried to provide a relief pattern. The wafer is again baked at 125° C. for 2 minutes. No dark or unexposed film thickness loss is observed.

The patterned film on the wafer is cured in a vacuum oven under a nitrogen purge. The initial temperature is 100° C. and is ramped to 400° C. at a rate of 8° C./minute. Upon reaching 400° C., the temperature is held at 400° C. for 30 minutes. The resulting wall profile is relatively steep with a well defined sharp corner at the top of the wall. This sharp corner in the profile causes a stress point and may result in cracking of material subsequently deposited and patterned on top of the PBO film.

EXAMPLE 22

A chemically amplified positive working photosensitive PBO precursor composition is prepared by mixing 100 parts of a polymer prepared by the method described in Synthesis Example 17, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 15 parts of di(propylene)glycol, 130 parts of PGMEA, and 20 parts GBL and filtered through a 0.2 µm Teflon filter.

A silicon wafer is then coated with the formulation from above and hotplate baked for 3 minutes at 125° C., resulting in a film thickness of 8 µm. The film is exposed utilizing an i-line stepper with a patterned exposure array. Segments of the film on the wafer are exposed at various levels of exposure energy using a Cannon 4000 IE i-line stepper. The wafer is post exposure baked at 130° C. for 90 seconds. The coated and exposed film is developed using a 60 second puddle with a 2.38% aqueous TMAH solution. The developed film is rinsed with deionized water and dried to provide a relief pattern. No dark or unexposed film thickness loss is observed.

The patterned film on the wafer is cured according to the procedure described in Example 5. The cured image has a smooth transition from the imaged wall to the surface of the bulk material. The resulting wall profile is sloped with a round top.

COMPARATIVE EXAMPLE 16

A chemically amplified positive working photosensitive PBO precursor composition is prepared by mixing 100 parts of a polymer prepared by the method described in Synthesis Example 17, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 130 parts of PGMEA, and 20 parts GBL and filtered through a 0.2 µm Teflon filter.

A silicon wafer is then coated with the formulation from above and hotplate baked for 3 minutes at 125° C., resulting in a film thickness of 8 µm. The film is exposed utilizing an i-line stepper with a patterned exposure array. Segments of the film on the wafer are exposed at various levels of exposure energy using a Cannon 4000 IE i-line stepper. The wafer is post exposure baked at 130° C. for 90 seconds. The coated and exposed film is developed using a 60 second puddle with a 2.38% aqueous TMAH solution. The developed film is rinsed with deionized water and dried to provide a relief pattern. No dark or unexposed film thickness loss is observed.

The patterned film on the wafer is cured according to the procedure described in Example 5. The resulting wall profile is relatively steep with a well defined sharp corner at the top of the wall. This sharp corner in the profile causes a stress point and may result in cracking of material subsequently deposited and patterned on top of the PBO film.

EXAMPLE 23

A chemically amplified positive working photosensitive PBO precursor composition is prepared by mixing 100 parts of a polymer prepared by the method described in Synthesis Example 18, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 15 parts of di(propylene)glycol, 130 parts of PGMEA, and 20 parts GBL and filtered through a 0.2 µm Teflon filter.

A silicon wafer is then coated with the formulation from above and hotplate baked for 3 minutes at 125° C., resulting in a film thickness of 8 µm. The film is exposed utilizing an i-line stepper with a patterned exposure array. Segments of the film on the wafer are exposed at various levels of exposure energy using a Cannon 4000 IE i-line stepper. The wafer is post exposure baked at 130° C. for 90 seconds. The coated and exposed film is developed using a 60 second puddle with a 2.38% aqueous TMAH solution. The developed film is rinsed with deionized water and dried to provide a relief pattern. No dark or unexposed film thickness loss is observed.

The patterned film on the wafer is cured according to the procedure described in Example 5. The cured image has a smooth transition from the imaged wall to the surface of the bulk material. The resulting wall profile is sloped with a round top.

COMPARATIVE EXAMPLE 17

A chemically amplified positive working photosensitive PBO precursor composition is prepared by mixing 100 parts of a polymer prepared by the method described in Synthesis Example 18, 2 parts of triethoxysilylpropyl ethoxycarbamate, 4 parts of (5-propylsulfonyloxyimino-5H-thiophen-2-ylidene)-2-methylphenyl-acetonitrile, 3.75 parts of Speed Enhancer SE1, 130 parts of PGMEA, and 20 parts GBL and filtered through a 0.2 µm Teflon filter.

A silicon wafer is then coated with the formulation from above and hotplate baked for 3 minutes at 125° C., resulting in a film thickness of 8 µm. The film is exposed utilizing an i-line stepper with a patterned exposure array. Segments of the film on the wafer are exposed at various levels of exposure energy using a Cannon 4000 IE i-line stepper. The wafer is post exposure baked at 130° C. for 90 seconds. The coated and exposed film is developed using a 60 second puddle with a 2.38% aqueous TMAH solution. The developed film is rinsed with deionized water and dried to provide a relief pattern. No dark or unexposed film thickness loss is observed.

The patterned film on the wafer is cured according to the procedure described in Example 5. The resulting wall profile is relatively steep with a well defined sharp corner at the top of the wall. This sharp corner in the profile causes a stress point and may result in cracking of material subsequently deposited and patterned on top of the PBO film.

While the invention has been described herein with reference to the specific embodiments thereof, it will be appreciated that changes, modifications and variations can be made without departing from the spirit and scope of the inventive concept disclosed herein. Accordingly, it is intended to embrace all such changes, modification and variations that fall with the spirit and scope of the appended claims.

We claim:

1. A composition comprising:
(a) at least one polybenzoxazole precursor polymer comprising a diazoquinone moiety;
(b) at least one plasticizer compound;
(c) at least one solvent;
wherein the composition is a positive working photosensitive composition, the amount of the at least one plasticizer compound present in the composition is an amount effective to reduce the sidewall angle of imaged and cured features in the coated film on the substrate to prevent stress failures in subsequent metallization of the substrate due to steep angles of the imaged features, the at least one plasticizer compound is at least one compound selected from the group consisting of a polyhydroxy compound with at least two OH groups, a saturated glycol mono ether, and a carboxylic acid ester, and the at least one plasticizer compound has a boiling point higher than the boiling point of the at least one solvent.

2. A composition according to claim 1 wherein the at least one polybenzoxazole precursor polymer is selected from the group consisting of those having Structure II, IV and IV*

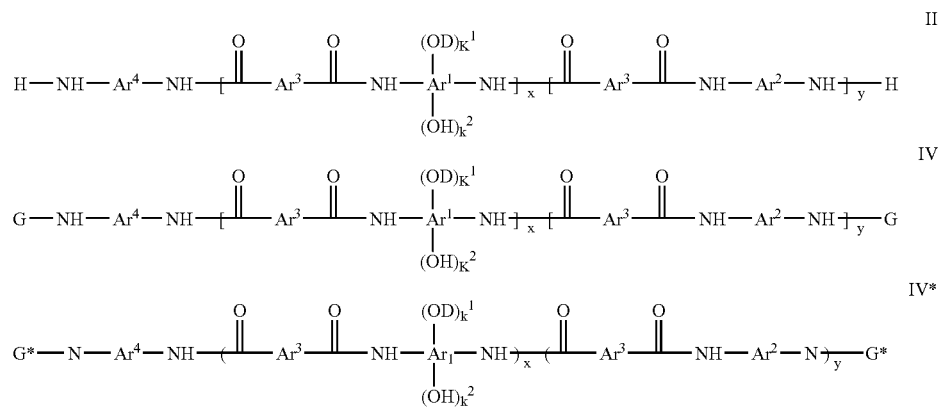

wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group that may contain silicon or mixtures thereof; $Ar^3$ is selected from the group consisting of a divalent aromatic group, a divalent aliphatic group, a divalent heterocyclic group, and mixtures thereof; $Ar^4$ is selected from the group consisting of $Ar^1 (OH)_2$, $Ar^1 (OD)_k^1 (OH)_k^2$, and $Ar^2$, x is from about 10 to about 1000; y is from 0 to about 900 and (x+y)<1000; D is selected from the group consisting of one of the following moieties:

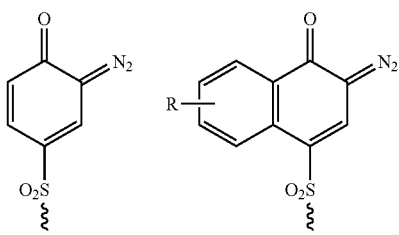

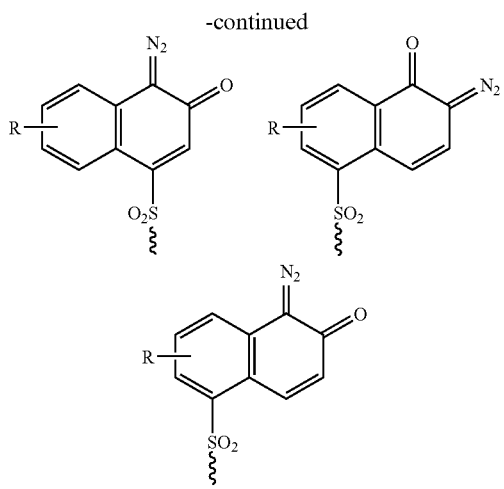

Wherein R is selected from the group consisting of H, halogen, a $C_1$-$C_4$ alkyl group, a $C_1$-$C_4$ alkoxy group, cyclopentyl, and cyclohexyl; $k^1$ is any positive value of up to about 0.5, $k^2$ is any value from about 1.5 to about 2 with the proviso that $(k^1+k^2)=2$, G is a substituted or unsubstituted monovalent organic group having a carbonyl, carbonyloxy or sulfonyl group attached directly to the terminal NH of the polymer and G* is a substituted or unsubstituted divalent organic group having at least one carbonyl or sulfonyl group attached directly to the terminal NH of the polymer.

3. A composition according to claim 2 wherein said at least one plasticizer compound is at least one polyhydroxy compound with at least two OH groups and whose boiling point is higher than the boiling point of the diazoquinone containing photosensitive PBO precursor composition solvent.

4. A composition according to claim 3 wherein said at least one plasticizer compound is selected from the group consisting of ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2.1.0/2,6)decane and a 2-oxepanone co-polymer with 2-ethyl-2-(hydroxymethyl)-1,3-propanediol.

5. A composition according to claim 4 wherein said at least one plasticizer compound is selected from the group consisting of tripropylene glycol and a 2-oxepanone co-polymer with 2-ethyl-2-(hydroxymethyl)-1,3-propanediol.

6. A composition according to claim 2 wherein said at least one plasticizer compound is at least one saturated glycol mono ether whose boiling point is higher than the boiling point of the diazoquinone containing photosensitive PBO precursor composition solvent.

7. A composition according to claim 6 wherein said at least one plasticizer compound is selected from the group consisting of saturated mono ethers of tripropylene glycol, tetrapropylene glycol, triethylene glycol, tetraethylene glycol and pentaethylene glycol.

8. A composition according to claim 7 wherein said at least one plasticizer compound is selected from the group consisting of tri(propylene glycol)methyl ether, tri(propylene glycol)propyl ether and tri(propylene glycol)butyl ether.

9. A composition according to claim 2 wherein said at least one plasticizer compound is at least one carboxylic acid ester whose boiling point is higher than the boiling point of the diazoquinone containing photosensitive PBO precursor composition solvent.

10. A composition according to claim 9 wherein said at least one plasticizer compound is at least one carboxylic acid ester derived from a carboxylic acid containing at least two carboxylic acid groups.

11. A composition according to claim 2 wherein the composition additionally comprises at least one adhesion promoter.

12. A composition according to claim 11 wherein the at least one adhesion promoter comprises a compound of the Structure XIV:

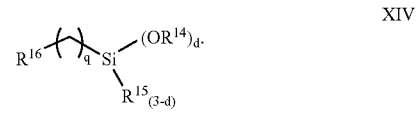

wherein each $R^{14}$ is independently selected from the group consisting of a $C_1$-$C_4$ alkyl group and a $C_5$-$C_7$ cycloalkyl group, each $R^{15}$ is independently selected from the group consisting of a $C_1$-$C_4$ alkyl group, a $C_1$-$C_4$ alkoxy group, a $C_5$-$C_7$ cycloalkyl group and a $C_5$-$C_7$ cycloalkoxy group, d is an integer from 0 to 3 and q is an integer from 1 to about 6, $R^{16}$ is selected from the group consisting of one of the following moieties:

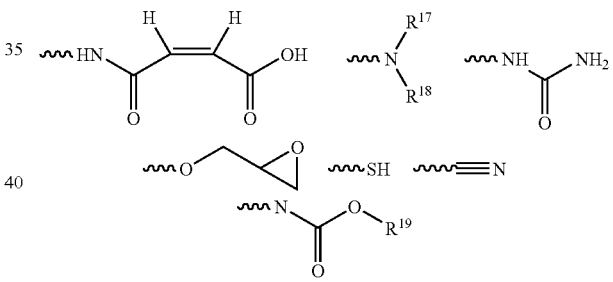

wherein each of $R^{17}$ and $R^{18}$ are independently selected from the group consisting of a $C_1$-$C_4$ alkyl group and a $C_5$-$C_7$ cycloalkyl group, and $R^{19}$ is selected from the group consisting of a $C_1$-$C_4$ alkyl group and a $C_5$-$C_7$ cycloalkyl group.

13. A composition according to claim 12 wherein $R^{16}$ is selected from the group consisting of

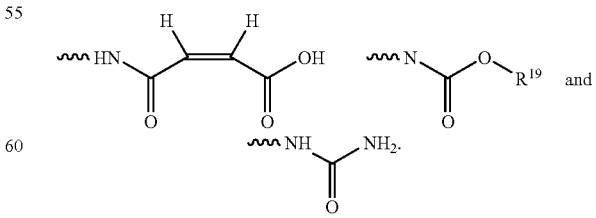

14. A composition according to claim 11 wherein the at least one adhesion promoter is selected from the group consisting of

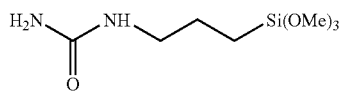

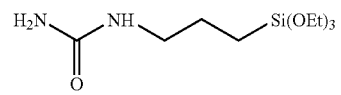

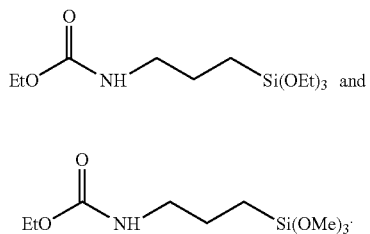

15. A composition, comprising:
(a) at least one polybenzoxazole precursor polymer;
(b) at least one plasticizer compound;
(c) at least one solvent; and
(d) at least one photoactive compound which releases acid upon irradiation (PAG);
wherein the composition is a positive working photosensitive composition, the amount of the at least one plasticizer compound present in the composition is an amount effective to reduce the sidewall angle of imaged and cured features in the coated film on the substrate to prevent stress failures in subsequent metallization of the substrate due to steep angles of the imaged features, the at least one plasticizer compound is at least one compound selected from the group consisting of a polyhydroxy compound with at least two OH groups, a saturated glycol mono ether, and a carboxylic acid ester, the at least one plasticizer compound has a boiling point higher than the boiling point of the at least one solvent, and the at least one polybenzoxazole precursor polymer comprises at least one chemically amplified positive working, photosensitive PBO precursor polymer selected from the group consisting of polybenzoxazole precursor polymer having Structure VI, VII, and VII* wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group that may contain silicon; $Ar^3$ is selected from the group consisting of a divalent aromatic group, a divalent aliphatic group, a divalent heterocyclic group, and mixtures thereof; $Ar^4$ is selected from the group consisting of $Ar^1$ $(OB)_k^3$ $(OH)_k^4$ and $Ar^2$; x is an integer from about 10 to about 1000, y is an integer from 0 to about 900 and (x+y)<1000; B is selected from the group consisting of an acid sensitive group $R^1$ and a moiety E-O—$R^2$ containing an acid sensitive group $R^2$; E is selected from the group consisting of divalent aromatic, aliphatic and heterocyclic group which is not acid labile and makes an -E-OH moiety an alkali solubilizing moiety, $k^3$ is any number between 0.1 and 2, $k^4$ is any number between 0-1.9 provided that $(k^3+k^4)=2$; G is a substituted or unsubstituted monovalent organic group having a group selected from the group consisting of carbonyl, carbonyloxy and sulfonyl group attached directly to the terminal NH of the polymer and G* is a substituted or unsubstituted divalent organic group having at least one carbonyl or sulfonyl group attached directly to the terminal N of the polymer.

16. A composition according to claim 15 wherein $R^1$ in combination with the O atom attached to the $Ar^1$ group forms a group selected from the group consisting of acetal groups, ketal groups, ether groups, silyl ether groups and mixtures thereof.

17. A composition according to claim 16 wherein $R^1$ is selected from the group consisting of

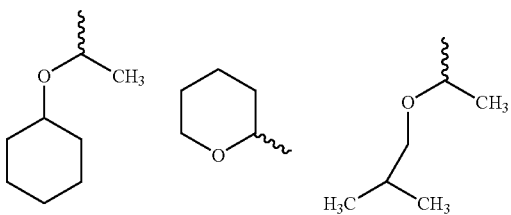

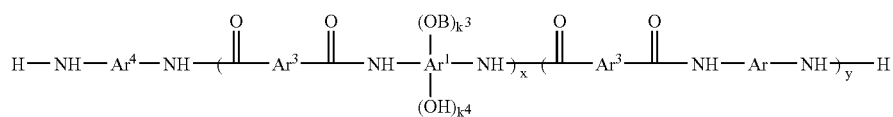

VI

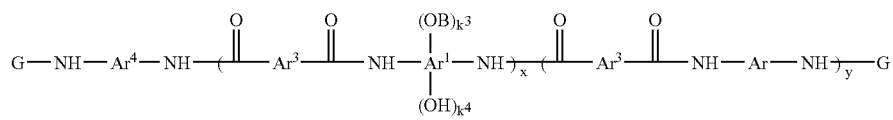

VII

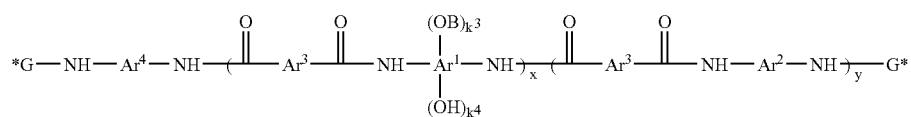

VII*

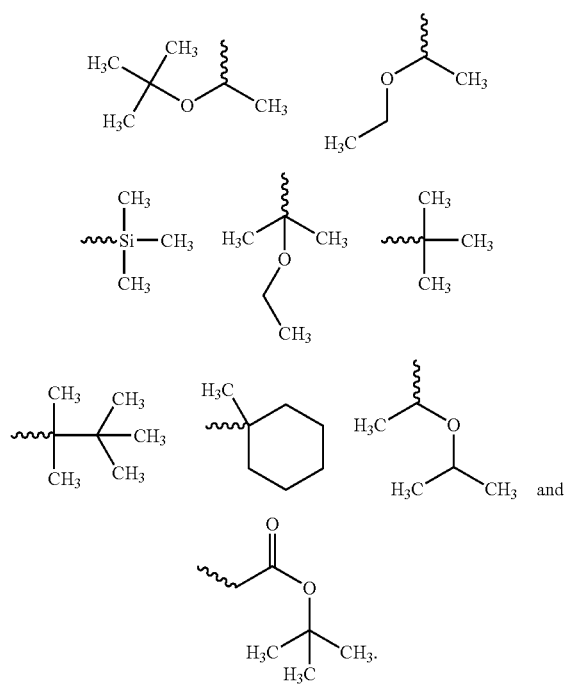

18. A composition according to claim 15 wherein R¹ in combination with the O atom attached to the Ar¹ group forms acetal groups.

19. A composition according to claim 17 wherein R¹ is selected from the group consisting of

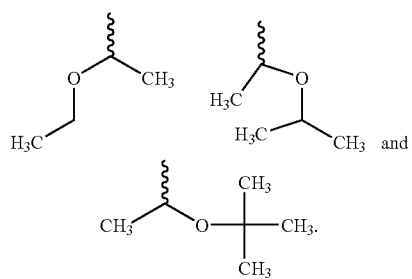

20. A composition according to claim 15 wherein E-O—R² is selected from the group consisting of

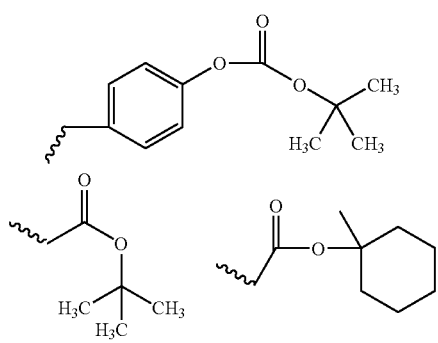

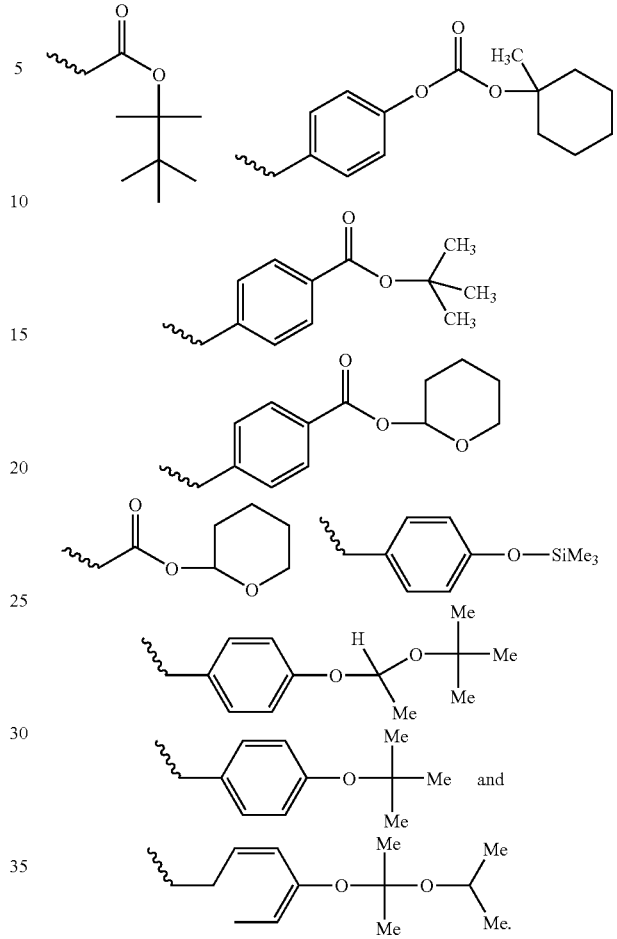

21. A composition according to claim 15 wherein E-O—R² is selected from the group consisting of

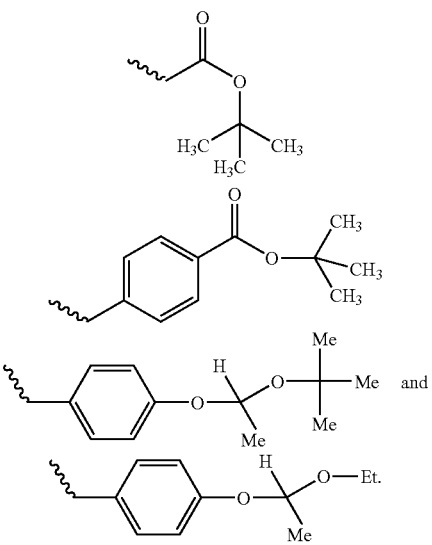

22. A composition according to claim 15 wherein said at least one plasticizer compound is at least one polyhydroxy compound with at least two OH groups and whose boiling point is higher than the boiling point of the chemically amplified photosensitive PBO precursor composition solvent.

23. A composition according to claim 22 wherein said at least one plasticizer compound is selected from the group consisting of ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2.1.0/2,6)decane and a 2-oxepanone co-polymer with 2-ethyl-2-(hydroxymethyl)-1,3-propanediol.

24. A composition according to claim 15 wherein said at least one plasticizer compound is at least one saturated glycol mono ether whose boiling point is higher than the boiling point of the chemically amplified photosensitive PBO precursor composition solvent.

25. A composition according to claim 24 wherein the at least one plasticizer compound is selected from the group consisting of mono ethers of tripropylene glycol, tetrapropylene glycol, triethylene glycol, tetraethylene glycol and pentaethylene glycol.

26. A composition according to claim 15 wherein the at least one plasticizer compound is at least one carboxylic acid ester whose boiling point is higher than the boiling point of the chemically amplified photosensitive PBO precursor composition solvent.

27. A composition according to claim 26 wherein the at least one plasticizer compound is at least one carboxylic acid ester derived from a carboxylic acid containing at least two carboxylic acid groups.

28. A composition according to claim 15 wherein the at least one photoactive compound is selected from the group consisting of oxime sulfonates, triazines, diazoquinone sulfonates, and sulfonium or iodonium salts of sulfonic acids.

29. A composition according to claim 15 wherein the at least one photoactive compound is selected from the group consisting of

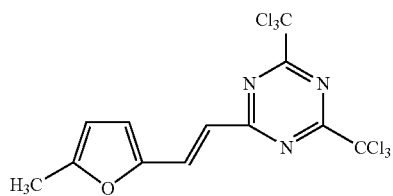

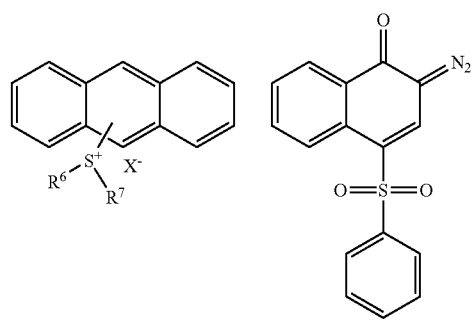

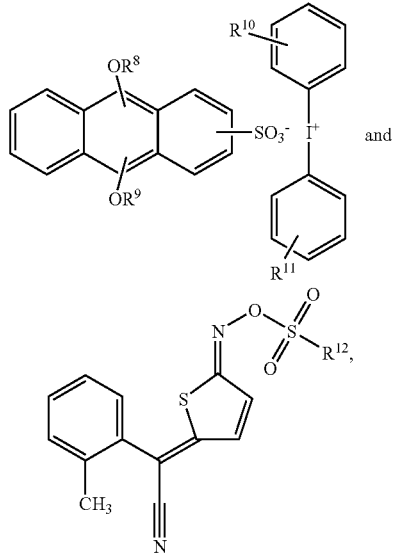

in which $R^6$ and $R^7$ are each independently linear, branched or cyclic alkyl or aryl group containing 1 to 20 carbon atoms; $X^-$ is $R^{21}SO_3^-$, $R^{21}$ being a substituted or unsubstituted, linear, branched or cyclic $C_1$-$C_{25}$ alkyl or a single or multinuclear aryl group having a total of from 6 to 25 carbons; $R^8$, $R^9$, $R^{10}$ and $R^{11}$ are independently linear, branched or cyclic alkyl groups, and $R^{12}$ is a linear or branched $C_1$-$C_8$ alkyl, $C_5$-$C_8$ cycloalkyl, camphoroyl or toluyl group.

30. A process for forming a relief pattern on a substrate, the process comprising the steps of:
   (1) coating on the substrate a positive working photosensitive composition comprising:
      (a) at least one polybenzoxazole precursor polymer comprising a diazoquinone moiety;
      (b) at least one plasticizer compound; and
      (c) at least one solvent;
      wherein the amount of the at least one plasticizer compound present in the composition is an amount effective to reduce the sidewall angle of imaged and cured features in the coated film on the substrate to prevent stress failures in subsequent metallization of the substrate due to steep angles of the imaged features, the at least one plasticizer compound is at least one compound selected from the group consisting of a polyhydroxy compound with at least two OH groups, a saturated glycol mono ether, and a carboxylic acid ester, and the at least one plasticizer compound has a boiling point higher than the boiling point of the at least one solvent;
   (2) prebaking the coated substrate;
   (3) exposing the prebaked coated substrate to actinic radiation;
   (4) optionally post exposure baking the coated, exposed substrate;
   (5) developing the coated, exposed substrate with an aqueous developer, thereby forming an uncured relief image on the developed coated substrate; and
   (6) baking the developed coated substrate at an elevated temperature, thereby curing the relief image.

31. A process according to claim 30 wherein the at least one polybenzoxazole precursor polymer is selected from the group consisting of those having Structure II, IV and IV*

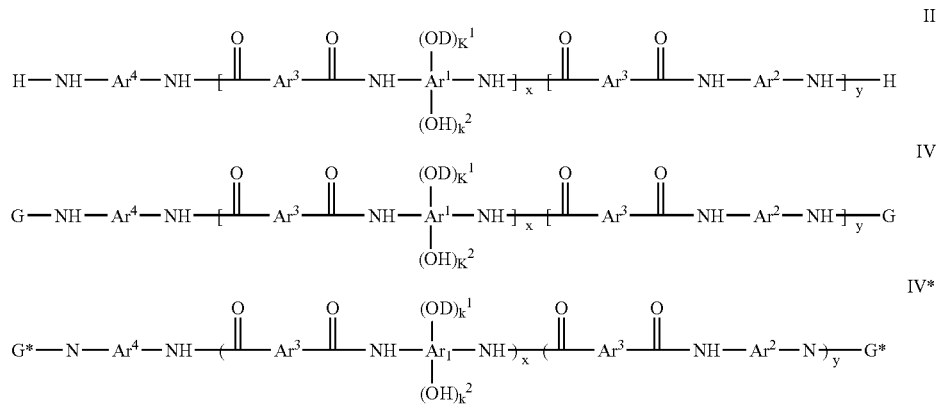

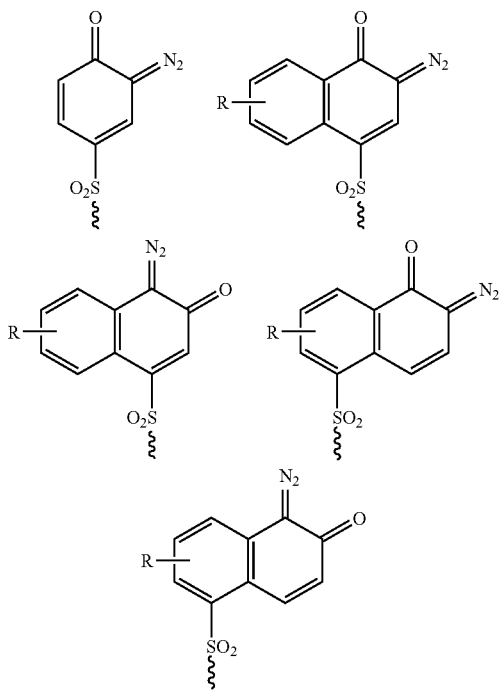

wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group that may contain silicon or mixtures thereof; $Ar^3$ is selected from the group consisting of a divalent aromatic group, a divalent aliphatic group, a divalent heterocyclic group, and mixtures thereof; $Ar^4$ is selected from the group consisting of $Ar^1$ $(OH)_2$, $Ar^1$ $(OD)_k^1$ $(OH)_k^2$, and $Ar^2$, x is from about 10 to about 1000, y is from 0 to about 900 and (x+y)<1000; D is selected from the group consisting of one of the following moieties:

wherein, R is selected from the group consisting of H, halogen, a $C_1$-$C_4$ alkyl group, a $C_1$-$C_4$ alkoxy group, cyclopentyl, and cyclohexyl; $k^1$ is any positive value of up to about 0.5, $k^2$ is any value from about 1.5 to about 2 with the proviso that $(k^1+k^2)=2$, G is a substituted or unsubstituted monovalent organic group having a carbonyl, carbonyloxy or sulfonyl group attached directly to the terminal NH of the polymer and G* is a substituted or unsubstituted divalent organic group having at least one carbonyl or sulfonyl group attached directly to the terminal NH of the polymer.

32. A process according to claim 31 wherein said at least one plasticizer compound is at least one polyhydroxy compound with at least two OH groups and whose boiling point is higher than the boiling point of the diazoquinone containing positive working photosensitive PBO precursor composition solvent.

33. A process according to claim 32 wherein said at least one plasticizer compound is selected from the group consisting of ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2.1.0/2,6)decane and a 2-oxepanone co-polymer with 2-ethyl-2-(hydroxymethyl)-1,3-propanediol.

34. A process according to claim 33 wherein said at least one plasticizer compound is selected from the group consisting of tripropylene glycol and a 2-oxepanone co-polymer with 2-ethyl-2-(hydroxymethyl)-1,3-propanediol.

35. A process according to claim 31 wherein said at least one plasticizer compound is at least one saturated glycol mono ether whose boiling point is higher than the boiling point of the diazoquinone containing positive working photosensitive PBO precursor composition solvent.

36. A process according to claim 35 wherein said at least one plasticizer compound is selected from the group consisting of saturated mono ethers of tripropylene glycol, tetrapropylene glycol, triethylene glycol, tetraethylene glycol and pentaethylene glycol.

37. A process according to claim 36 wherein said at least one plasticizer compound is selected from the group consisting of tri(propylene glycol)methyl ether, tri(propylene glycol)propyl ether and tri(propylene glycol)butyl ether.

38. A process according to claim 31 wherein said at least one plasticizer compound is at least one carboxylic acid ester whose boiling point is higher than the boiling point of the diazoquinone containing positive working photosensitive PBO precursor composition solvent.

39. A process according to claim 38 wherein said at least one plasticizer compound is at least one carboxylic acid ester derived from a carboxylic acid containing at least two carboxylic acid groups.

40. A process according to claim 31 wherein the composition additionally comprises at least one adhesion promoter.

41. A process according to claim 40 wherein the at least one adhesion promoter comprises a compound of the Structure XIV:

$$R^{16}{-}(\phantom{X})_q{-}Si(OR^{14})_d(R^{15})_{(3-d)} \qquad \text{XIV}$$

wherein each $R^{14}$ is independently selected from the group consisting of a $C_1$-$C_4$ alkyl group and a $C_5$-$C_7$ cycloalkyl group, each $R^{15}$ is independently selected from the group consisting of a $C_1$-$C_4$ alkyl group, a $C_1$-$C_4$ alkoxy group, a $C_5$-$C_7$ cycloalkyl group and a $C_5$-$C_7$ cycloalkoxy group, d is an integer from 0 to 3 and q is an integer from 1 to about 6, $R^{16}$ is selected from the group consisting of one of the following moieties:

[structures: HN-C(O)-CH=CH-C(O)-OH; N(R^17)(R^18); NH-C(O)-NH_2; O-CH_2-epoxide; SH; C≡N; N-C(O)-O-R^19]

wherein each of $R^{17}$ and $R^{18}$ are independently selected from the group consisting of a $C_1$-$C_4$ alkyl group and a $C_5$-$C_7$ cycloalkyl group, and $R^{19}$ is selected from the group consisting of a $C_1$-$C_4$ alkyl group and a $C_5$-$C_7$ cycloalkyl group.

42. A process according to claim 41 wherein $R^{16}$ is selected from the group consisting of

[structures: HN-C(O)-CH=CH-C(O)-OH; N-C(O)-O-R^19 and NH-C(O)-NH_2]

43. A process according to claim 40 wherein the at least one adhesion promoter is selected from the group consisting of

[structures: H_2N-C(O)-NH-(CH_2)_3-Si(OMe)_3; H_2N-C(O)-NH-(CH_2)_3-Si(OEt)_3; EtO-C(O)-NH-(CH_2)_3-Si(OEt)_3 and EtO-C(O)-NH-(CH_2)_3-Si(OMe)_3]

44. A process of forming a relief pattern on a substrate, the process comprising the steps of:
 (1) coating on the substrate a positive working photosensitive composition comprising:
  (a) at least one polybenzoxazole precursor polymer;
  (b) at least one plasticizer compound;
  (c) at least one solvent; and
  (d) at least one photoactive compound which releases acid upon irradiation (PAG);
 (2) prebaking the coated substrate;
 (3) exposing the prebaked coated substrate to actinic radiation;
 (4) post exposure baking the coated, exposed substrate;
 (5) developing the coated, exposed substrate with an aqueous developer, thereby forming an uncured relief image on the developed coated substrate; and
 (6) baking the developed coated substrate at an elevated temperature, thereby curing the relief image;
wherein the amount of the at least one plasticizer compound present in the composition is an amount effective to reduce the sidewall angle of imaged and cured features in the coated film on the substrate to prevent stress failures in subsequent metallization of the substrate due to steep angles of the imaged features, the at least one plasticizer compound is at least one compound selected from the group consisting of a polyhydroxy compound with at least two OH groups, a saturated glycol mono ether, and a carboxylic acid ester, the at least one plasticizer compound has a boiling point higher than the boiling point of the at least one solvent, and the at least one polybenzoxazole precursor polymer comprises at least one PBO precursor polymer selected from the group consisting of polybenzoxazole precursor polymer having Structure VI, VII, and VII*

$$H{-}NH{-}Ar^4{-}NH{-}(C(O){-}Ar^3{-}C(O){-}NH{-}Ar^1(OB)_{k3}(OH)_{k4}{-}NH)_x{-}(C(O){-}Ar^3{-}C(O){-}NH{-}Ar{-}NH)_y{-}H \qquad \text{VI}$$

$$G{-}NH{-}Ar^4{-}NH{-}(C(O){-}Ar^3{-}C(O){-}NH{-}Ar^1(OB)_{k3}(OH)_{k4}{-}NH)_x{-}(C(O){-}Ar^3{-}C(O){-}NH{-}Ar{-}NH)_y{-}G \qquad \text{VII}$$

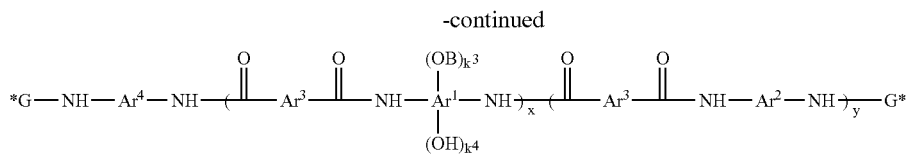

wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, and a divalent aliphatic group that may contain silicon; $Ar^3$ is selected from the group consisting of a divalent aromatic group, a divalent aliphatic group, a divalent heterocyclic group, and mixtures thereof; $Ar^4$ is selected from the group consisting of $Ar^1$ $(OB)_k^3$ $(OH)_k^4$ and $Ar^2$; x is an integer from about 10 to about 1000, y is an integer from 0 to about 900 and $(x+y)<1000$; B is selected from the group consisting of an acid sensitive group $R^1$ and a moiety $E-O-R^2$ containing an acid sensitive group $R^2$; E is selected from the group consisting of divalent aromatic, aliphatic and heterocyclic group which is not acid labile and makes an -E-OH moiety an alkali solubilizing moiety, $k^3$ is any number between 0.1 and 2, $k^4$ is any number between 0-1.9 provided that $(k^3+k^4)=2$; G is a substituted or unsubstituted monovalent organic group having a group selected from the group consisting of carbonyl, carbonyloxy and sulfonyl group attached directly to the terminal NH of the polymer and G* is a substituted or unsubstituted divalent organic group having at least one carbonyl or sulfonyl group attached directly to the terminal N of the polymer.

45. A process according to claim 44 wherein $R^1$ in combination with the O atom attached to the $Ar^1$ group forms a group selected from the group consisting of acetal groups, ketal groups, ether groups, silyl ether groups and mixtures thereof.

46. A process according to claim 45 wherein $R^1$ is selected from the group consisting of

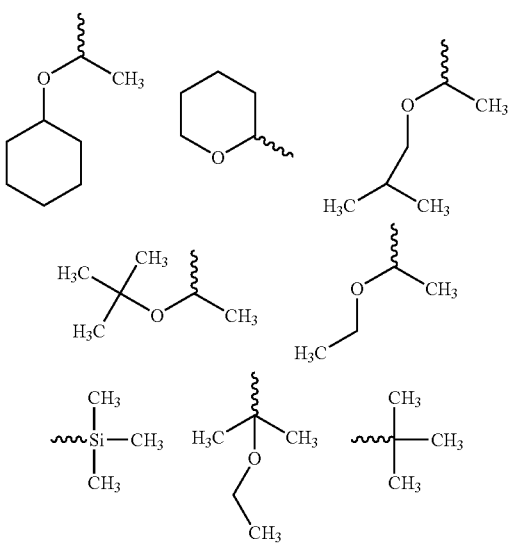

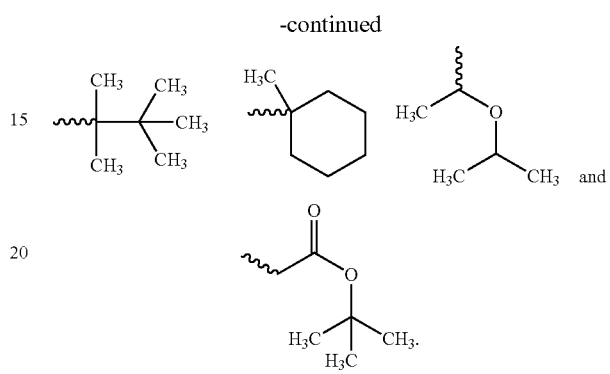

47. A process according to claim 44 wherein $R^1$ in combination with the O atom attached to the $Ar^1$ group forms acetal groups.

48. A process according to claim 47 wherein $R^1$ is selected from the group consisting of

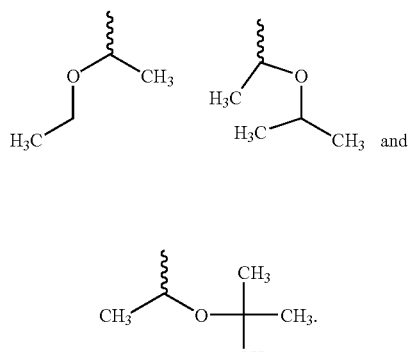

49. A process according to claim 44 wherein $E-O-R^2$ is selected from the group consisting of

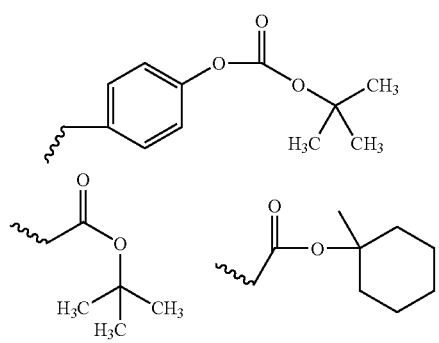

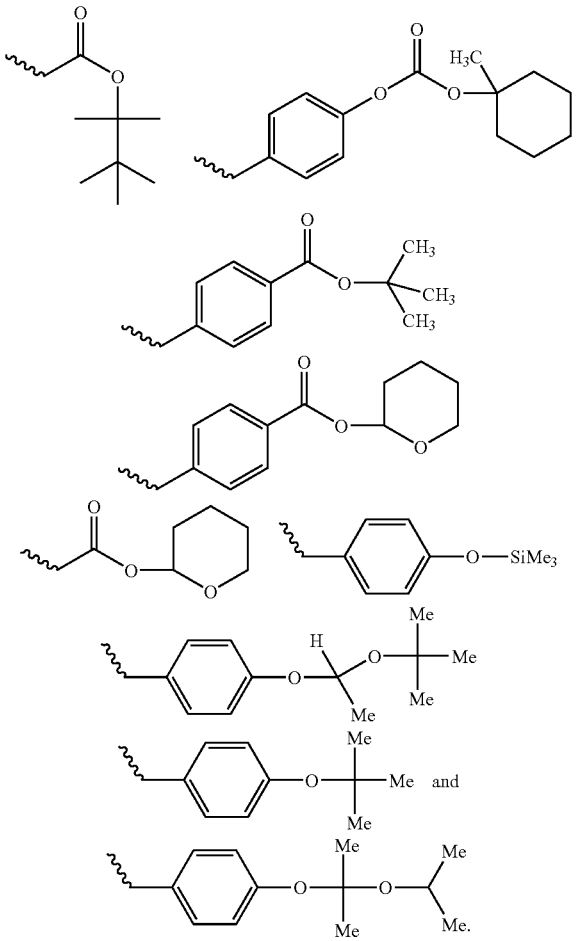

50. A process according to claim 44 wherein E-O—R² is selected from the group consisting of

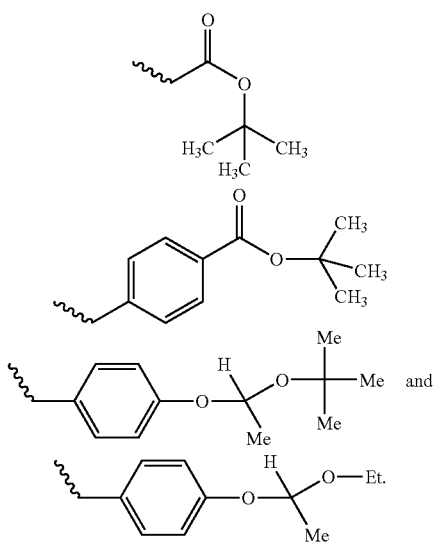

51. A process according to claim 44 wherein said at least one plasticizer compound is at least one polyhydroxy compound with at least two OH groups and whose boiling point is higher than the boiling point of the chemically amplified positive working photosensitive PBO precursor composition solvent.

52. A process according to claim 51 wherein said at least one plasticizer compound is selected from the group consisting of ethylene glycol, diethylene glycol, polyethylene glycol, propylene glycol, tripropylene glycol, polypropylene glycol, glycerol, butane diol, hexane diol, sorbitol, cyclohexanediol, 4,8-bis(hydroxymethyl)-tricyclo(5.2.1.0/2,6)decane and a 2-oxepanone co-polymer with 2-ethyl-2-(hydroxymethyl)-1,3-propanediol.

53. A process according to claim 44 wherein said at least one plasticizer compound is at least one saturated glycol mono ether whose boiling point is higher than the boiling point of the chemically amplified positive working photosensitive PBO precursor composition solvent.

54. A process according to claim 53 wherein the at least one plasticizer compound is selected from the group consisting of mono ethers of tripropylene glycol, tetrapropylene glycol, triethylene glycol, tetraethylene glycol and pentaethylene glycol.

55. A process according to claim 44 wherein the at least one plasticizer compound is at least one carboxylic acid ester whose boiling point is higher than the boiling point of the chemically amplified positive working photosensitive PBO precursor composition solvent.

56. A process according to claim 55 wherein the at least one plasticizer compound is at least one carboxylic acid ester derived from a carboxylic acid containing at least two carboxylic acid groups.

57. A process according to claim 44 wherein the at least one photoactive compound is selected from the group consisting of oxime sulfonates, triazines, diazoquinone sulfonates, and sulfonium or iodonium salts of sulfonic acids.

58. A process according to claim 44 wherein the at least one photoactive compound is selected from the group consisting of

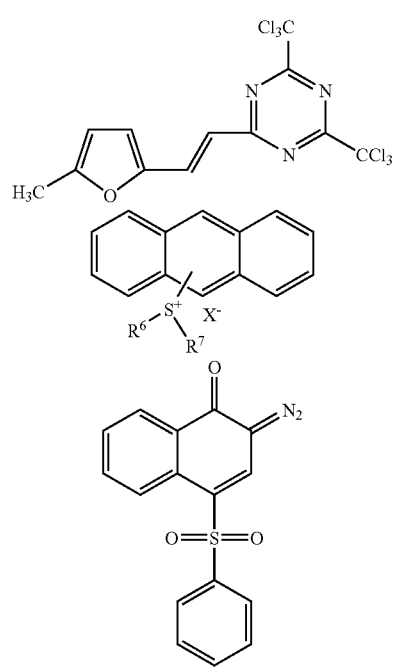

-continued

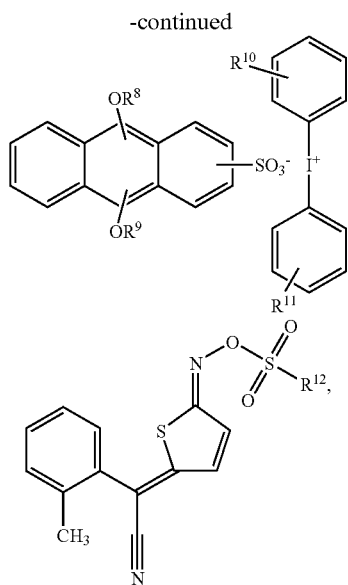

in which $R^6$ and $R^7$ are each independently linear, branched or cyclic alkyl or aryl group containing 1 to 20 carbon atoms; $X^-$ is $R^{21}SO_3^-$, $R^{21}$ being a substituted or unsubstituted, linear, branched or cyclic $C_1$-$C_{25}$ alkyl or a single or multinuclear aryl group having a total of from 6 to 25 carbons; $R^8$, $R^9$, $R^{10}$ and $R^{11}$ are independently linear, branched or cyclic alkyl groups, and $R^{12}$ is a linear or branched $C_1$-$C_8$ alkyl, $C_5$-$C_8$ cycloalkyl, camphoroyl or toluyl group.

59. The composition of claim 1, wherein the composition has a first solubility in an aqueous developer before exposure to an actinic radiation and a second solubility in the aqueous developer after exposure to the actinic radiation, the second solubility being higher than the first solubility.

60. The composition of claim 2, wherein the composition consists of at least one PBO precursor polymer selected from the group consisting of those having Structures II, IV, and IV*, at least one plasticizer compound, at least one solvent, and optionally at least one photoactive compound, at least one surfactant, at least one adhesion promoter, at least one leveling agent, and at least one dissolution rate modifier.

61. The composition of claim 1, wherein the at least one plasticizer compound is from about 0.1 wt % to about 20 wt % of the total weight of the composition.

62. The composition of claim 15, wherein the composition has a first solubility in an aqueous developer before exposure to an actinic radiation and a second solubility in the aqueous developer after exposure to the actinic radiation, the second solubility being higher than the first solubility.

63. The composition of claim 15, wherein the at least one polybenzoxazole precursor polymer comprises a polymer of Structure VII or VII*.

64. The composition of claim 15, wherein the at least one plasticizer compound is from about 0.1 wt % to about 20 wt % of the total weight of the composition.

65. The composition of claim 15, wherein the at least one plasticizer compound is selected from the group consisting of tripropylene glycol, a 2-oxepanone co-polymer with 2-ethyl-2-(hydroxymethyl)-1,3-propanediol, tri(propylene glycol)methyl ether, tri(propylene glycol)propyl ether, and tri(propylene glycol)butyl ether.

* * * * *

UNITED STATES PATENT AND TRADEMARK OFFICE
CERTIFICATE OF CORRECTION

PATENT NO. : 7,803,510 B2
APPLICATION NO. : 11/500251
DATED : September 28, 2010
INVENTOR(S) : Ahmad A. Naiini It is certified that error appears in the above-identified patent and that said Letters Patent is hereby corrected as shown below:

On the title page, Abstract, Line 4
Delete "(a)" and insert -- (b) --, therefor.

On the title page, Abstract, Line 5
Delete "(b)" and insert -- (c) --, therefor.

On the title page, Abstract, Line 15
Delete "(c)" and insert -- (d) --, therefor.

Column 83, Line 22
In Claim 2, delete "Wherein" and insert -- wherein --, therefor.

Column 84, Line 20 (Structure XIV)

In Claim 12, delete " 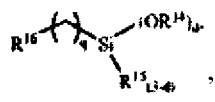 " and insert -- 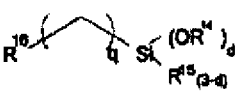 --, therefor.

Column 85, Line 48 (Structure VI)

Delete " 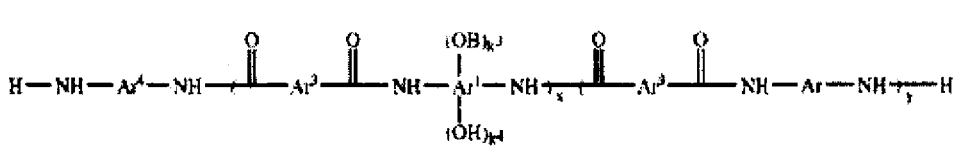 "

Insert -- 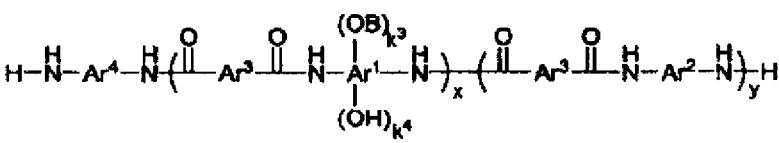 VI --, therefor.

Signed and Sealed this
Twenty-ninth Day of May, 2012

David J. Kappos
*Director of the United States Patent and Trademark Office*

CERTIFICATE OF CORRECTION (continued)
U.S. Pat. No. 7,803,510 B2

Column 85, Line 49 (Structure VII)

Delete " 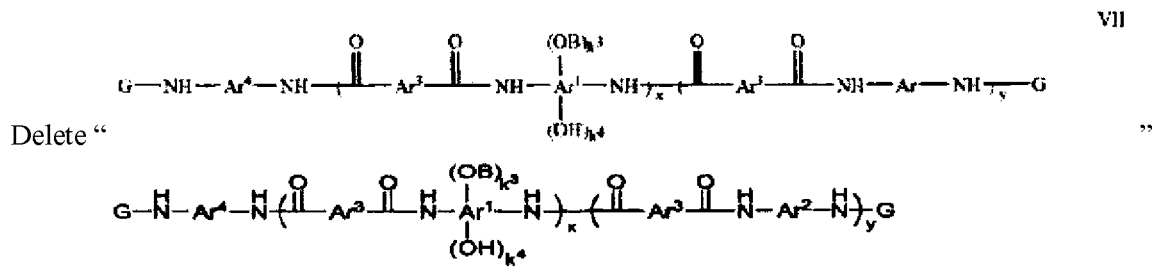 "

Insert -- VII --, therefor.

Column 88, Line 35

In Claim 20, delete " 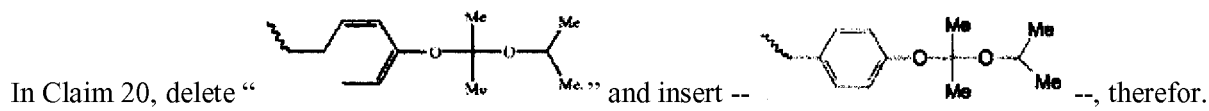 " and insert -- 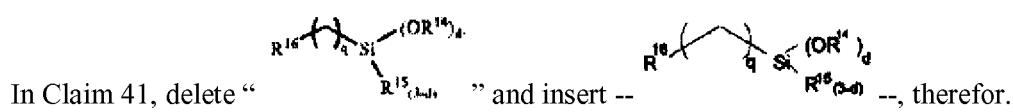 --, therefor.

Column 93, Line 10 (Structure XIV)

In Claim 41, delete " 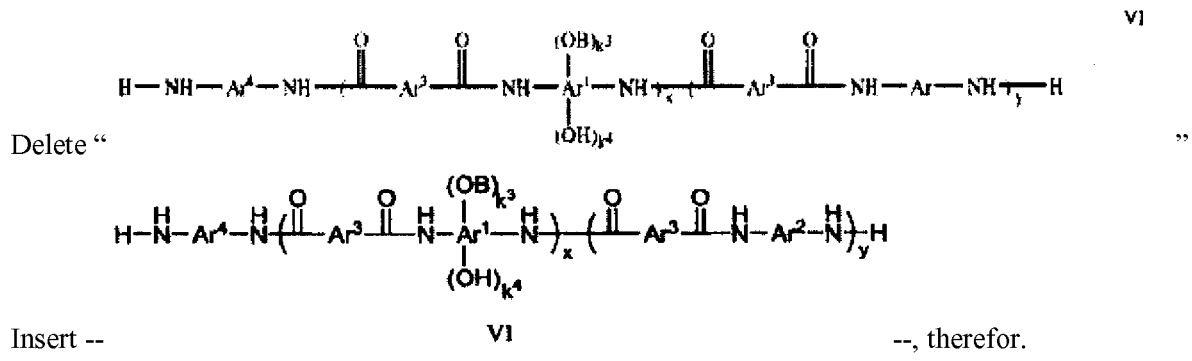 " and insert -- 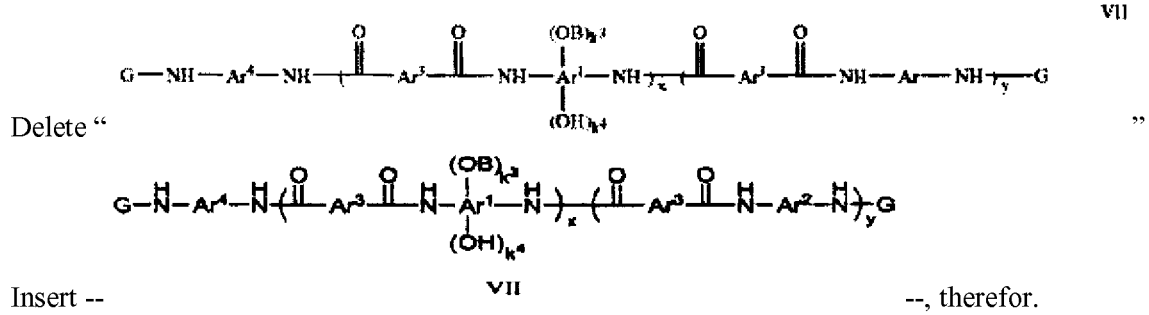 --, therefor.

Column 94, Line 56 (Approx.) (Structure VI)

Delete " "

Insert -- VI --, therefor.

Column 94, Line 57 (Approx.) (Structure VII)

Delete " "

Insert -- VII --, therefor.